(12) United States Patent
Joei et al.

(10) Patent No.: US 12,027,542 B2
(45) Date of Patent: Jul. 2, 2024

(54) SOLID-STATE IMAGING ELEMENT INCLUDING A PLURALITY OF PHOTOELECTRIC CONVERSION UNITS

(71) Applicant: SONY GROUP CORPORATION, Tokyo (JP)

(72) Inventors: Masahiro Joei, Kanagawa (JP); Kenichi Murata, Kanagawa (JP); Fumihiko Koga, Kanagawa (JP); Iwao Yagi, Kanagawa (JP); Shintarou Hirata, Kanagawa (JP); Hideaki Togashi, Kumamoto (JP); Yosuke Saito, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 806 days.

(21) Appl. No.: 17/053,216

(22) PCT Filed: Apr. 19, 2019

(86) PCT No.: PCT/JP2019/016889
§ 371 (c)(1),
(2) Date: Nov. 5, 2020

(87) PCT Pub. No.: WO2019/225250
PCT Pub. Date: Nov. 28, 2019

(65) Prior Publication Data
US 2021/0233948 A1 Jul. 29, 2021

(30) Foreign Application Priority Data
May 21, 2018 (JP) ................................. 2018-097228

(51) Int. Cl.
*H01L 27/146* (2006.01)
*H01L 29/41* (2006.01)
(Continued)

(52) U.S. Cl.
CPC .. *H01L 27/14612* (2013.01); *H01L 27/14636* (2013.01); *H01L 27/14685* (2013.01);
(Continued)

(58) Field of Classification Search
CPC ......... H01L 27/14612; H01L 27/14636; H01L 27/14685; H01L 27/14616;
(Continued)

(56) References Cited

U.S. PATENT DOCUMENTS

| 5,932,902 A | 8/1999 | Yonemoto |
|---|---|---|
| 2008/0284885 A1 | 11/2008 | Taura |

(Continued)

FOREIGN PATENT DOCUMENTS

| EP | 3439037 A1 | 2/2019 |
|---|---|---|
| JP | H10-65137 | 3/1998 |

(Continued)

OTHER PUBLICATIONS

International Search Report and Written Opinion prepared by the Japanese Patent Office on Jun. 27, 2019, for International Application No. PCT/JP2019/016889.

*Primary Examiner* — Nelson Garces
(74) *Attorney, Agent, or Firm* — SHERIDAN ROSS P.C.

(57) ABSTRACT

A solid-state imaging element with pixel transistors and wires capable of efficiently outputting and transferring a pixel signal from a stacked photoelectric conversion film while suppressing an increase in manufacturing cost, and a manufacturing method thereof are provided. There is provided a solid-state imaging element which includes a semiconductor substrate; a first photoelectric conversion unit provided on the semiconductor substrate; and a control unit provided stacked with the first photoelectric conversion unit and including a plurality of pixel transistors, in which the first photoelectric conversion unit includes a second elec- (Continued)

trode, a first photoelectric conversion film provided above the second electrode and converting light into charges, and a first electrode provided on the first photoelectric conversion film, the plurality of pixel transistors include an amplification transistor that amplifies and outputs the charges as a pixel signal, and a channel formation region of the amplification transistor made of an oxide semiconductor layer.

17 Claims, 23 Drawing Sheets

(51) Int. Cl.
*H04N 25/771* (2023.01)
*H10K 39/32* (2023.01)

(52) U.S. Cl.
CPC ............ *H01L 29/41* (2013.01); *H04N 25/771* (2023.01); *H10K 39/32* (2023.02)

(58) Field of Classification Search
CPC ............. H01L 27/14667; H01L 27/088; H01L 27/14638; H01L 27/1464; H01L 27/14647; H01L 27/14683; H01L 29/41; H01L 29/423; H01L 29/43; H01L 29/49; H01L 29/786; H01L 21/3205; H01L 21/768; H01L 21/8234; H01L 23/522; H04N 25/771; H04N 25/76; H10K 39/32
See application file for complete search history.

(56) References Cited

U.S. PATENT DOCUMENTS

| | | | |
|---|---|---|---|
| 2015/0349008 A1 | 12/2015 | Yamaguchi | |
| 2016/0204156 A1* | 7/2016 | Togashi | ............ H01L 21/76898 257/292 |
| 2018/0076252 A1* | 3/2018 | Togashi | ............ H01L 27/14627 |
| 2019/0288115 A1* | 9/2019 | Goto | ................... H01L 29/7869 |

FOREIGN PATENT DOCUMENTS

| | | |
|---|---|---|
| JP | 2008288953 A | 11/2008 |
| JP | 2014-053553 | 3/2014 |
| JP | 2017-055085 | 3/2017 |
| JP | 2018-060910 | 4/2018 |
| KR | 20080101757 A | 11/2008 |
| KR | 20150106400 A | 9/2015 |
| WO | WO 2014/112279 | 7/2014 |
| WO | WO 2017/169314 | 10/2017 |
| WO | WO-2018066256 A1 | 4/2018 |

* cited by examiner

SOLID-STATE IMAGING ELEMENT INCLUDING A PLURALITY OF PHOTOELECTRIC CONVERSION UNITS

CROSS REFERENCE TO RELATED APPLICATIONS

This application is a national stage application under 35 U.S.C. 371 and claims the benefit of PCT Application No. PCT/JP2019/016889 having an international filing date of 19 Apr. 2019, which designated the United States, which PCT application claimed the benefit of Japanese Patent Application No. 2018-097228 filed 21 May 2018, the entire disclosures of each of which are incorporated herein by reference.

FIELD

The present disclosure relates to a solid-state imaging element and a manufacturing method thereof.

BACKGROUND

In recent years, in charge coupled device (CCD) image sensors and complementary metal-oxide-semiconductor (CMOS) image sensors (solid-state imaging elements), an amount of light incident on a unit pixel is reduced as a pixel size is reduced. For this reason, sensitivity is lowered and a signal/noise (S/N) ratio is lowered. Further, in the various image sensors described above, a configuration in which pixels respectively detecting red light, green light, and blue light using primary color filters are arranged on a plane (for example, a Bayer array) is widely used. In a case of the above configuration, for example, in a pixel detecting the red light, since the green light and the blue light are difficult to pass through a color filter included in the pixel, photoelectric conversion of the green light and the blue light is not performed in the pixel, that is, the green light and the blue light are not detected. Therefore, in the case of the configuration described above, light of one specific color can be detected and light of the other colors cannot be detected, in each pixel. For this reason, it cannot be said that the light incident on each pixel is sufficiently used, in other words, it can be said that a loss occurs from the viewpoint of pixel sensitivity.

As a method for solving the above situation, an image sensor in which three layers of photoelectric conversion films capable of performing photoelectric conversion by the red light, the green light, and the blue light are stacked in a longitudinal direction in a unit pixel, and light of three colors can be detected by one unit pixel can be illustrated (for example, Patent Literature 1 described below). Further, as another image sensor capable of detecting light of three colors by one unit pixel, an image sensor having a silicon substrate on which two photodiodes (PDs) respectively detecting red light and blue light are stacked and a photoelectric conversion film provided above the silicon substrate and capable of performing photoelectric conversion by green light can be illustrated (for example, Patent Literature 2 described below).

In detail, a configuration of a circuit for extracting a pixel signal in the image sensor having the silicon substrate on which the two PDs are stacked and the photoelectric conversion film provided above the silicon substrate, which is disclosed in Patent Literature 2 described below, is illustrated as follows. For example, as disclosed in Patent Literature 3 described below, a backside irradiation type structure in which a circuit formation layer on which the above circuit is formed is formed on the side opposite to a light receiving surface (the side on which light is incident) of the image sensor can be illustrated. Further, as disclosed in Patent Literature 4 described below, a structure in which a semiconductor layer for storing and transferring charges obtained by photoelectric conversion and a storage electrode facing the semiconductor layer with an insulating film interposed therebetween are provided immediately below a photoelectric conversion film provided above a silicon substrate can be illustrated. Further, Patent Literatures 5 and 6 described below disclose that channel formation regions of various pixel transistors included in the above circuit configuration are configured by oxide semiconductor layers.

CITATION LIST

Patent Literature

Patent Literature 1: Japanese Laid-open Patent Publication No. 2005-51115
Patent Literature 2: Japanese Laid-open Patent Publication No. 2003-332551
Patent Literature 3: Japanese Laid-open Patent Publication No. 2011-29337
Patent Literature 4: Japanese Laid-open Patent Publication No. 2017-157816
Patent Literature 5: Japanese Laid-open Patent Publication No. 2009-105381
Patent Literature 6: Japanese Laid-open Patent Publication No. 2009-267912
Patent Literature 7: Japanese Laid-open Patent Publication No. 2009-535819

SUMMARY

Technical Problem

In the image sensor (solid-state imaging element) described above, in order to output the charges generated in the photoelectric conversion film provided above the substrate as a pixel signal, a plurality of pixel transistors (for example, an amplification transistor, a transfer transistor, a reset transistor, and the like) and wires for connecting these pixel transistors are provided. In order to improve characteristics of the image sensor and suppress an increase in manufacturing cost, it is required to dispose the pixel transistors and the wires with suitable configurations at suitable positions. However, in the conventional proposals, the suitable configurations and positions of the pixel transistors and the wires are not specifically examined. Further, even when the configurations and positions of the pixel transistors are disclosed, it is difficult to say that the disclosure has an effective configuration and arrangement capable of efficiently outputting and transferring the pixel signal and can suppress an increase in manufacturing cost.

Accordingly, in view of the above situation, the present disclosure proposes a new and improved solid-state imaging element with pixel transistors and wires capable of efficiently outputting and transferring a pixel signal while suppressing an increase in manufacturing cost, and a manufacturing method thereof.

Solution to Problem

According to the present disclosure, a solid-state imaging element is provided that includes: a semiconductor substrate; a first photoelectric conversion unit provided on the semiconductor substrate; and a control unit provided so as to be stacked with the first photoelectric conversion unit and including a plurality of pixel transistors for controlling the first photoelectric conversion unit, wherein the first photoelectric conversion unit includes a second electrode, a first photoelectric conversion film provided above the second electrode and converting light into charges, and a first electrode provided on the first photoelectric conversion film, the plurality of pixel transistors include an amplification transistor that amplifies and outputs the charges as a pixel signal, and a channel formation region of the amplification transistor is made of an oxide semiconductor layer.

Moreover, according to the present disclosure, a method for manufacturing a solid-state imaging element is provided that includes: forming an oxide semiconductor layer to be a channel formation region of a pixel transistor, above a semiconductor substrate; forming a gate electrode layer including a plurality of gate electrodes of a plurality of pixel transistors, above the oxide semiconductor layer; forming a power supply signal wiring layer including a plurality of power supply wires for applying a power supply voltage to the plurality of pixel transistors and a plurality of signal wires for transmitting pixel signals, above the gate electrode layer; forming a drive wiring layer including a plurality of drive wires for driving the plurality of pixel transistors, above the power supply signal wiring layer; forming a second electrode above the drive wiring layer; forming a first photoelectric conversion film above the second electrode; and forming a first electrode on the first photoelectric conversion film.

Advantageous Effects of Invention

As described above, according to the present disclosure, it is possible to provide a solid-state imaging element with pixel transistors and wires capable of efficiently outputting and transferring a pixel signal while suppressing an increase in manufacturing cost, and a manufacturing method thereof.

Note that the above effects are not necessarily restrictive, and any effects described in the present specification or other effects grasped from the present specification may be exhibited in addition to or in place of the above effects.

DESCRIPTION OF EMBODIMENTS

Figure 1:
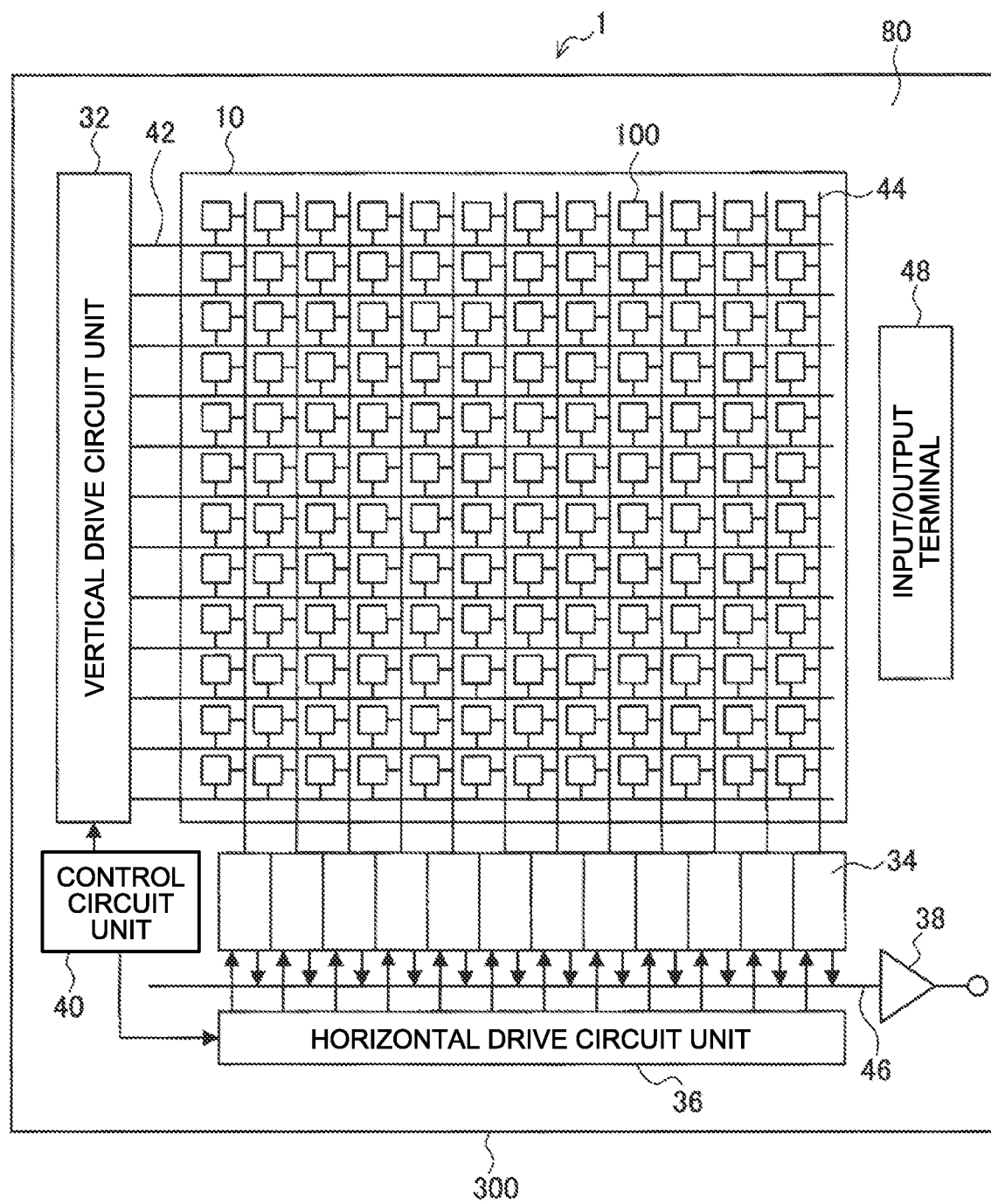
FIG. 1 is an explanatory diagram illustrating a planar configuration example of a solid-state imaging device 1 according to a first embodiment of the present disclosure.

Hereinafter, preferred embodiments of the present disclosure will be described in detail with reference to the appended drawings. Note that, in the present specification and the drawings, redundant description of components having substantially the same functional configuration is omitted by assigning the same reference numerals.

Further, in the present specification and the drawings, a plurality of components having substantially the same or similar functional configuration may be distinguished from each other by adding different numerals after the same reference numeral. However, when it is unnecessary to particularly distinguish each of the plurality of components having substantially the same or similar functional configuration, only the same reference numeral is assigned. Further, similar components in different embodiments may be distinguished from each other by adding different alphabets after the same reference numerals. However, when it is unnecessary to particularly distinguish each of similar components, only the same reference numeral is assigned.

Further, the drawings referred to in the following description are drawings for facilitating the description and understanding of an embodiment of the present disclosure. For easy understanding, shapes, dimensions, ratios, and the like illustrated in the drawings may be different from those in an actual case. Further, the solid-state imaging element illustrated in the drawing can be appropriately changed in design in consideration of the following description and known technologies. Further, in the description using a cross-sectional view of the solid-state imaging element, an up-down direction of a stacked structure of the solid-state imaging element corresponds to a relative direction when a light incidence surface of the solid-state imaging element faces upward, and may be different from an up-down direction according to the actual gravitational acceleration.

Further, in the following description, expressions regarding a size and a shape do not mean only the same value as a numerical value defined mathematically and a shape defined geometrically, but include a case where there is an industrially acceptable difference in the step for manufacturing the solid-state imaging element and a shape similar to the shape.

Further, in the following description of the circuit configuration, unless otherwise specified, "connection" means electrically connecting a plurality of elements. In addition, the "connection" in the following description includes not only a case where a plurality of elements are directly and electrically connected, but also a case where a plurality of elements are indirectly and electrically connected via other elements.

Note that the description will be given in the following order.

1. Background of embodiments of present disclosure on side of inventors
2. First Embodiment
2.1 Schematic configuration of solid-state imaging device
2.2 Schematic configuration of pixel
2.3 Equivalent circuit of pixel
2.4 Detailed configuration of multi-layer wiring layer
2.5 Manufacturing method
2.6 Modification
3. Second Embodiment
3.1 Detailed configuration of multi-layer wiring layer
3.2 Manufacturing method
4. Third Embodiment
5. Fourth Embodiment
5.1 Embodiment
5.2 First modification
5.3 Second modification
6. Application to endoscopic surgery system
7. Application to mobile object
8. Conclusion
9. Supplement

1. BACKGROUND OF EMBODIMENTS OF PRESENT DISCLOSURE ON SIDE OF INVENTORS

First, before describing the details of individual embodiments according to the present disclosure, a background of the embodiments of the present disclosure on the side of the inventors will be described.

As described above, in an image sensor, as a pixel size is reduced, an amount of light incident on a unit pixel is reduced, so that sensitivity is lowered, and an S/N ratio is lowered. Further, in the image sensor, for example, a configuration in which pixels respectively detecting red light, green light, and blue light using primary color filters are arranged in a Bayer array on a plane is widely used. In the case of the above configuration, light of one specific color can be detected and light of the other colors cannot be detected, in each pixel. For this reason, it can be said that, since the light incident on each pixel is not sufficiently used, a loss occurs from the viewpoint of pixel sensitivity. Further, it is conceivable to perform interpolation processing to interpolate the loss. However, when a color signal of a color not actually detected in a pixel is generated by the interpolation processing, a signal of a color different from the actual color may be generated, that is, a false color may be generated.

Therefore, as a method for solving the above situation, an image sensor in which three layers of photoelectric conversion films capable of performing photoelectric conversion by the red light, the green light, and the blue light are stacked in a longitudinal direction in a unit pixel, and light of three colors can be detected by one unit pixel can be illustrated (for example, Patent Literature 1 described above). Further, as another image sensor capable of detecting light of three colors by one unit pixel, an image sensor having a silicon substrate on which two PDs respectively detecting red light and blue light are stacked and a photoelectric conversion film provided above the silicon substrate and capable of performing photoelectric conversion by green light can be illustrated (for example, Patent Literature 2 described above).

Further, as described above, a configuration of a circuit for extracting a pixel signal in the image sensor having the silicon substrate on which the two PDs are stacked and the photoelectric conversion film provided above the silicon substrate is illustrated as follows. For example, as disclosed in Patent Literature 3 described above, a backside irradiation type structure in which a circuit formation layer on which the above circuit is formed is formed on the side opposite to a light receiving surface of the image sensor can be illustrated. In the case of the above structure, a circuit, a wire, and the like are not provided between the PD in the silicon substrate and the photoelectric conversion film provided above the silicon substrate. Therefore, according to the above structure, it is possible to shorten a distance between the PD and the photoelectric conversion film in a stacked direction (longitudinal direction) within the same pixel. As a result, in the above structure, F value dependence of each color can be suppressed, and a difference in the sensitivity between the colors can be reduced.

Further, as disclosed in Patent Literature 4 described above, a structure in which a semiconductor layer for storing and transferring charges obtained by photoelectric conversion and a storage electrode facing the semiconductor layer with an insulating film interposed therebetween are provided immediately below a photoelectric conversion film provided above a silicon substrate can be illustrated. In the above structure, the charges generated by the photoelectric conversion by the photoelectric conversion film can be efficiently stored in the photoelectric conversion film like one type of capacitor. Further, in the above structure, since the charges can be stored in the photoelectric conversion film, at the start of exposure, it is possible to completely deplete a charge storage unit (floating diffusion unit) provided in the silicon substrate and erase the charges. As a result, according to the above structure, it is possible to suppress occurrence of a phenomenon where, due to an increase in kTC noise (noise caused by thermal fluctuation of the charges) by the charges in the charge storage unit, random noise is deteriorated, and an image quality of image capturing of the image sensor is deteriorated.

In addition, in the various image sensors (solid-state imaging elements) described above, in order to output the charges generated in the photoelectric conversion film provided above the substrate as a pixel signal, a plurality of pixel transistors and wires to connect the pixel transistors are provided. In order to improve characteristics of the image sensor and suppress an increase in manufacturing cost, it is required to dispose the pixel transistors and the wires with suitable configurations at suitable positions.

However, in the conventional proposals, the suitable configurations and positions of the pixel transistors and the wires are not specifically examined. Further, even when the configurations and positions of the pixel transistors are disclosed, it is difficult to say that the disclosure has an effective configuration and arrangement capable of efficiently outputting and transferring the pixel signal and can suppress an increase in manufacturing cost.

Therefore, in view of the above situation, the inventors has created embodiments relating to a solid-state imaging element with pixel transistors and wires capable of efficiently outputting and transferring pixel signals by the charges generated in the photoelectric conversion film provided above the substrate while suppressing an increase in manufacturing cost. The details of embodiments according to the present disclosure will be sequentially described below.

2. FIRST EMBODIMENT

<2.1 Schematic Configuration of Solid-State Imaging Device>

First, a schematic configuration of a solid-state imaging device 1 according to a first embodiment of the present disclosure will be described with reference to FIG. 1. FIG. 1 is an explanatory diagram illustrating a planar configuration example of the solid-state imaging device 1 according to the present embodiment. As illustrated in FIG. 1, the solid-state imaging device 1 according to the present embodiment has a pixel array unit 10 in which a plurality of pixels (solid-state imaging elements) 100 are disposed in a matrix on a semiconductor substrate 300 made of silicon, for example, and a peripheral circuit unit 80 provided so as to surround the pixel array unit 10. Further, the solid-state imaging device 1 includes, as the peripheral circuit unit 80, a vertical drive circuit unit 32, column signal processing circuit units 34, a horizontal drive circuit unit 36, an output circuit unit 38, a control circuit unit 40, and the like The details of each block of the solid-state imaging device 1 according to the present embodiment will be described below.

(Pixel Array Unit 10)

The pixel array unit 10 has a plurality of pixels 100 that are disposed two-dimensionally in a matrix on the semiconductor substrate 300. The plurality of pixels 100 include normal pixels for generating pixel signals for image generation and a pair of phase difference detection pixels for generating pixel signals for focus detection. Here, the pixel 100 means a solid-state imaging element (unit pixel) that can be regarded as one unit outputting one result for each color, when light of each color is detected and a detection result is output. Each of the pixels 100 has a plurality of photoelectric conversion elements and a plurality of pixel transistors (for example, metal-oxide-semiconductor (MOS) transistors) (not illustrated). More specifically, the pixel transistors can include a transfer transistor, a selection transistor, a reset transistor, and an amplification transistor, for example. Note that the details of a circuit (connection configuration) using these pixel transistors will be described later.

(Vertical Drive Circuit Unit 32)

The vertical drive circuit unit 32 includes a shift register, for example, selects a pixel drive wire 42, supplies a pulse for driving the pixels 100 to the selected pixel drive wire 42, and drives the pixels 100 in units of rows. That is, the vertical drive circuit unit 32 selectively scans each of the pixels 100 of the pixel array unit 10 in a vertical direction (up-down direction in FIG. 1) sequentially in units of rows, and supplies a pixel signal based on the charges generated in accordance with the amount of light received by the photoelectric conversion element of each of the pixels 100 to the column signal processing circuit unit 34, which will be described later, through a vertical signal line 44.

(Column Signal Processing Circuit Unit 34)

The column signal processing circuit unit 34 is disposed for each column of the pixels 100, and performs signal processing such as noise removal for each pixel column on the pixel signals output from the pixels 100 for one row. For example, the column signal processing circuit unit 34 performs signal processing such as correlated double sampling (CDS) and analog-digital (AD) conversion in order to remove pixel-specific fixed pattern noise.

(Horizontal Drive Circuit Unit 36)

The horizontal drive circuit unit 36 includes a shift register, for example, sequentially outputs horizontal scanning pulses to sequentially select each of the column signal processing circuit units 34 described above, and outputs the pixel signal from each of the column signal processing circuit units 34 to a horizontal signal line 46.

(Output Circuit Unit 38)

The output circuit unit 38 can perform signal processing on the pixel signals sequentially supplied from each of the column signal processing circuit units 34 described above through the horizontal signal line 46, and can output the signals. The output circuit unit 38 may function as a functional unit that performs buffering, for example, or may perform processing such as black level adjustment, column variation correction, and various digital signal processing. Note that the buffering means temporarily storing the pixel signals in order to compensate for differences in processing speed and transfer speed in exchanging the pixel signals. Further, an input/output terminal 48 is a terminal for exchanging signals with an external device.

(Control Circuit Unit 40)

The control circuit unit 40 can receive an input clock and data for giving an instruction on an operation mode or the like, and can output data such as internal information of the pixel 100. That is, the control circuit unit 40 generates a clock signal and a control signal to be a reference of operation of the vertical drive circuit unit 32, the column signal processing circuit unit 34, the horizontal drive circuit unit 36, or the like, on the basis of a vertical synchronization signal, a horizontal synchronization signal, and a master clock. Then, the control circuit unit 40 outputs the generated clock signal and control signal to the vertical drive circuit unit 32, the column signal processing circuit unit 34, the horizontal drive circuit unit 36, or the like.

Note that the planar configuration example of the solid-state imaging device 1 according to the present embodiment is not limited to the example illustrated in FIG. 1, and may include, for example, another circuit unit or the like and is not particularly limited.

<2.2 Schematic Configuration of Pixel>

Figure 2:
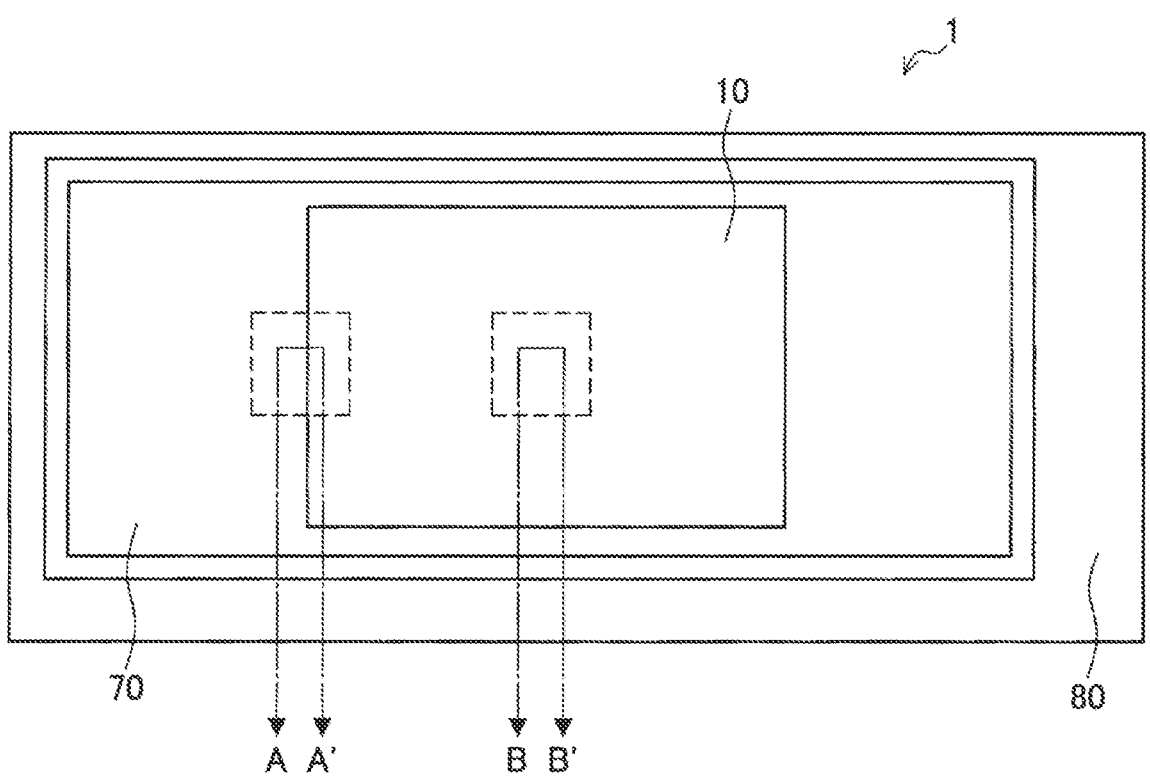
FIG. 2 is a schematic diagram of a planar configuration of the solid-state imaging device 1 according to the first embodiment of the present disclosure.
Figure 3:
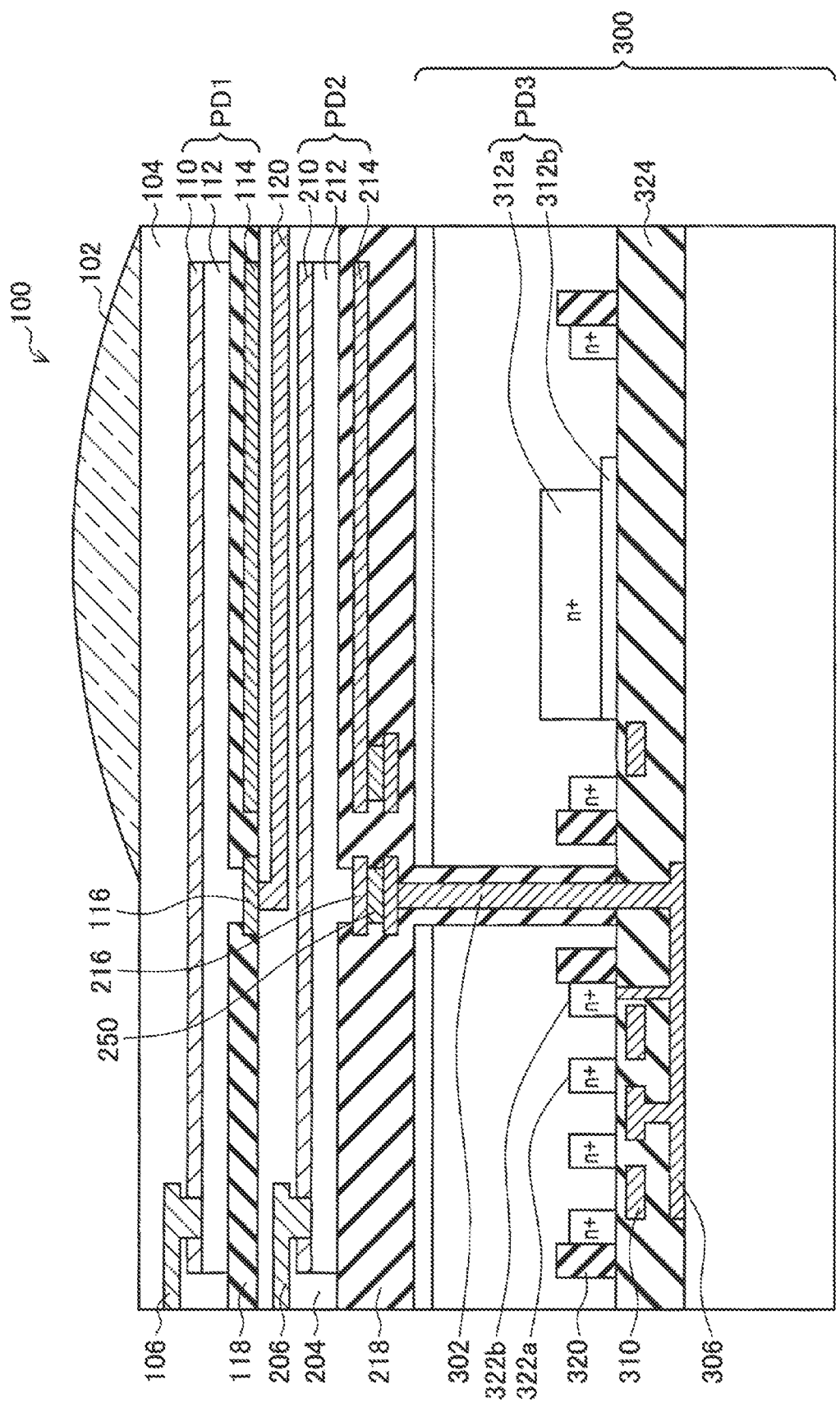
FIG. 3 is a cross-sectional view of the solid-state imaging device 1 taken along the line A-A' of FIG. 2.
Figure 4:
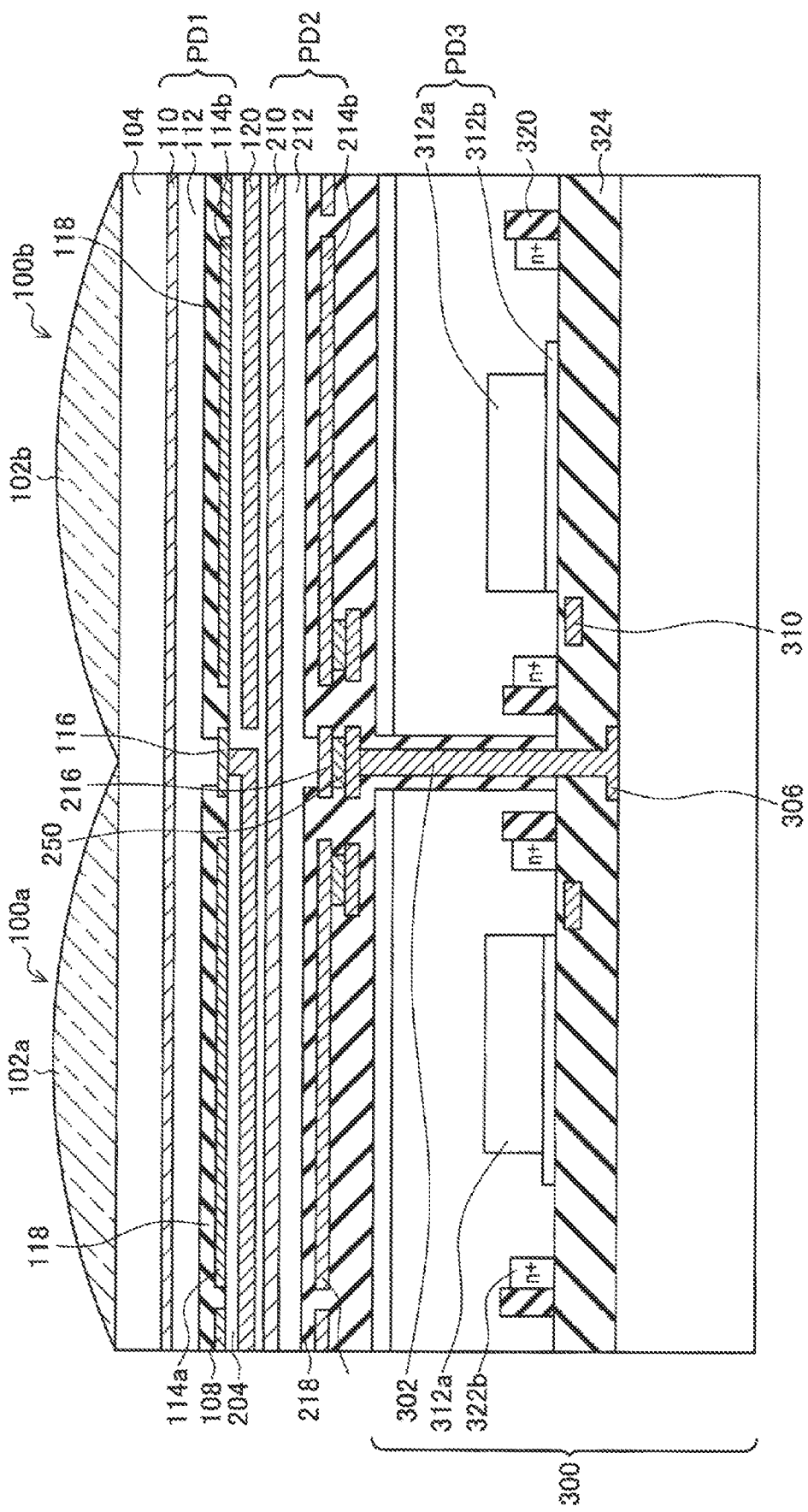
FIG. 4 is a cross-sectional view of the solid-state imaging device 1 taken along the line B-B' of FIG. 2.

The schematic configuration of the solid-state imaging device 1 according to the present embodiment has been described above. Next, a schematic configuration of stacking of the pixels 100 according to the present embodiment will be described with reference to FIGS. 2 to 4. FIG. 2 is a schematic diagram schematically illustrating the planar configuration of the solid-state imaging device 1 according to the present embodiment. Further, FIG. 3 is a cross-sectional view of the solid-state imaging device 1 taken along the line A-A' of FIG. 2, and FIG. 4 is a cross-sectional view of the solid-state imaging device 1 taken along the line B-B' of FIG. 2. Note that, in FIGS. 3 and 4, a stacked structure of a multi-layer wiring layer 120 and the like is illustrated in a simplified manner for easy understanding.

Note that, in the first embodiment described below, unless otherwise specified, upper electrodes (first electrodes) 110 and 210 and lower electrodes (second electrodes) 116 and 216 of PD1 and PD2 are defined according to positions in a stacked structure in the pixel 100 illustrated in FIGS. 3, 4, and 7. However, in a second embodiment, the upper electrodes 110 and 210 and the lower electrodes 116 and 216 of PD1 and PD2 are not defined according to positions in a stacked structure in the pixel 100 illustrated in FIG. 15, and electrodes having the same functions as the upper electrodes 110 and 210 in the first embodiment are referred to as the upper electrodes 110 and 210, and electrodes having the same functions as the lower electrodes 116 and 216 in the first embodiment are referred to as the lower electrodes 116 and 216.

As illustrated in FIG. 2, the solid-state imaging device 1 according to the present embodiment has the pixel array unit 10 in which a plurality of pixels 100 disposed in a center are disposed in a matrix as described above. Further, the solid-state imaging device 1 has a pixel transistor region 70 in which a part of corresponding pixel transistors (not illustrated) of each pixel 100 is provided so as to surround the pixel array unit 10, and a peripheral circuit unit 80 provided in the outer peripheral portion of the pixel transistor region 70. Specifically, FIG. 3 corresponds to a cross-sectional view when the solid-state imaging device 1 is cut along the line A-A' of FIG. 2, that is, when the solid-state imaging device 1 is cut so as to straddle the pixel array unit 10 and the pixel transistor region 70. In addition, FIG. 4 corresponds to a cross-sectional view when the solid-state imaging device 1 is cut along the line B-B' of FIG. 2, that is, the pixel array unit 10 is cut. Further, FIG. 4 illustrates cross-sections of two pixels 100 arranged two-dimensionally on the plane of the semiconductor substrate 300.

In the following description, the stacked structure of the pixel 100 will be described in order from the semiconductor substrate 300 located at the lower side of the pixel 100 to the photoelectric conversion elements (PD)2 and PD1 located above the semiconductor substrate 300. In other words, in the following description, the stacked structure of the pixel 100 will be described in order from the semiconductor substrate 300 illustrated on the lower side of FIGS. 3 and 4 to PD2 and PD1 illustrated on the upper side.

Specifically, as illustrated in FIGS. 3 and 4, in the pixel 100 (or the pixels 100a and 100b), a semiconductor region 312a with a second conductivity type (for example, an N-type) is provided in a semiconductor region with a first conductivity type (for example, a P-type) of the semiconductor substrate 300 made of silicon, for example. A photoelectric conversion element (PD) 3 (second photoelectric conversion unit) is formed by a PN junction of the semiconductor region 312a and a semiconductor region 312b with the first conductivity type (for example, the P-type) located immediately below the semiconductor region 312a. Note that, in the present embodiment, PD3 is, for example, a photoelectric conversion element that absorbs red light (for example, light having a wavelength of 620 nm to 750 nm) and generates charges.

Further, on the side of the semiconductor substrate 300 opposite to the semiconductor region 312a (in other words, the side opposite to the light receiving surface) (the lower side in FIGS. 3 and 4), a wiring layer including a wire 306 formed of tungsten (W), aluminum (Al), copper (Cu), or the like is provided. In the wiring layer, a plurality of electrodes 310 formed of W, Al, Cu, or the like are provided as gate electrodes of a plurality of pixel transistors for reading the charges generated by PD3 described above. Specifically, the electrode 310 is provided so as to face the semiconductor region with the first conductivity type (for example, the P-type) in the semiconductor substrate 300 with an insulating film 324 interposed therebetween. Further, in the semiconductor substrate 300, a semiconductor region 322a with the second conductivity type (for example, the N-type) is provided so as to sandwich the semiconductor region with the first conductivity type, and the semiconductor region 322a can function as a source/drain region of the pixel transistor.

Further, as illustrated in FIGS. 3 and 4, in the semiconductor substrate 300, a through electrode 302 for taking out the charges generated in photoelectric conversion films 112 and 212 described later to the wire 306 is provided to penetrate the semiconductor substrate 300. Note that FIGS. 3 and 4 illustrate the through electrode 302 for taking out the charges generated in the photoelectric conversion film 212. On the other hand, the through electrode (not illustrated) for taking out the charges generated in the photoelectric conversion film 112 can be provided, for example, around the pixel array unit 10 in the same manner as the through electrode 302.

Further, an insulating film 218 made of an aluminum oxide film ($Al_2O_3$) or the like is formed on the outer periphery of the through electrode 302 to prevent a short circuit between the through electrode 302 and the semiconductor substrate 300. The insulating film 218 preferably has a low interface state in order to reduce an interface state between the semiconductor substrate 300 and the insulating film 218 and suppress generation of a dark current from an interface between the semiconductor substrate 300 and the insulating film 218. In addition to the aluminum oxide film, a silicon oxide ($SiO_2$) film, a silicon nitride ($Si_3N_4$) film, a silicon oxynitride (SiON) film, a silicon carbide (SiC) film, a carbon added silicon oxide (SiCO) film, or the like can be used as an example of the insulating film 218, and the insulating film 218 is not particularly limited. Examples of a method for forming these films can include a chemical vapor deposition (CVD) method, a physical vapor deposition (PVD) method, an atomic layer deposition (ALD) method, and the like. However, in the present embodiment, the material and method for forming the insulating film 218 are not particularly limited.

Further, the through electrode 302 may be connected to the floating diffusion unit 322b or the electrode 310 provided in the semiconductor region with the second conductivity type (for example, the N-type) provided in the semiconductor substrate 300, by the wire 306 provided in the wiring layer described above. The floating diffusion unit 322b is a region that temporarily stores the charges generated in the photoelectric conversion films 112 and 212. Further, in the semiconductor substrate 300, an isolation insulating film 320 may be provided so as to be adjacent to the floating diffusion unit 322b or the source/drain region 322a of each pixel transistor.

Then, as illustrated in FIGS. 3 and 4, the insulating film 218 made of, for example, an $Al_2O_3$ film or the like and capable of transmitting light is provided on the semiconductor substrate 300. Since the insulating film 218 can transmit light, PD3 provided below the insulating film 218 can receive light and perform photoelectric conversion, that is, can detect light.

Further, the insulating film 218 is provided with a wire 250 which is electrically connected to the through electrode 302 and functions as a light-shielding film. For the wire 250, for example, W and a stacked film of a titanium (Ti) film and a titanium nitride (TiN) film to be barrier metals can be used. However, in the present embodiment, a material forming the wire 250 is not particularly limited.

The photoelectric conversion film (third photoelectric conversion film) 212 is provided above the insulating film 218 so as to be sandwiched between the upper electrode 210 and the lower electrode 216. In addition, the photoelectric conversion film 212, the upper electrode 210, and the lower electrode 216 can configure PD2 (third photoelectric conversion unit). In the present embodiment, PD2 is, for example, a photoelectric conversion element that absorbs green light (for example, light having a wavelength of 495 nm to 570 nm) and generates charges (photoelectric conversion).

Note that the upper electrode 210 and the lower electrode 216 can be formed of a transparent conductive film capable of transmitting light, such as an indium tin oxide (ITO, including crystalline ITO and amorphous ITO) film. However, in the present embodiment, the material forming the upper electrode 210 and the lower electrode 216 is not limited to ITO described above, and other materials may be used. For example, the transparent conductive film is preferably made of a material having a band gap of 2.5 eV or more, preferably 3.1 eV or more. For example, as the transparent conductive film, in a tin oxide-based material, tin oxide, antimony-tin oxide (Sb is added to $SnO_2$ as a dopant, for example, ATO), fluorine-tin oxide (F is added to $SnO_2$ as a dopant, for example, FTO), or the like can be illustrated. In a zinc oxide-based material, aluminum-zinc oxide (Al is added to ZnO as a dopant, for example, AZO), gallium-zinc oxide (Ga is added to ZnO as a dopant, for example, GZO), indium-zinc oxide (In is added to ZnO as a dopant, for example IZO), indium-gallium-zinc oxide (In and Ga are added to $ZnO_4$ as dopants, for example, IGZO), indium-tin-zinc oxide (In and Sn are added to ZnO as dopants for example, ITZO), or the like can be illustrated. In addition, indium-gallium oxide (In is added to $Ga_2O_3$ as a dopant, for example, IGO), $CuInO_2$, $MgIn_2O_4$, CuI, $InSbO_4$, ZnMgO, CdO, $ZnSnO_3$, or the like can be illustrated. Further, the details of the material of the photoelectric conversion film 212 will be described later.

Further, a wire 206 connected to the upper electrode 210 illustrated in FIG. 3 can also function as a light-shielding film, and can be formed of a material such as W, Ti, TiN, Al, or Cu, for example. Note that, in the present embodiment, the material of the wire 206 is not limited thereto, and the wire 206 may be formed of other materials.

Further, as illustrated in FIGS. 3 and 4, PD2 has storage electrodes 214 (214a and 214b) facing the upper electrode 210 with the photoelectric conversion film 212 interposed therebetween in order to temporarily store the charges generated by the photoelectric conversion film 212 in the photoelectric conversion film 212. Specifically, the storage electrode 214 contacts the photoelectric conversion film 212 with the insulating film 218 or the insulating film 218 and a semiconductor layer (not illustrated) interposed therebetween.

The wires 206 and 250 and the like are electrically connected to the upper electrode 210, the lower electrode 216, and the storage electrode 214, and a desired potential is applied to the upper electrode 210, the lower electrode 216, and the storage electrode 214 by using these wires 206 and 250 and the like. Further, the lower electrode 216 is connected to the floating diffusion unit 322b provided in the semiconductor substrate 300 via the through electrode 302. In the present embodiment, by controlling the potential applied to the lower electrode 216 and the storage electrode 214, the charges generated by the photoelectric conversion film 212 can be stored in the photoelectric conversion film 212, or the charges can be taken out to the floating diffusion unit 322b. In other words, the storage electrode 214 can function as a charge storage electrode for attracting the charges generated by the photoelectric conversion film 212 in accordance with the applied potential and storing the charges in the photoelectric conversion film 212. Note that, in the present embodiment, in order to effectively use light incident on the pixel 100, the storage electrode 214 is preferably provided so as to have a larger area than the lower electrode 216 when viewed from above the light receiving surface.

Note that, in the present embodiment, in order to store the charges more efficiently, an oxide semiconductor layer 240 (refer to FIG. 7) capable of transmitting light may be provided between the insulating film 218 and the photoelectric conversion film 212. In the present embodiment, as a material of the oxide semiconductor layer 240, for example, in a tin oxide-based material, $SnO_2$ (to which a dopant is added) and tin oxide to which a dopant such as zinc-tin oxide is added can be illustrated, and in a zinc oxide-based material, aluminum-zinc oxide (for example, AZO), gallium-zinc oxide (for example, GZO), indium-zinc oxide (for example, IZO), IGZO, ITZO and the like can be illustrated. Furthermore, as the material of the oxide semiconductor layer 240, for example, $InSbO_4$, ZnMgO, $CuInO_2$, $MgIn_2O_4$, CdO, GeO, $TiO_2$, and the like can be illustrated.

Further, an electrode (not illustrated) that contacts the oxide semiconductor layer 240 (refer to FIG. 7) with an insulating film interposed therebetween and is electrically insulated from the lower electrode 216 and the storage electrode 214 may be provided between the lower electrode 216 and the storage electrode 214. The electrode can function as a gate electrode of a pixel transistor (specifically, a transfer transistor) including the oxide semiconductor layer 240 as a channel formation region.

The storage electrode 214 is formed of a transparent conductive film, similarly to the upper electrode 210 and the lower electrode 216 described above. As described above, in the present embodiment, by forming the upper electrode 210, the lower electrode 216, and the storage electrode 214 with the transparent conductive film, the light incident on the pixel 100 can also be detected by PD3. Note that a film thickness of the upper electrode 210, the lower electrode 216, and the storage electrode 214 is 5 nm to 200 nm, and is preferably about 30 nm to 100 nm.

Further, the insulating film 218 is provided between the lower electrode 216 and the storage electrode 214 and between the photoelectric conversion film 212 and the storage electrode 214 to electrically insulate them. Note that the insulating film 218 may be a film having fixed charges having the same polarity as the charges generated by the photoelectric conversion film 212.

Furthermore, the multi-layer wiring layer (control unit) 120 is provided above the upper electrode 210 with a sealing film 204 interposed therebetween. Note that, in the present embodiment, examples of a material of the sealing film 204 can include $Al_2O_3$ or the like capable of transmitting light. In addition to $Al_2O_3$, as the material of the sealing film 204, $SiO_2$, $Si_3N_4$, SiON, SiC, SiCO, or the like can be used, and the material is not particularly limited. The details of the multi-layer wiring layer 120 will be described later.

Further, PD1 (first photoelectric conversion unit) is provided above the multi-layer wiring layer 120 with the sealing film 204, an insulating film, or the like interposed therebetween, similarly to PD2 described above. PD1 is, for example, a photoelectric conversion element that absorbs blue light (for example, light having a wavelength of 425 nm to 495 nm) and generates charges (photoelectric conversion). Since the stacked structure of PD1 is the same as the stacked structure of PD2 described above, the detailed description thereof is omitted here. That is, the lower electrode 116, a storage electrode 114, an insulating film 118, the photoelectric conversion film (first photoelectric conversion film) 112, and the upper electrode 110 are sequentially stacked as PD1 above the sealing film 204.

The photoelectric conversion films 112 and 212 described above can be formed of an organic material (organic photoelectric conversion film) or an inorganic material (inorganic photoelectric conversion film). For example, in a case where the photoelectric conversion film is formed of an organic material, it is possible to select one from four modes: (a) a P-type organic semiconductor material, (b) an N-type organic semiconductor material, (c) a stacked structure of at least two of a P-type organic semiconductor material layer, an N-type organic semiconductor material layer, and a mixed layer (bulk heterostructure) of a P-type organic semiconductor material and an N-type organic semiconductor material, and (d) a mixed layer of a P-type organic semiconductor material and an N-type organic semiconductor material. Note that the photoelectric conversion film using the organic material also includes a stacked structure in which an electron blocking film/buffer film, a photoelectric conversion film, a hole blocking film, a hole blocking/buffer film, and a work function adjusting film are stacked on the lower electrode.

Specifically, examples of the P-type organic semiconductor material can include naphthalene derivatives, anthracene derivatives, phenanthrene derivatives, pyrene derivatives, perylene derivatives, tetracene derivatives, pentacene derivatives, quinacridone derivatives, coumarin derivatives, pyrromethene derivatives, pyran derivatives, phenoxazone derivatives, thiophene derivatives, thienothiophene derivatives, benzothiophene derivatives, benzothienobenzo thiophene (BTBT) derivatives, dinaphthothienothiophene (DNTT) derivatives, dianthracenothienothiophene (DATT) derivatives, benzobisbenzothiophene (BBBT) derivatives, naphthalenebisbenzothiophene (NBBT), thienobisbenzothiophene (TBBT) derivative, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives, pentacenodithiophene (PDT) derivatives, triallylamine derivatives, carbazole derivatives, picene derivatives, chrysene derivatives, fluoranthene derivatives, phthalocyanine derivatives, subphthalocyanine derivatives, subporphyrazine derivatives, metal complex having a heterocyclic compound as a ligand, polythiophene derivatives, polybenzothiadiazole derivatives, polyfluorene derivatives, and the like.

In addition, examples of the N-type organic semiconductor material can include fullerenes and fullerene derivatives (for example, fullerenes such as C60, C70, and C74 (higher fullerenes, endohedral fullerenes, etc.) or fullerene derivatives (for example, fullerene fluoride or Phenyl-$C_{\varepsilon 1}$-Butyric Acid Methyl Ester (PCBM) fullerene compounds, fullerene multimers, etc.)), organic semiconductor having highest occupied molecular orbital (HOMO) and lowest unoccupied molecular orbital (LUMO) deeper than P-type organic semiconductor, inorganic metal oxide capable of transmitting light, and the like. More specifically, examples of the N-type organic semiconductor material can include a heterocyclic compound containing a nitrogen atom, an oxygen atom, and a sulfur atom, for example, organic molecules including pyridine derivatives, pyrromethene derivatives, pyrazine derivatives, pyrimidine derivatives, triazine derivatives, quinoline derivatives, quinoxaline derivatives, isoquinoline derivatives, coumarin derivatives, pyran derivatives, phenoxazone derivatives, perylene derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives, or the like, as a part of molecular skeleton, organometallic complexes, and subphthalocyanine derivatives. In addition, examples of a group contained in the fullerene derivatives can include a branched or cyclic alkyl group or a phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having chalcogenide; a phosphine group; a phosphone group; and derivatives of these. Note that the film thickness of the photoelectric conversion film formed of the organic material is not limited, but may be, for example, $1 \times 10{-}8$ m to $5 \times 10^{-7}$ m, preferably $2.5 \times 10{-}8$ m to $3 \times 10^{-7}$ m, more preferably $2.5 \times 10{-}8$ m to $2 \times 10{-}7$ m. Further, in the above description, the organic semiconductor materials are classified into the P-type and the N-type, in which the P-type means that holes are easily transported, and the N-type means that electrons are easily transported. That is, in the organic semiconductor materials, the types are not be limited to the interpretation of having holes or electrons as majority carriers for thermal excitation, unlike the case of the inorganic semiconductor materials.

Further, when the photoelectric conversion films 112 and 212 are formed of the inorganic material, examples of the inorganic semiconductor material can include crystalline silicon, amorphous silicon, microcrystalline silicon, crystalline selenium, amorphous selenium, chalcopyrite compounds such as CIGS(CuInGaSe), CIS($CuInSe_2$), $CuInS_2$, $CuAlS_2$, $CuAlSe_2$, $CuGaS_2$, $CuGaSe_2$, $AgAlS_2$, $AgAlSe_2$, AgInS$_2$, and AgInSe$_2$, or III-V group compounds such as GaAs, InP, AlGaAs, InGaP, AlGaInP, and InGaAsP, and compound semiconductors such as CdSe, CdS, In$_2$Se$_3$, In$_2$S$_3$, Bi$_2$Se$_3$, Bi$_2$S$_3$, ZnSe, ZnS, PbSe, and PbS. In addition, in the present embodiment, quantum dots formed of these materials can be used as the photoelectric conversion films 112 and 212.

Further, the photoelectric conversion films 112 and 212 may be formed of polymers such as phenylene vinylene, fluorene, carbazole, indole, pyrene, pyrrole, picoline, thiophene, acetylene, and diacetylene, or derivatives thereof.

Furthermore, in order to detect blue light and green light, in the photoelectric conversion films 112 and 212, for example, metal complex dyes, rhodamine dyes, cyanine dyes, merocyanine dyes, phenylxanthene dyes, triphenylmethane dyes, rhodacyanine dyes, xanthene dyes, macrocyclic azaannulene dyes, azulene dyes, naphthoquinone, anthraquinone dyes, condensed polycyclic aromatic compounds such as anthracene and pyrene and chain compounds condensed with aromatic ring or heterocyclic compounds, two nitrogen-containing heterocycles such as quinoline, benzothiazole, and benzoxazole, which have squarylium group and croconitcoumethine group as the binding chain, cyanine dyes linked by squarylium group and croconitumethine group, or the like can be preferably used. Further, among the above metal complex dyes, dithiol metal complex dyes, metal phthalocyanine dyes, metalloporphyrin dyes, or ruthenium complex dyes are preferable, and ruthenium complex dyes are particularly preferable. However, the present disclosure is not limited thereto.

In addition, when the photoelectric conversion films 112 and 212 are caused to function as photoelectric conversion films for detecting red light, the photoelectric conversion films can contain phthalocyanine dyes, subphthalocyanine dyes (subphthalocyanine derivatives), and the like.

Further, as illustrated in FIGS. 3 and 4, for example, similarly to the sealing film 204, a sealing film 104 made of SiN or the like is provided above PD1. Examples of a material of the sealing film 104 can include Al$_2$O$_3$ and the like, which can transmit light. In addition to Al$_2$O$_3$, as the material of the sealing film 104, SiO$_2$, Si$_3$N$_4$, SiON, SiC, SiCO, or the like can be used, and the material is not particularly limited. Further, as illustrated in FIGS. 3 and 4, a high refractive index layer (not illustrated) made of an inorganic film such as a silicon nitride film, a silicon oxynitride film, or silicon carbide (SiC) is provided on the sealing film 104. Further, on-chip lenses 102 (102a and 102b) are provided for each pixel 100 on the high refractive index layer. The on-chip lens 102 can be formed of, for example, a silicon nitride film or a resin material such as a styrene resin, an acrylic resin, a styrene-acrylic copolymer resin, or a siloxane resin.

As described above, the pixel 100 included in the solid-state imaging device 1 according to an embodiment of the present disclosure has a stacked structure in which PD1, PD2, and PD3 respectively detecting light of three colors are stacked. That is, it can be said that the pixel 100 described above is a vertical spectral type solid-state imaging element that performs photoelectric conversion on blue light by the photoelectric conversion film 112 (PD1) formed above the semiconductor substrate 300, performs photoelectric conversion on green light by the photoelectric conversion film 212 (PD2) provided below PD1, and performs photoelectric conversion on red light by PD3 provided in the semiconductor substrate 300.

Note that, in the embodiment of the present disclosure, the pixel 100 is not limited to the vertical spectral type stacked structure described above. For example, the green light may be photoelectrically converted by the photoelectric conversion film 112 (PD1) provided above the semiconductor substrate 300, and the blue light may be photoelectrically converted by the photoelectric conversion film 212 (PD2) provided below PD1. The pixel 100 may further have a photoelectric conversion film that detects infrared rays. Further, in the embodiment of the present disclosure, the pixel 100 described above may have a structure in which PD1 having the photoelectric conversion film 112 provided above the semiconductor substrate 300 and PD2 and PD3 provided in the semiconductor substrate 300 are stacked. That is, the pixel 100 according to the present embodiment may have a structure in which PD2 and PD3 are stacked in the semiconductor substrate 300.

<2.3 Equivalent Circuit of Pixel>

Figure 5:
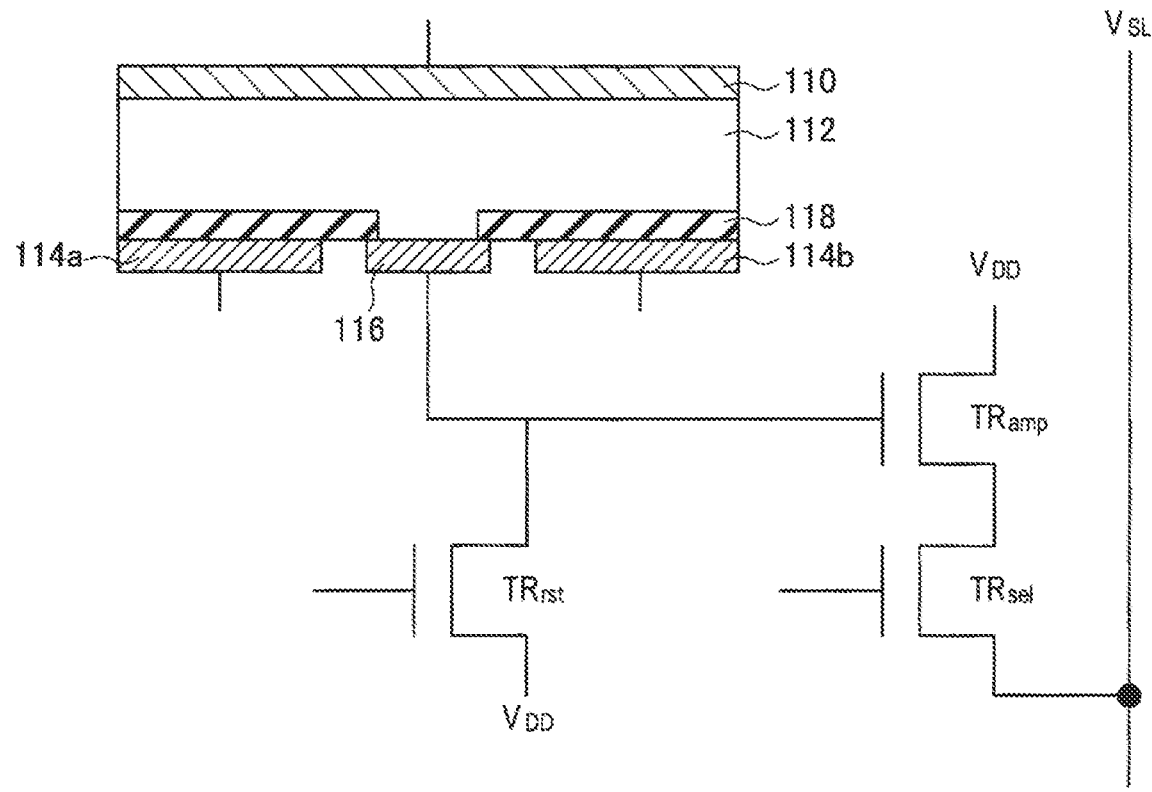
FIG. 5 is an equivalent circuit diagram of PD1 and PD2 according to the first embodiment of the present disclosure.
Figure 6:
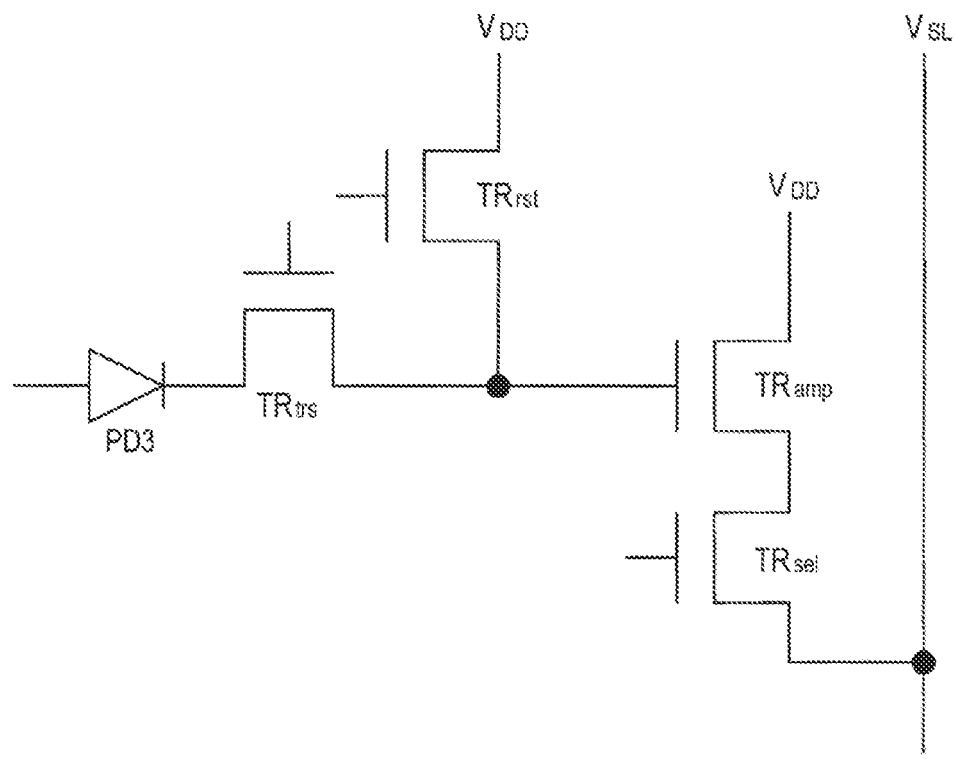
FIG. 6 is an equivalent circuit diagram of PD3 according to the first embodiment of the present disclosure.

The schematic structure of stacking of the pixel 100 according to the present embodiment has been described above. Next, before explaining a detailed configuration of the multi-layer wiring layer 120 included in the stacked structure of the pixel 100, in order to facilitate understanding of the circuit configuration included in the multi-layer wiring layer 120, an equivalent circuit of PD1, PD2, and PD3 included in the pixel 100 will be described with reference to FIGS. 5 and 6. FIG. 5 is an equivalent circuit diagram of PD1 and PD2 according to the present embodiment, and FIG. 6 is an equivalent circuit diagram of PD3 according to the present embodiment.

PD1 and PD2 have a stacked structure illustrated in the upper left of FIG. 5. Specifically, PD1 and PD2 have the upper electrode 110 (210), the lower electrode 116 (216), and the photoelectric conversion film 112 (212) sandwiched therebetween. Further, PD1 and PD2 have storage electrodes 114a and 114b (214a and 214b) contacting the photoelectric conversion film 112 (212) with the insulating film 118 (218) interposed therebetween. Note that, as illustrated in FIG. 5, the storage electrodes 114a and 114b (214a and 214b) are disposed so as to be line-symmetrical with the lower electrode 116 interposed therebetween, when the pixel 100 is viewed from above the light receiving surface. The details of a planar configuration of the storage electrode 114 (214) will be described later. Further, in the following description, the equivalent circuit of PD1 included in the pixel 100 will be described, but the equivalent circuit of PD2 is the same as that of PD1.

As illustrated in FIG. 5, the lower electrode 116 is electrically connected to the pixel transistors (the amplification transistor $TR_{amp}$, the selection transistor $TR_{sel}$, and the reset transistor $TR_{rst}$) provided in a multi-layer wiring layer 120 and an oxide semiconductor layer 142 (refer to FIG. 7) described later via a wire. Specifically, the lower electrode 116 is electrically connected to one of the drain/source of the reset transistor $TR_{rst}$ for resetting the stored charges via a wire or the like. A gate of the reset transistor $TR_{res}$ is electrically connected to a reset signal line (not illustrated) and further electrically connected to the vertical drive circuit unit 32 described above. Further, the other of the drain/source of the reset transistor $TR_{res}$ (the side not connected to the lower electrode 116) is electrically connected to a power supply circuit $V_{DD}$.

Further, the lower electrode 116 is electrically connected to the gate of the amplification transistor $TR_{amp}$ that amplifies (converts) the charges and outputs a pixel signal via a wire. Further, one of the source/drain of the amplification transistor $TR_{amp}$ is electrically connected via a wire to one of the source/drain of the selection transistor $TR_{sel}$ that outputs the pixel signal to the signal line $V_{SL}$ in accordance with the selection signal. Further, the other of the source/drain of the amplification transistor $TR_{amp}$ (the side not connected to the selection transistor $TR_{sel}$) is electrically connected to the power supply circuit $V_DD$.

Further, the other of the source/drain of the selection transistor $TR_{sel}$ (the side not connected to the amplification transistor $TR_{amp}$) is electrically connected to the signal line $V_{SL}$ and further electrically connected to the column signal processing circuit unit 34 described above. Further, the gate of the selection transistor $TR_{sel}$ is electrically connected to a selection line (not illustrated) and further electrically connected to the vertical drive circuit unit 32 described above.

In addition, the storage electrodes 114a and 114b are electrically connected to the above-described vertical drive circuit unit 32 via a wire. The detailed configuration of stacking of the above-described pixel transistors (the amplification transistor $TR_{amp}$, the reset transistor $TR_{rst}$, and the selection transistor $TR_{sel}$) will be described later.

Although not illustrated in FIG. 5, PD1 and PD2 may be electrically connected to the transfer transistor, similarly to PD3 described later.

Next, for reference, an equivalent circuit of PD3 will be described with reference to FIG. 6. As illustrated in FIG. 6, PD3 provided in the semiconductor substrate 300 is connected to the pixel transistors (the amplification transistor $TR_{amp}$, the transfer transistor $TR_{trs}$, the reset transistor $TR_{rst}$, and the selection transistor $TR_{sel}$) provided in the semiconductor substrate 300 via a wire. Specifically, one side of PD3 is electrically connected to one of the source/drain of the transfer transistor $TR_{trs}$ for transferring the charges via a wire. Further, the other of the source/drain of the transfer transistor $TR_t$re (the side not connected to PD3) is electrically connected to one of the source/drain of the reset transistor $TR_{rst}$ via a wire. Further, the gate of the transfer transistor $TR_{trs}$ is electrically connected to a transfer gate line (not illustrated) and further connected to the vertical drive circuit unit 32 described above. The other of the source/drain of the reset transistor $TR_{rst}$ (the side not connected to the transfer transistor $TR_{trs}$) is electrically connected to the power supply circuit $V_{DD}$. Further, the gate of the reset transistor $TR_{rst}$ is electrically connected to a reset line (not illustrated) and further electrically connected to the vertical drive circuit unit 32 described above.

Further, the other of the source/drain of the transfer transistor $TR_{trs}$ (the side not connected to PD3) is electrically connected via a wire to the gate of the amplification transistor $TR_{amp}$ that amplifies (converts) the charges and outputs a pixel signal. Further, one of the source/drain of the amplification transistor $TR_{amp}$ is electrically connected via a wire to one of the source/drain of the selection transistor $TR_{sel}$ that outputs the pixel signal to the signal line $V_{SL}$ in accordance with the selection signal. In addition, the other of the source/drain of the amplification transistor $TR_{amp}$ (the side not connected to the selection transistor $TR_{sel}$) is electrically connected to the power supply circuit $V_{DD}$. Further, the other of the source/drain of the selection transistor $TR_{sel}$ (the side not connected to the amplification transistor $TR_{amp}$) is electrically connected to the signal line $V_{SL}$ and further electrically connected to the column signal processing circuit unit 34 described above. In addition, the gate of the selection transistor $TR_{sel}$ is electrically connected to a selection line (not illustrated) and further electrically connected to the vertical drive circuit unit 32 described above.

<2.4 Detailed Configuration of Multi-Layer Wiring Layer>

Figure 8:
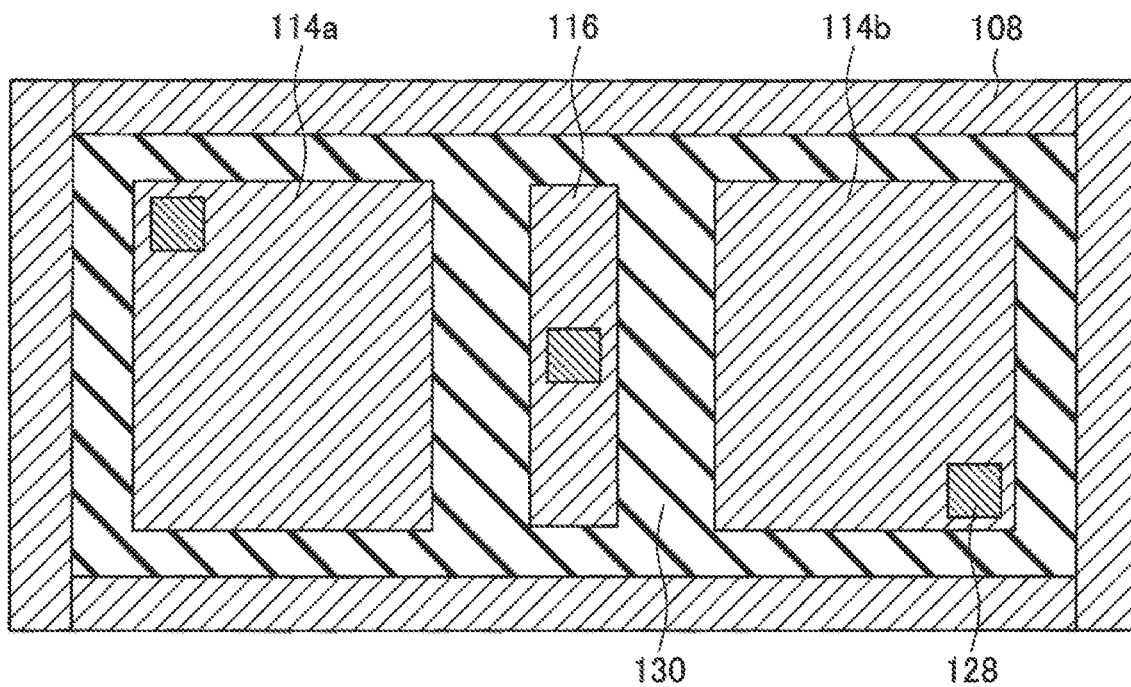
FIG. 8 is a cross-sectional view of the pixel 100 taken along the line a-a' of FIG. 7.
Figure 9:
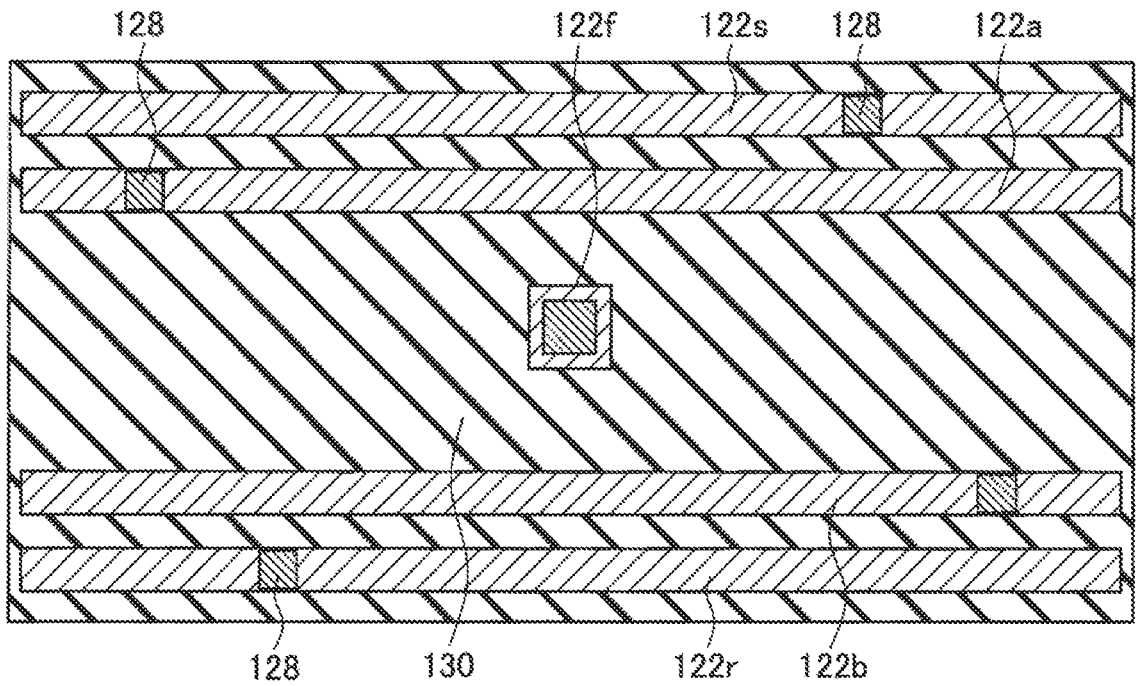
FIG. 9 is a cross-sectional view of the pixel 100 taken along the line b-b' of FIG. 7.
Figure 10:
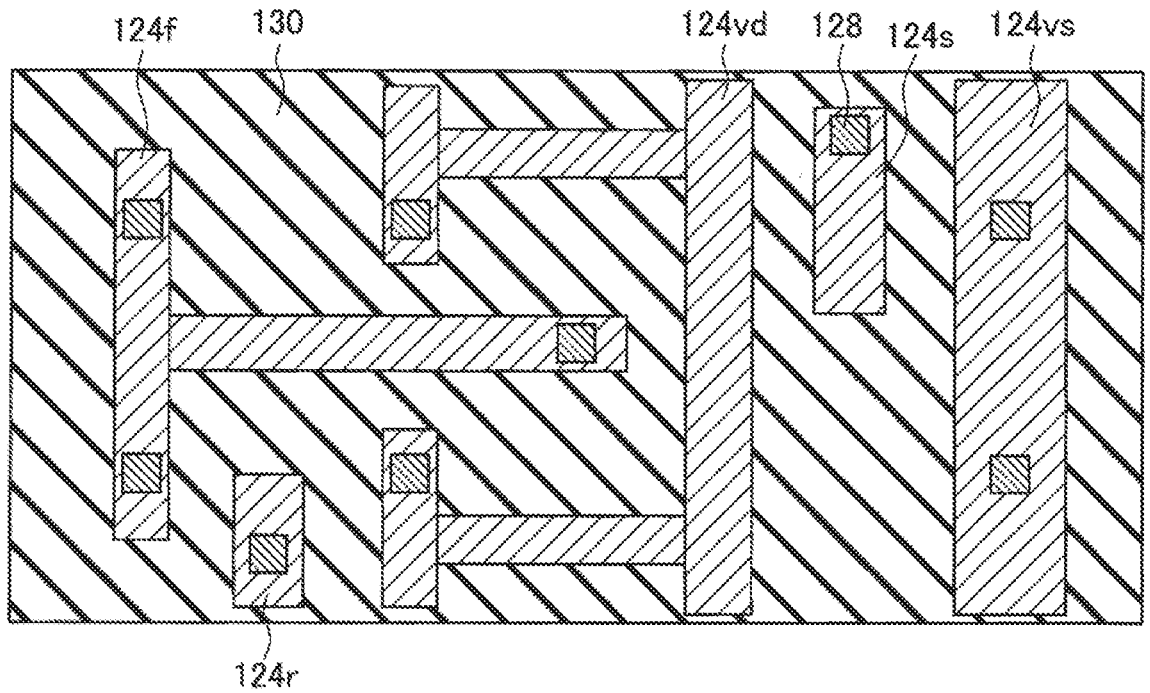
FIG. 10 is a cross-sectional view of the pixel 100 taken along the line c-c' of FIG. 7.
Figure 11:
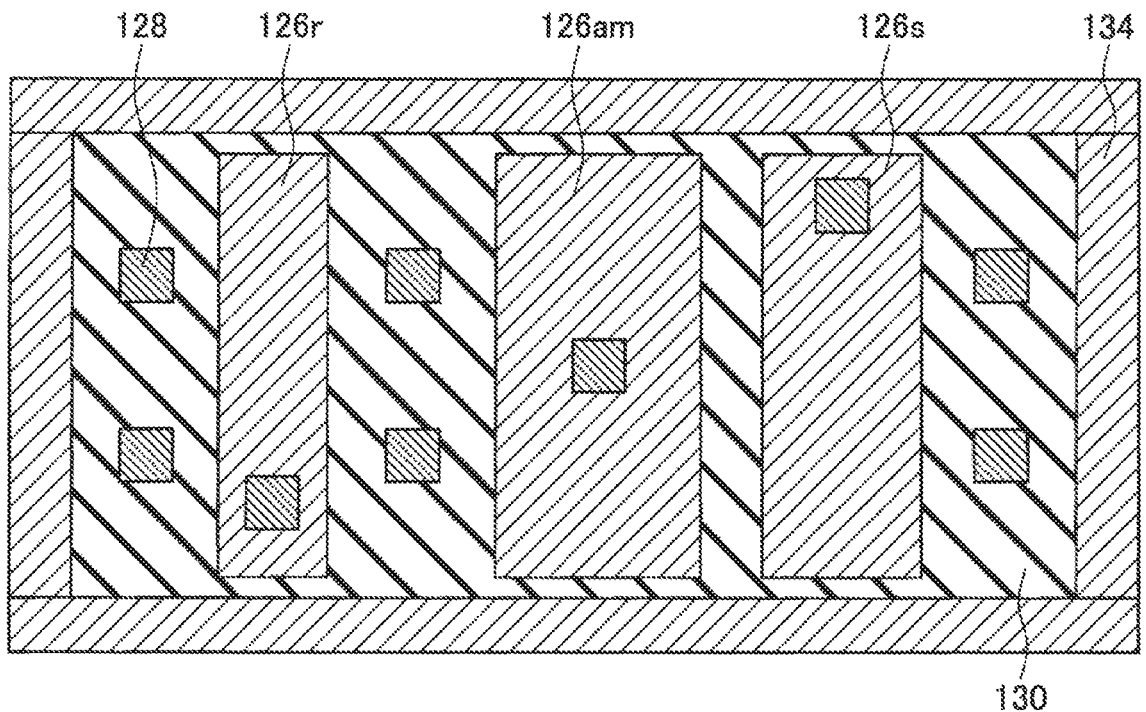
FIG. 11 is a cross-sectional view of the pixel 100 taken along the line d-d' of FIG. 7.

The equivalent circuits of PD1, PD2, and PD3 according to the present embodiment have been described above. Next, a detailed configuration of stacking of the multi-layer wiring layer 120 will be described with reference to FIGS. 7 to 11. FIG. 7 illustrates a part of a cross-sectional view of the pixel 100 (specifically, the pixels 100a and 100b) according to the present embodiment. Specifically, FIG. 7 mainly illustrates a portion between PD2 and PD1 with the multi-layer wiring layer 120 interposed therebetween. Further, FIG. 8 is a cross-sectional view of the pixel 100 taken along the line a-a' of FIG. 7. FIG. 9 is a cross-sectional view of the pixel 100 taken along the line b-b' of FIG. 7. FIG. 10 is a cross-sectional view of the pixel 100 taken along the line c-c' of FIG. 7. Further, FIG. 11 is a cross-sectional view of the pixel 100 taken along the line d-d' of FIG. 7.

Figure 7:
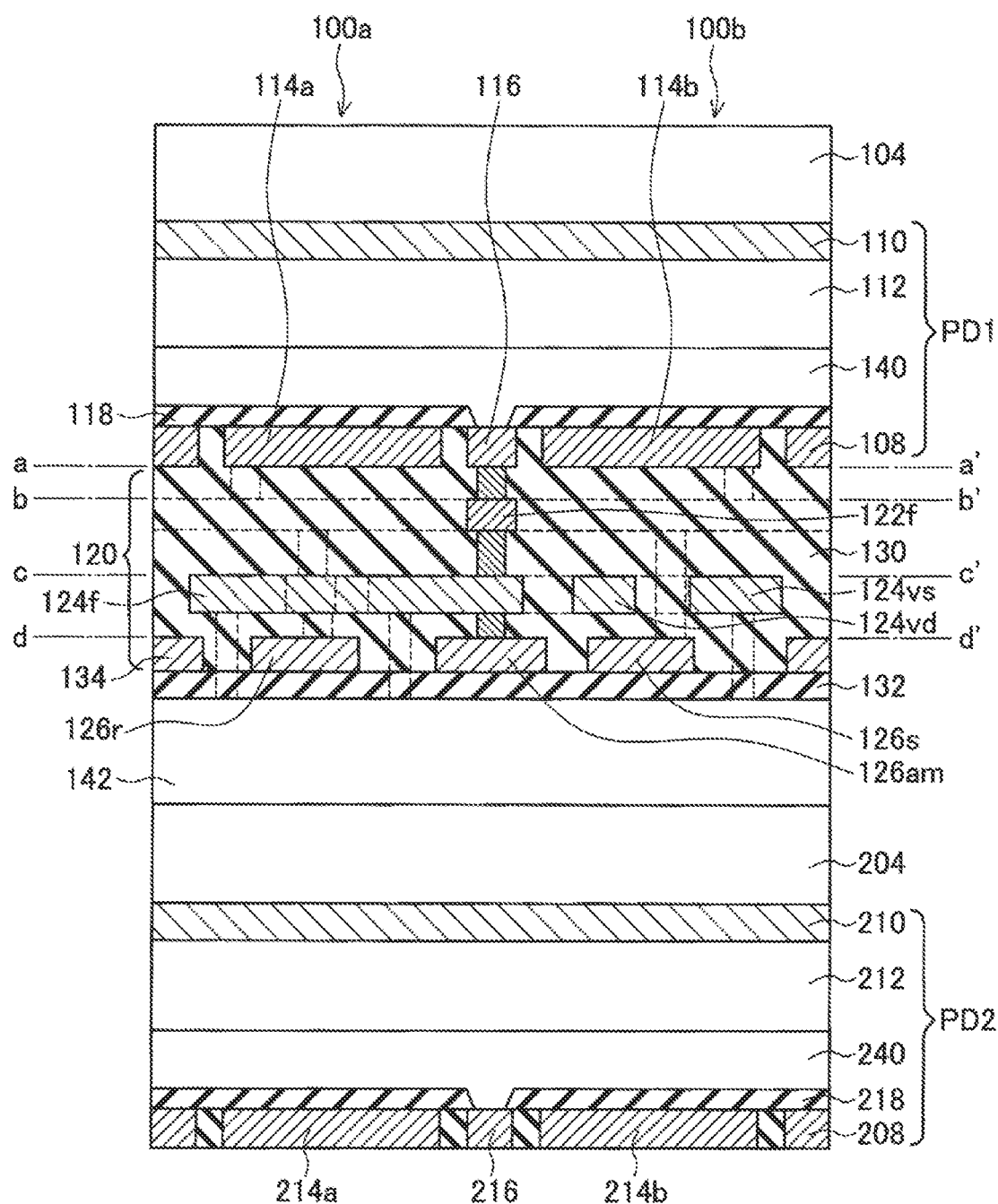
FIG. 7 illustrates a part of a cross-sectional view of a pixel 100 according to the first embodiment of the present disclosure.

Specifically, in the present embodiment, as illustrated in FIG. 7, the pixel 100 has the lower electrode 216, the storage electrode 214, a shield electrode 208, the photoelectric conversion film 212, and the upper electrode 210 provided as PD2. Further, the oxide semiconductor layer 142 capable of transmitting light is provided on the sealing film 204 provided above the upper electrode 210. In the present embodiment, examples of a material for forming the oxide semiconductor layer 142 can include amorphous silicon, $SnO_2$ (to which a dopant is added) and tin oxide to which a dopant such as zinc-tin oxide is added as tin oxide-based materials, and aluminum-zinc oxide (for example, AZO), gallium-zinc oxide (for example, GZO), indium-zinc oxide (for example, IZO), IGZO, ITZO, and the like as zinc oxide-based materials. Furthermore, examples of the material of the oxide semiconductor layer 142 can include $InSbO_4$, ZnMgO, $CuInO_2$, $MgIn_2O_4$, CdO, GeO, $TiO_2$, and the like. The oxide semiconductor layer 142 can function as a channel formation region or a source/drain region common to the pixel transistors connected to PD1 (for example, the amplification transistor $TR_{amp}$, the transfer transistor $TR_{trs}$, the reset transistor $TR_{rst}$, and the selection transistor $TR_{sel}$). That is, by configuring the channel formation region or the like of the pixel transistor connected to PD1 with the oxide semiconductor layer 142 capable of transmitting light, the light can also be transmitted to PD2 and PD3 provided below the pixel transistor. In other words, by configuring the channel formation region or the like of the pixel transistor connected to PD1 with the oxide semiconductor layer 142 capable of transmitting light, the pixel transistor of PD1 can be stacked with PD1, and the pixel transistor can be further stacked above PD2 and PD3.

Further, an insulating film 132 is provided on the oxide semiconductor layer 142. The insulating film 132 can be formed of an $HfO_2$ film, an $SiO_2$ film, or the like that can transmit light.

Further, the multi-layer wiring layer 120 including wires and electrodes is provided above the insulating film 132. Further, the lower electrode 116, the storage electrode 114, the insulating film 118, an oxide semiconductor layer 140, the photoelectric conversion film 112, and the upper electrode 110, which configure PD1, are provided above the multi-layer wiring layer 120. That is, the multi-layer wiring layer 120 is provided between PD1 and the semiconductor substrate 300 in the stacked structure of the pixel 100. The detailed structure of stacking of the multi-layer wiring layer 120 will be described below with reference to FIGS. 7 to 11. In the following description, for easy understanding, the description will be given starting from PD1. In other words, the stacked structure will be described from the upper side to the lower side of the multi-layer wiring layer 120.

First, as illustrated in FIG. 7, the storage electrodes 114a and 114b and the lower electrode 116 of PD1 are provided immediately below the insulating film 118. The storage electrode 114a and the storage electrode 114b are provided so that the rectangular storage electrodes 114a and 114b and the strip-shaped lower electrode 116 are line-symmetrical on the left and right sides in the drawing with the lower electrode 116 interposed therebetween, as illustrated in FIG. 8. According to the present embodiment, by providing the storage electrodes 114a and 114b so as to be symmetrical as described above, the photoelectric conversion film 112 can detect light with optical symmetry with respect to incident light. Further, as described above, the storage electrodes 114a and 114b preferably have a larger area than the lower electrode 116. Note that the shapes of the lower electrode 116 and the storage electrodes 114a and 114b are not limited to the shapes illustrated in FIG. 8, and if the storage electrodes 114a and 114b have symmetry with the lower electrode 116 interposed therebetween, the shapes are not particularly limited.

Further, as illustrated in FIG. 8, each of the lower electrode 116 and the storage electrodes 114a and 114b has a contact 128 for electrically connecting to a wire. Therefore, by the contact 128, the storage electrodes 114a and 114b and the lower electrode 116 can be electrically connected to drive wires 122a, 122b, and 122f (refer to FIG. 9) provided below the storage electrodes 114a and 114b and the lower electrode 116.

Further, as illustrated in FIG. 8, a strip-shaped shield electrode 108 is provided so as to surround one lower electrode 116 and the storage electrodes 114a and 114b sandwiching the lower electrode 116 from a horizontal direction in the drawing, in other words, so as to surround the two pixels 100 (100a and 100b). In the present embodiment, the shield electrode 108 can be formed of a transparent conductive film or the like, similarly to the lower electrode 116 and the storage electrodes 114a and 114b, for example. According to the present embodiment, by providing the shield electrode 108, it is possible to suppress a leakage from a pixel transistor with another pixel 100 not surrounded by the same shield electrode 108.

Further, returning to FIG. 7, drive wires 122a, 122b, 122f, 122s, and 122r are provided below the storage electrodes 114a and 114b and the lower electrode 116 with an insulating film 130 interposed therebetween. In the following description, a layer provided with the drive wires 122a, 122b, 122f, 122s, and 122r is referred to as a drive wiring layer.

Specifically, as illustrated in FIG. 9, in the drive wiring layer, the rectangular drive wire 122f electrically connected to the lower electrode 116 via the contact 128 is disposed in the center. In addition, the drive wire 122f is electrically connected to a drive wire 124f (refer to FIG. 10) provided below the drive wire 122f via the contact 128, and further electrically connected to a gate electrode 126am (refer to FIG. 11), which is the gate electrode of the amplification transistor $TR_{amp}$ provided below the drive wire 122f.

Further, as illustrated in FIG. 9, the drive wires 122a, 122b, 122s, and 122r extending in strips are provided in the horizontal direction in the drawing so as to sandwich the drive wire 122f from the up-down direction in the drawing. More specifically, the drive wire 122a is electrically connected to the storage electrode 114a of PD1 via the contact 128, and the drive wire 122b is electrically connected to the storage electrode 114b of PD1 via the contact 128. Although not illustrated, the drive wires 122a and 122b are drawn to the outer periphery of the pixel 100 and electrically connected to the vertical drive circuit unit 32 that controls the voltage applied to the storage electrodes 114a and 114b of PD1.

In addition, the drive wire 122s is electrically connected to the drive wire 124s (refer to FIG. 10) provided below the drive wire 122s via the contact 128, and further electrically connected to a gate electrode 126s (refer to FIG. 11), which is the gate electrode of the selection transistor $TR_{sel}$ provided below the drive wire 122s. Although not illustrated, the drive wire 122s is drawn to the outer periphery of the pixel 100, electrically connected to a selection line (not illustrated) for applying a voltage to the gate of the selection transistor $TR_{sel}$ and further electrically connected to the vertical drive circuit unit 32.

Further, the drive wire 122r is electrically connected to the drive wire 124r (refer to FIG. 10) provided below the drive wire 122r via the contact 128, and further electrically connected to a gate electrode 126r (refer to FIG. 11), which is the gate electrode of the reset transistor $TR_{rst}$ provided below the drive wire 122r. Although not illustrated, the drive wire 122r is drawn to the outer periphery of the pixel 100, electrically connected to a reset line (not illustrated) for applying a voltage to the gate of the reset transistor $TR_{rst}$, and further electrically connected to the vertical drive circuit unit 32.

In the present embodiment, the drive wires 122a, 122b, 122f, 122s, and 122r described above are preferably formed using a low resistance wiring material, for example, a material such as Cu, Al, W, Ti, TiN, Ta, and TaN. In the present embodiment, by using the low resistance wiring material for the drive wires 122a, 122b, 122f, 122s, and 122r, the drive speeds of the pixel transistors (the selection transistor $TR_{sel}$, the reset transistor $TR_{rst}$, and the like) and the storage electrodes 114a and 114b and the transfer speed of the charges generated by the photoelectric conversion film 112 can be improved.

Further, in the present embodiment, by providing the drive wires 122a and 122b for driving the storage electrodes 114a and 114b and the drive wires 122r and 122s for driving the reset transistor $TR_{rst}$ and the like in the same layer, the number of layers in the stacked structure of the pixel 100 can be reduced. As a result, according to the present embodiment, it is possible to suppress an increase in the manufacturing cost of the solid-state imaging device 1 including the pixels 100. In addition, in the present embodiment, it is possible to shorten the distance between PD1, PD2, and PD3 in the stacked direction within the same pixel 100. As a result, in the present embodiment, F value dependence of each color can be suppressed, and the difference in sensitivity between the colors can be reduced. Note that, in the present embodiment, the shapes of the drive wires 122a, 122b, 122f, 122s, and 122r are not limited to the shapes illustrated in FIG. 9.

Further, returning to FIG. 7, drive wires 124f, 124r, and 124s, a power supply wire 124vd, and a signal wire 124vs are provided below the drive wires 122a, 122b, 122f, 122s, and 122r with the insulating film 130 interposed therebetween. In the following description, a layer provided with the drive wires 124f, 124r, and 124s, the power supply wire 124vd, and the signal wire 124vs is referred to as a power supply/signal wiring layer.

Specifically, as illustrated in FIG. 10, in the power supply/signal wiring layer, the rectangular signal wire 124vs to be a part of the signal line $V_{SL}$ is provided on the right side of the drawing, and the signal wire 124vs is electrically connected to the oxide semiconductor layer 142 provided below the signal wire 124vs via the contact 128.

Further, as illustrated in FIG. 10, the rectangular drive wire 124s electrically connected to the above-described drive wire 122s via the contact 128 is provided on the left side of the signal wire 124vs in the drawing. Further, the drive wire 124s is electrically connected to the gate electrode 126s (refer to FIG. 11) to be the gate electrode of the selection transistor TR$_{sel}$ provided below the drive wire 124s via the contact 128.

Further, as illustrated in FIG. 10, the strip-shaped power supply wire 124vd to be drawn in a shape of a horizontal "U" is provided on the left side of the drive wire 124s in the drawing. Although not illustrated, the power supply wire 124vd is drawn to the outer periphery of the pixel 100 and electrically connected to the power supply circuit V$_D$ that applies a power supply voltage to the pixel transistors (the amplification transistor TR$_{amp}$ and the reset transistor TR$_{rst}$). Furthermore, the power supply wire 124vd is electrically connected to the oxide semiconductor layer 142 provided below the power supply wire 124vd via the contacts 128 provided in the rectangular wire located at the two tips of the shape of "U" described above.

Further, as illustrated in FIG. 10, the drive wire 124f to be drawn in a shape of a horizontal "T" is provided on the left side of the power supply wire 124vd in the drawing. As illustrated in FIG. 10, the drive wire 124f is electrically connected to the drive wire 122f provided above the drive wire 124f via the contact 128 provided at a right end of a portion extending in a longitudinal direction of a shape of "T" (a portion extending in the horizontal direction in the drawing). Further, the drive wire 124f is electrically connected to the gate electrode 126am (refer to FIG. 11) to be the gate electrode of the amplification transistor TR$_{amp}$ provided below the drive wire 124f via the contact 128.

As illustrated in FIG. 10, the drive wire 124f is electrically connected to the oxide semiconductor layer 142 provided below the drive wire 124f via the contacts 128 provided at two ends of a portion extending in a traverse direction of a shape of "T" (a portion extending in the up-down direction in the drawing).

Further, as illustrated in FIG. 10, the rectangular drive wire 124r is provided on the left side of the power supply wire 124vd in the drawing, and the drive wire 124r is electrically connected to the drive wire 122r provided above the drive wire 124r via the contact 128. Further, the drive wire 124r is electrically connected to the gate electrode 126r (refer to FIG. 11) which is the gate electrode of the reset transistor TR$_{rst}$ provided below the drive wire 124r.

In the present embodiment, the drive wires 124f, 124r, and 124s, the power supply wire 124vd, and the signal wire 124vs are preferably formed of a transparent conductive film such as ITO. In the present embodiment, the drive wires 124f, 124r, and 124s, the power supply wire 124vd, and the signal wire 124vs are formed of the transparent conductive film, so that the light incident on the pixels 100 can be detected in PD2 and PD3. Further, in the present embodiment, it is preferable that the signal wire 124vs and the power supply wire 124vd are preferably provided so as to have a larger wiring width than the drive wires 124f, 124r, and 124s. According to the present embodiment, by increasing the wiring width of the signal wire 124vs and the power supply wire 124vd, for example, a time until the signal transmitted through the signal wire 124vs to be a part of the signal line V$_{SL}$ becomes stable (settling period) can be shortened.

Furthermore, in the present embodiment, a plurality of contacts 128 for electrically connecting the drive wire 124f, the power supply wire 124vd, and the signal wire 124vs to the oxide semiconductor layer 142 are preferably provided as illustrated in FIG. 10. According to the present embodiment, the contact resistance can be reduced by providing the plurality of contacts 128. Note that, in the present embodiment, the shapes of the drive wires 124f, 124r, and 124s, the power supply wire 124vd, and the signal wire 124vs are not limited to the forms illustrated in FIG. 10.

Further, returning to FIG. 7, the gate electrodes 126r, 126am, and 126s are provided below the drive wires 124f, 124r, and 124s, the power supply wire 124vd, and the signal wire 124vs with the insulating film 130 interposed therebetween. Note that, in the following description, a layer provided with the gate electrodes 126r, 126am, and 126s is referred to as a gate electrode layer.

Specifically, as illustrated in FIG. 11, in the gate electrode layer, the rectangular gate electrode 126s connected to the drive wire 124s provided above via the contact 128 is provided on the right side of the drawing. The gate electrode 126s functions as the gate electrode of the selection transistor TR$_{sel}$.

Further, as illustrated in FIG. 11, the rectangular gate electrode 126am electrically connected to the drive wire 124f provided above via the contact 128 is provided on the left side of the gate electrode 126s in the drawing. The gate electrode 126am functions as the gate electrode of the amplification transistor TR$_{amp}$.

Further, as illustrated in FIG. 11, the rectangular gate electrode 126r electrically connected to the drive wire 124r provided above via the contact 128 is provided on the left side of the gate electrode 126am in the drawing. The gate electrode 126r functions as the gate electrode of the reset transistor TR$_{rst}$.

Further, as illustrated in FIG. 11, a strip-shaped shield electrode 134 is provided so as to surround the gate electrodes 126r, 126am, and 126s of the plurality of pixel transistors. In the present embodiment, the shield electrode 134 can be formed of, for example, a transparent conductive film or the like similarly to the gate electrodes 126r, 126am, and 126s. In other words, the shield electrode 134 is provided so as to surround the two pixels 100 (100a and 100b), similarly to the shield electrode 108 described above. According to the present embodiment, by providing the shield electrode 134, it is possible to suppress a leakage from a pixel transistor with another pixel 100 not surrounded by the same shield electrode 134.

Further, in the present embodiment, the gate electrodes 126r, 126am, and 126s and the shield electrode 134 are preferably formed of a transparent conductive film such as ITO. In the present embodiment, by forming the gate electrodes 126r, 126am, and 126s and the shield electrode 134 with the transparent conductive film, the light incident on the pixel 100 can be detected by PD2 and PD3. Note that, in the present embodiment, the shapes of the gate electrodes 126r, 126am, and 126s and the shield electrode 134 are not limited to the forms illustrated in FIG. 11.

Further, the oxide semiconductor layer 142 is provided below the multi-layer wiring layer 120 with the insulating film 132 interposed therebetween, as described above. The oxide semiconductor layer 142 can function as a channel formation region (a portion facing each gate electrode 126) or a source/drain region (a portion connected to each wire 124 or the like) common to the pixel transistor connected to PD1 (for example, the amplification transistor TR$_{amp}$, the transfer transistor TR$_{trs}$, the reset transistor TR$_{rst}$, and the selection transistor TR$_{sel}$). Although not illustrated in FIG. 7, similarly to PD3 described later, the pixel 100 may also be provided with the transfer transistor Tr$_{trs}$ of PD1. In this case, the channel formation region or the source/drain region of the transfer transistor $Tr_{trs}$ may be provided in the oxide semiconductor layer 142.

Further, the contact 128 is preferably formed of polysilicon doped with impurities, a metal with a high melting point or metal silicide such as W, Ti, Pt (platinum), Pd (lead), Cu, TiW, TiN, TiNW, $WSi_2$, or $MoSi_2$, or a material such as a stacked structure (for example, Ti/TiN/W) of layers made of these materials.

Furthermore, the drive wiring layer, the power supply/signal wiring layer, and the gate electrode layer included in the multi-layer wiring layer 120 and described above preferably have a film thickness of, for example, about 50 to 100 nm.

Further, the insulating film 130 provided between the drive wiring layer, the power supply/signal wiring layer, and the gate electrode layer described above can be formed of, for example, a $HfO_2$ film, a $SiO_2$ film, or the like that can transmit light. In addition to the above materials, as the material of the insulating film 130, $Al_2O_3$, $Si_3N_4$, SiON, SiC, SiCO, or the like can be used, and the material is not particularly limited.

Further, the sealing film 204 and the upper electrode 210, the photoelectric conversion film 212, the lower electrode 216, and the storage electrodes 214a and 214b of PD2 are provided below the oxide semiconductor layer 142. Note that the storage electrodes 214a and 214b of PD2 are also preferably provided so as to be line-symmetrical with respect to the lower electrode 216 when viewed from above the light receiving surface, similarly to PD1. According to the present embodiment, by providing the storage electrodes 214a and 214b so as to be symmetrical as described above, the photoelectric conversion film 212 can detect light with optical symmetry with respect to incident light. That is, PD1 and PD2 are configured to include the two pixels (pixel division) 100 (specifically, the pixels 100a and 100b) that are line-symmetrical to each other on a plane, so that it is possible to have optical symmetry.

<2.5 Manufacturing Method>

Figure 12:
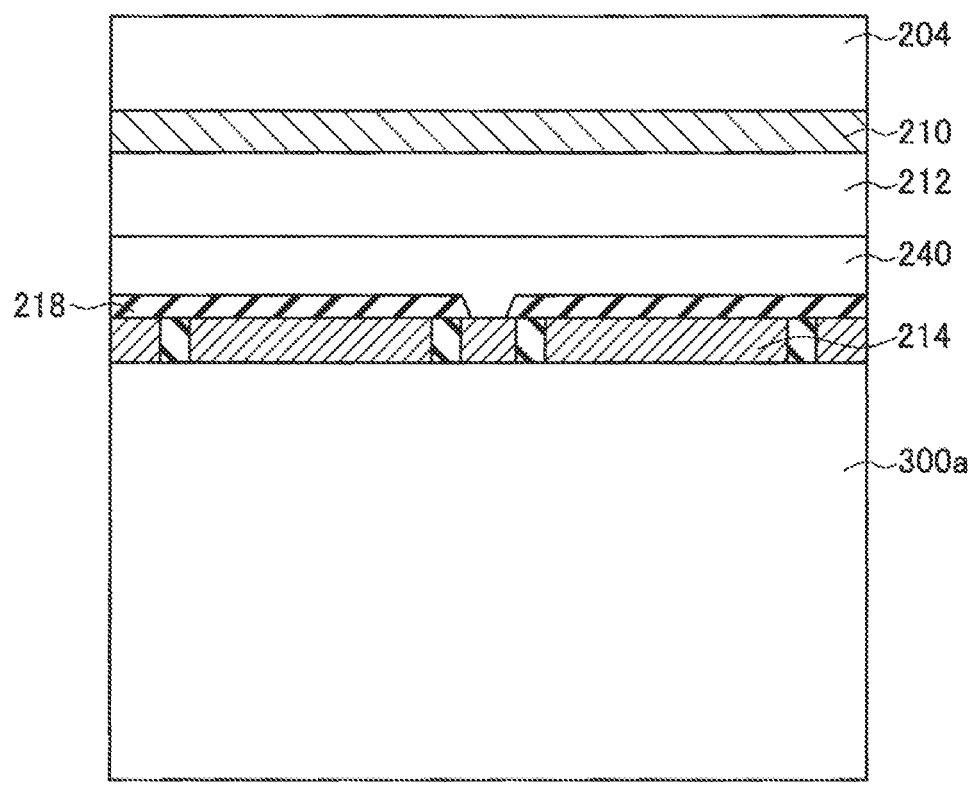
FIG. 12 is a cross-sectional view (1) for explaining a step of manufacturing the pixel 100 according to the first embodiment of the present disclosure.
Figure 13:
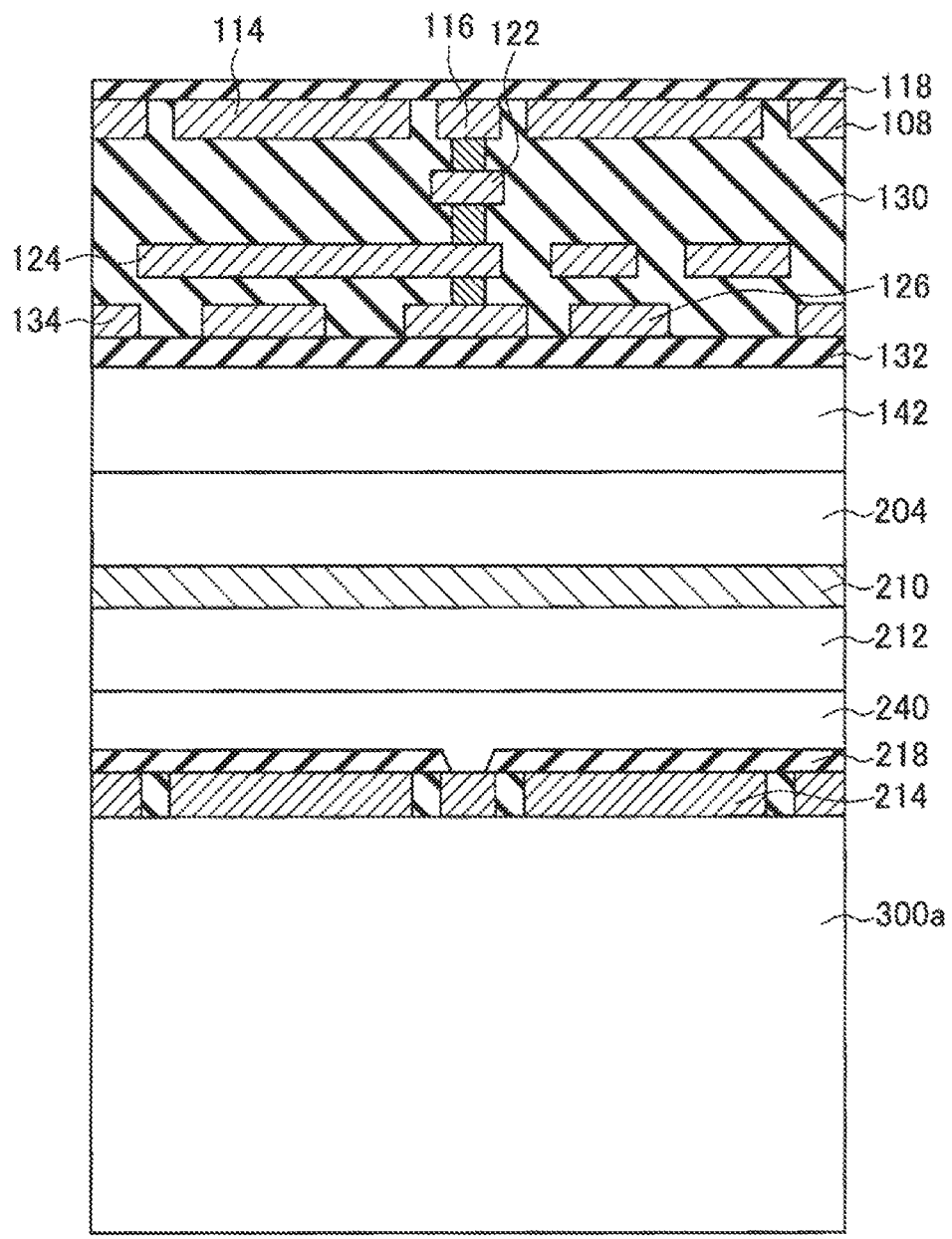
FIG. 13 is a cross-sectional view (2) for explaining a step of manufacturing the pixel 100 according to the first embodiment of the present disclosure.
Figure 14:
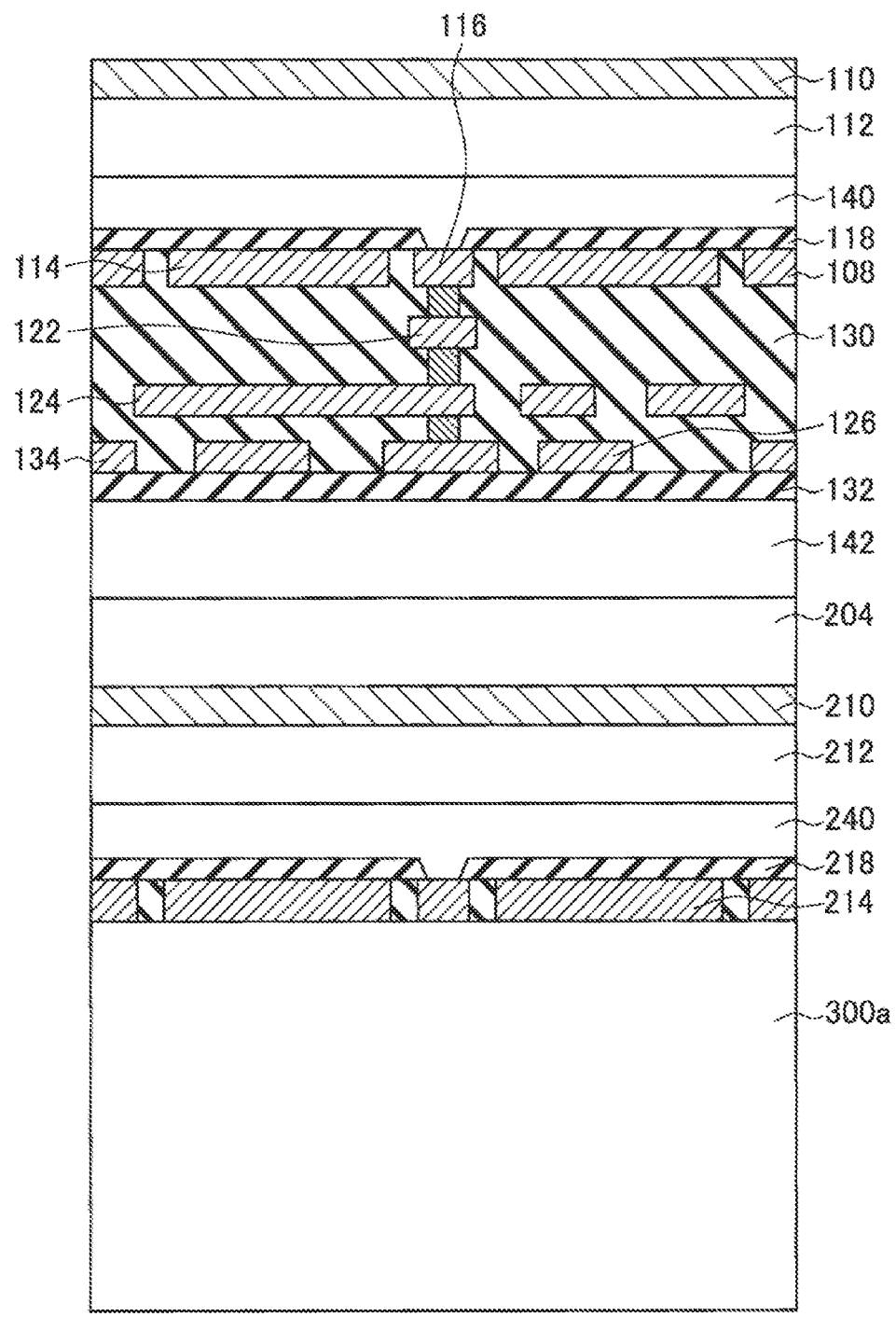
FIG. 14 is a cross-sectional view (3) for explaining a step of manufacturing the pixel 100 according to the first embodiment of the present disclosure.

The detailed configuration of stacking of the multi-layer wiring layer 120 according to the present embodiment has been described above. Next, a method for manufacturing the pixel 100 according to the first embodiment of the present disclosure illustrated in FIG. 7 will be described with reference to FIGS. 12 to 14. FIGS. 12 to 14 are cross-sectional views for explaining the method for manufacturing the pixel 100 according to the first embodiment of the present disclosure.

First, a silicon layer (not illustrated) is formed on a surface of a silicon on insulator (SOI) substrate (not illustrated) by using an epitaxial growth method, and the semiconductor regions 312a and 312b to be PD3 (refer to FIG. 3 and FIG. 4)) and the like are formed on the silicon layer. Further, the pixel transistors of PD2 and PD3 and the like are formed on the silicon layer. Further, after the electrode 310, the wire 306, the insulating film 324, and the like (refer to FIGS. 3 and 4) are formed on the silicon layer, a supporting substrate (not illustrated) is attached onto the insulating film 324. Then, the SOI substrate is removed to expose the silicon layer. Next, an opening is formed in the exposed silicon layer, and an insulating film and a metal film are embedded to form a through electrode 302 (refer to FIGS. 3 and 4).

Next, the insulating film 218 (refer to FIGS. 3 and 4) is stacked on the through electrode 302. As described above, the insulating film 218 preferably has a low interface state in order to reduce an interface state between the silicon layer and the insulating film 218 and suppress generation of a dark current from an interface between the silicon layer and the insulating film 218. Examples of the material of the insulating film 218 can include a stacked structure of an $HfO_2$ film or an $Al_2O_3$ film formed by an ALD method and an $SiO_2$ film formed by a plasma CVD method.

Next, after depositing the insulating film 218, the wire 250 (refer to FIGS. 3 and 4) also serving as a light-shielding film is formed. The wire 250 is formed by processing so as to leave a portion to be shielded from light. Since the wire 250 is electrically connected to the through electrode 302 and is also used as a light-shielding film, it is preferably formed of W and a stacked film of Ti and TiN to be barrier metals.

Then, the lower electrode 216, the storage electrode 214, and the shield electrode 208 having desired shapes are formed on the insulating film 218 by using lithography, etching, or the like. Specifically, the storage electrode 214 or the like can be formed as a film having a desired shape by, for example, performing patterning using photolithography after stacking ITO or the like using a sputtering method, and performing processing using dry etching or wet etching. Note that the space between the lower electrode 216, the storage electrode 214, and the shield electrode 208 is preferably filled with the insulating film 218 formed by plasma CVD or the like, and the top surfaces of the lower electrode 216, the storage electrode 214, and the shield electrode 208 and the top surface of the insulating film 218 therebetween are preferably flattened by Chemical Mechanical Polishing (CMP).

Next, the insulating film 218 is formed on the lower electrode 216, the storage electrode 214, and the shield electrode 208, and an opening is formed in the insulating film 218 using lithography or the like so that a part of the lower electrode 216 is exposed. Further, a metal material such as W, Al, or Cu is embedded in the opening, and then the oxide semiconductor layer 240 is formed over the insulating film 218. Note that the top surface of the insulating film 218 may be planarized by CMP or the like before the oxide semiconductor layer 240 is formed.

Further, the photoelectric conversion film 212, the upper electrode 210, and the sealing film 204 are sequentially stacked on the oxide semiconductor layer 240. In this way, the structure illustrated in FIG. 12 can be obtained. The photoelectric conversion film 212 can be formed by using spin coating, vacuum deposition, or the like. Further, it is known that the characteristics of the photoelectric conversion film 212 generally greatly vary due to the influence of moisture, oxygen, hydrogen, and the like. Therefore, the upper electrode 210 on the photoelectric conversion film 212 is preferably formed in a vacuum consistent with the photoelectric conversion film 212. Further, before and after forming the sealing film 204, a post-treatment such as ashing or organic cleaning may be performed to remove the deposit and the residue. In FIG. 12, for easy understanding, illustration of the silicon layer, PD3, the pixel transistor, the wire 306, and the like is omitted, and these are collectively illustrated as a semiconductor substrate 300a. Furthermore, the same is applied to FIGS. 13 and 14 below.

Then, the oxide semiconductor layer 142 is stacked on the sealing film 204 and the insulating film 132 is stacked on the oxide semiconductor layer 142. Further, the gate electrode 126 and the shield electrode 134 having a desired shape are formed on the insulating film 132, and then the insulating film 130 is stacked. Then, an opening is formed which penetrates the stacked insulating film 130 and extends to the gate electrode 126, or further penetrates the insulating film 130 and extends to the oxide semiconductor layer 142. A metal film or the like is embedded in the formed opening to form the contact 128.

Next, the wire 124 having a desired shape is formed on the contact 128 and the insulating film 130, and the contact 128 that connects the gate electrode 126 and the wire 124 is formed in the same manner as described above. Further, the drive wire 122 having a desired shape is formed on the contact 128 and the insulating film 130, and the contact 128 that connects the wire 124 and the drive wire 122 is formed in the same manner as described above. Then, the lower electrode 116, the storage electrode 114, and the shield electrode 108 having a desired shape are formed in a desired shape on the contact 128 and the insulating film 130, and the insulating film 118 is stacked on these electrodes. In this way, the structure illustrated in FIG. 13 can be obtained.

Then, the oxide semiconductor layer 140, the photoelectric conversion film 112, and the upper electrode 110 are sequentially stacked on the insulating film 118. In this way, the structure illustrated in FIG. 14 can be obtained. Then, by forming the sealing film 104, the pixel 100 illustrated in FIG. 7 can be obtained.

Examples of a method for forming each of the above layers can include a PVD method, a CVD method, and the like. Examples of the PVD method can include a vacuum deposition method using resistance heating or high frequency heating, an electron beam (EB) deposition method, various sputtering methods (a magnetron sputtering method, an RF-DC coupled bias sputtering method, an electron cyclotron resonance (ECR) sputtering method, a facing target sputtering method, a high frequency sputtering method, and the like), an ion plating method, a laser ablation method, a molecular beam epitaxy (MBE) method, a laser transfer method, and the like. Examples of the CVD method can include a plasma CVD method, a thermal CVD method, a metal organic (MO) CVD method, an optical CVD method, and the like. Further, examples of other methods can include an electrolytic plating method, an electroless plating method, a spin coating method; a dipping method; a casting method; a microcontact printing method; a drop casting method; various printing methods such as a screen printing method, an inkjet printing method, an offset printing method, a gravure printing method, and a flexographic printing method; a stamping method; a spray method; and various coating methods such as an air doctor coater method; a blade coater method; a rod coater method; a knife coater method; a squeeze coater method; a reverse roll coater method, a transfer roll coater method, a gravure coater method, a kiss coater method, a cast coater method, a spray coater method, a slit orifice coater method, and a calendar coater method. Examples of a patterning method of each layer can include a shadow mask, laser transfer, chemical etching such as photolithography, physical etching using ultraviolet rays or laser, and the like. In addition, examples of flattening technology can include a CMP method, a laser flattening method, a reflow method, and the like.

As described above, according to the present embodiment, it is possible to provide the pixel 100 with the pixel transistors (the amplification transistor $TR_{amp}$, the selection transistor $TR_{sel}$, and the reset transistor $TR_{rst}$) and the wires capable of efficiently outputting and transferring a pixel signal by the charges generated in the photoelectric conversion film 112 while suppressing an increase in manufacturing cost.

Specifically, in the present embodiment, the channel formation regions and the like of the pixel transistors (the amplification transistor $TR_{amp}$, the selection transistor $TR_{sel}$, and the reset transistor $TR_{rst}$) connected to PD1 are configured by the oxide semiconductor layer 142 capable of transmitting light, so that these can be stacked above PD2 and PD3. Further, in the present embodiment, by providing the drive wires 122a and 122b for driving the storage electrodes 114a and 114b and the drive wires 122r and 122s for driving the reset transistor $TR_{rst}$ and the like in the same layer, the number of layers in the stacked structure of the pixel 100 can be reduced. As a result, according to the present embodiment, it is possible to suppress an increase in the manufacturing cost of the solid-state imaging device 1 including the pixels 100. In addition, in the present embodiment, the photoelectric conversion film 112 of PD1 and the pixel transistor of PD1 can be disposed closer to each other as compared with the case where the pixel transistor is provided in the semiconductor substrate 300, and by forming the drive wires 122a, 122b, 122f, 122s, and 122r using a low resistance wiring material, the drive speed of the pixel transistor and the storage electrodes 114a and 114b and the transfer speed of the charges generated in the photoelectric conversion film 112 can be improved.

In addition, according to the present embodiment, by increasing the wiring width of the signal wire 124vs and the power supply wire 124vd, a time until the signal transmitted through the signal wire 124vs to be a part of the signal line $V_{SL}$ becomes stable (settling period) can be shortened, and the pixel signals can be efficiently transmitted.

Further, in the present embodiment, by providing the shield electrodes 108 and 134, it is possible to suppress a leakage from a pixel transistor with another pixel 100 not surrounded by the same shield electrodes 108 and 134. Further, according to the present embodiment, the storage electrodes 114a, 114b, 214a, and 214b are provided so as to be symmetrical, so that the photoelectric conversion films 112 and 212 can detect light with optical symmetry with respect to incident light.

<2.6 Modification>

In the first embodiment described above, the pixel transistor (amplification transistor $TR_{amp}$, reset transistor $TR_{rst}$, selection transistor $TR_{sel}$) of PD2 is provided in the semiconductor substrate 300. However, in the present embodiment, the pixel transistor of PD2 is not limited to being provided in the semiconductor substrate 300. Similarly to PD1, the pixel transistor may be formed by the oxide semiconductor layer (not illustrated) provided above the semiconductor substrate 300 and the multilayer wiring layer (not illustrated) provided below the oxide semiconductor layer. That is, in the present modification, the pixel transistor of PD2 is configured by the multi-layer wiring layer provided below the lower electrode 216 of PD2 and the oxide semiconductor layer provided below the multi-layer wiring layer. According to the present modification, by the above configuration, the region in which the PD3 can be formed in the semiconductor substrate 300 can be expanded, so that the light incident on the pixel 100 can be efficiently used by the PD3, and the characteristics of PD3 can be improved.

3. SECOND EMBODIMENT

Further, in an embodiment of the present disclosure, positions of PD1 and a multi-layer wiring layer 120 in a stacked structure of a pixel 100 in the first embodiment described above may be reversed in the up-down direction. Hereinafter, a second embodiment of the present disclosure in which the positions of PD1 and the multi-layer wiring layer 120 are reversed from those of the first embodiment will be described.

Figure 15:
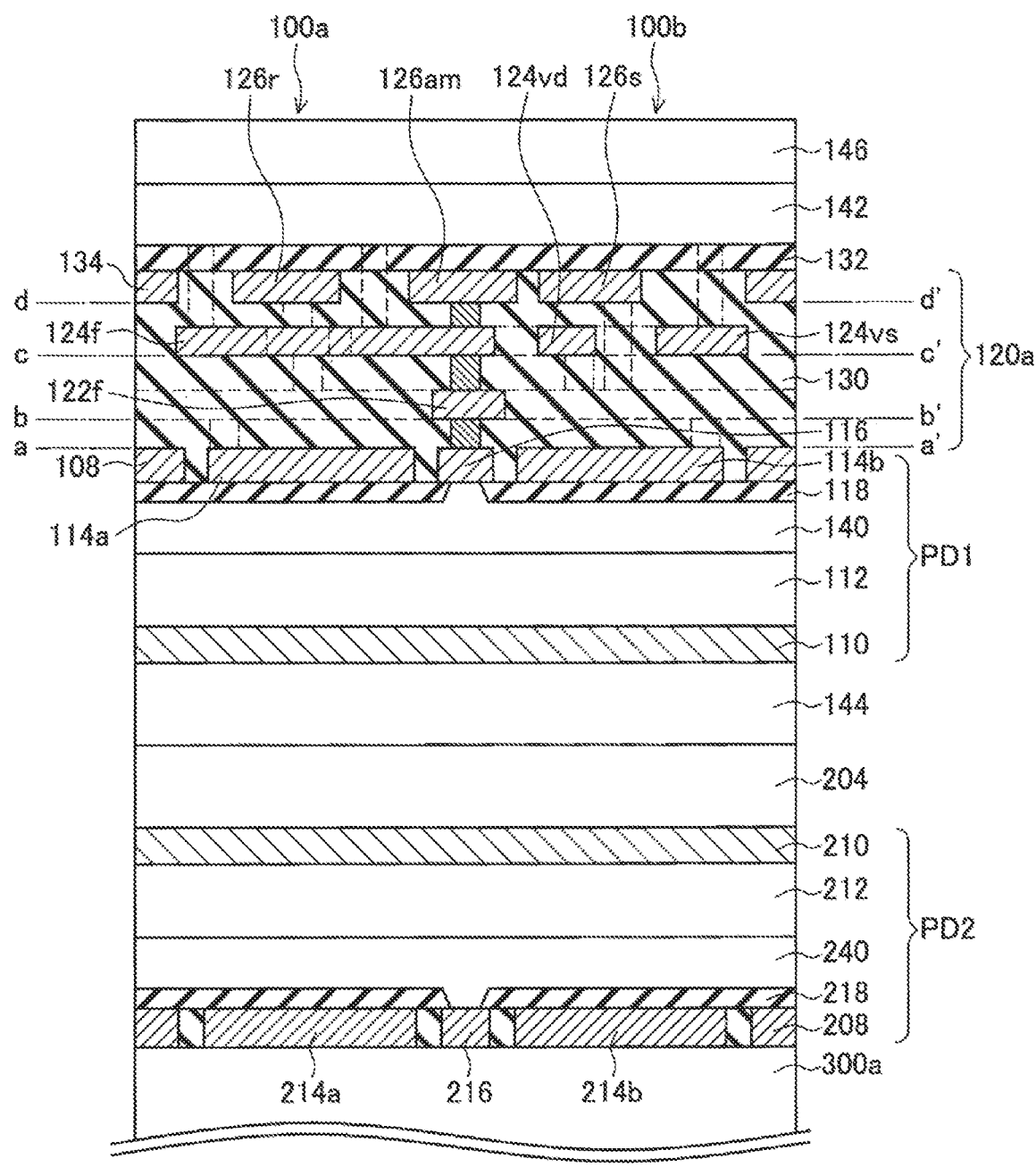
FIG. 15 illustrates a part of a cross-sectional view of a pixel 100 according to a second embodiment of the present disclosure.

As described above, in the second embodiment, upper electrodes 110 and 210 and lower electrodes 116 and 216 of PD1 and PD2 are not defined according to positions in a stacked structure in the pixel 100 illustrated in FIG. 15, and electrodes having the same functions as the upper electrodes 110 and 210 in the first embodiment are referred to as the upper electrodes 110 and 210, and electrodes having the same functions as the lower electrodes 116 and 216 in the first embodiment are referred to as the lower electrodes 116 and 216.

<3.1 Detailed Configuration of Multi-Layer Wiring Layer>

First, the detailed configurations of PD1 and a multi-layer wiring layer 120a according to the present embodiment will be described with reference to FIG. 15. FIG. 15 illustrates a part of a cross-sectional view of the pixel 100 according to the present embodiment and corresponds to a part of the cross-sectional view of the pixel 100 according to the first embodiment illustrated in FIG. 7. Note that a cross-section when the pixel 100 is cut along the line a-a' of FIG. 15 corresponds to the cross-sectional view of the pixel 100 according to the first embodiment of FIG. 8, and a cross-section when the pixel 100 is cut along the line b-b' of FIG. 15 corresponds to the cross-sectional view of the pixel 100 according to the first embodiment of FIG. 9. Further, a cross-section when the pixel 100 is cut along the line c-c' of FIG. 15 corresponds to the cross-sectional view of the pixel 100 according to the first embodiment of FIG. 10, and a cross-section when the pixel 100 is cut along the line d-d' of FIG. 15 corresponds to the cross-sectional view of the pixel 100 according to the first embodiment of FIG. 11.

As illustrated in FIG. 15, similarly to the pixel 100 according to the first embodiment illustrated in FIG. 7, the pixel 100 according to the present embodiment has a lower electrode 216, a storage electrode 214, a shield electrode 208, a photoelectric conversion film 212, and an upper electrode 210 provided as PD2. Further, in the present embodiment, a sealing film (second sealing film) 204 is provided above the upper electrode 210.

Further, the present embodiment is different from the first embodiment in that a sealing film (first sealing film) 144, an upper electrode 110, a photoelectric conversion film 112, an oxide semiconductor layer 140, and an insulating film 118 are sequentially stacked above the sealing film 204, as illustrated in FIG. 15. Note that the upper electrode 110, the photoelectric conversion film 112, the oxide semiconductor layer 140, and the insulating film 118 configures a part of PD1 according to the present embodiment.

Further, in the present embodiment, the lower electrode 116, the storage electrode 114, and the shield electrode 108 are provided above the insulating film 118. Since the cross-section taken along the line a-a' of FIG. 15 is the same as the cross-sectional view of the pixel 100 according to the first embodiment illustrated in FIG. 8 as described above, the detailed description will be omitted here.

Further, in the present embodiment, the multi-layer wiring layer 120a is provided above the lower electrode 116, the storage electrode 114, and the shield electrode 108. That is, PD1 is provided between the multi-layer wiring layer 120a and the semiconductor substrate 300a in the stacked structure of the pixel 100. The multi-layer wiring layer 120a according to the present embodiment will be described below. In the following description, for easy understanding and for comparison with the multi-layer wiring layer 120 according to the first embodiment, the stacked structure will be described from the lower side to the upper side of the multi-layer wiring layer 120.

First, in the present embodiment, as illustrated in FIG. 15, drive wires 122 (specifically, drive wires 122a, 122b, 122f, 122s, and 122r) are provided above the lower electrode 116, the storage electrode 114, and the shield electrode 108 with an insulating film 130 interposed therebetween. Since the cross-section taken along the line b-b' of FIG. 15 is the same as the cross-sectional view of the pixel 100 according to the first embodiment illustrated in FIG. 9 as described above, the detailed description will be omitted here.

In addition, in the present embodiment, as illustrated in FIG. 15, wires 124 (specifically, drive wires 124f, 124r, and 124s, a power supply wire 124vd, and a signal wire 124vs) are provided above the drive wires 122 with the insulating film 130 interposed therebetween. Since the cross-section taken along the line c-c' of FIG. 15 is the same as the cross-sectional view of the pixel 100 according to the first embodiment illustrated in FIG. 10 as described above, the detailed description will be omitted here.

Further, in the present embodiment, as illustrated in FIG. 15, gate electrodes 126 (specifically, gate electrodes 126r, 126am, and 126s) are provided above the wire 124 with the insulating film 130 interposed therebetween. Since the cross-section taken along the line d-d' of FIG. 15 is the same as the cross-sectional view of the pixel 100 according to the first embodiment illustrated in FIG. 11 as described above, the detailed description will be omitted here.

Further, in the present embodiment, as illustrated in FIG. 15, the oxide semiconductor layer 142 is provided above the gate electrode 126 with an insulating film 132 interposed therebetween. The oxide semiconductor layer 142 can function as a channel formation region (a portion facing each gate electrode 126) or a source/drain region (a portion connected to each drive wire 124 or the like) common to pixel transistors connected to PD1 (for example, an amplification transistor $TR_{amp}$, a transfer transistor $TR_{trs}$, a reset transistor $TR_{rst}$, and a selection transistor $TR_{sel}$). Further, in the present embodiment, an insulating film 146 is provided above the oxide semiconductor layer 142.

That is, in the present embodiment, positions of PD1 and the multi-layer wiring layer 120 in the stacked structure of the pixel 100 may be reversed in the up-down direction as compared with the first embodiment described above. Further, in the present embodiment, the order of structures in the multi-layer wiring layer 120a may be reversed as compared with the first embodiment described above. However, even in the present embodiment, similarly to the first embodiment, it is possible to provide the pixel 100 with the pixel transistors (the amplification transistor $TR_{amp}$, the selection transistor $TR_{sel}$, and the reset transistor $TR_{rst}$) and the wires capable of efficiently outputting and transferring a pixel signal by the charges generated in the photoelectric conversion film 112 while suppressing an increase in manufacturing cost.

Specifically, even in the present embodiment, the channel formation regions and the like of the pixel transistors (the amplification transistor $TR_{amp}$, the selection transistor $TR_{sel}$, and the reset transistor $TR_{rst}$) connected to PD1 are configured by the oxide semiconductor layer 142 capable of transmitting light, so that these can be stacked above PD2 and PD3. Further, also in the present embodiment, by providing the drive wires 122a and 122b for driving the storage electrodes 114a and 114b and the drive wires 122r and 122s for driving the reset transistor $TR_{rst}$ and the like in the same layer, the number of layers in the stacked structure of the pixel 100 can be reduced. As a result, according to the present embodiment, it is possible to suppress an increase in the manufacturing cost of the solid-state imaging device 1 including the pixels 100. In addition, in the present embodiment, the photoelectric conversion film 112 of PD1 and the pixel transistor of PD1 can be disposed closer to each other as compared with the case where the pixel transistor is provided in the semiconductor substrate 300, and by forming the drive wires 122a, 122b, 122f, 122s, and 122r using a low resistance wiring material, the drive speed of the pixel transistor and the storage electrodes 114a and 114b and the transfer speed of the charges generated in the photoelectric conversion film 112 can be improved.

<3.2 Manufacturing Method>

Figure 16:
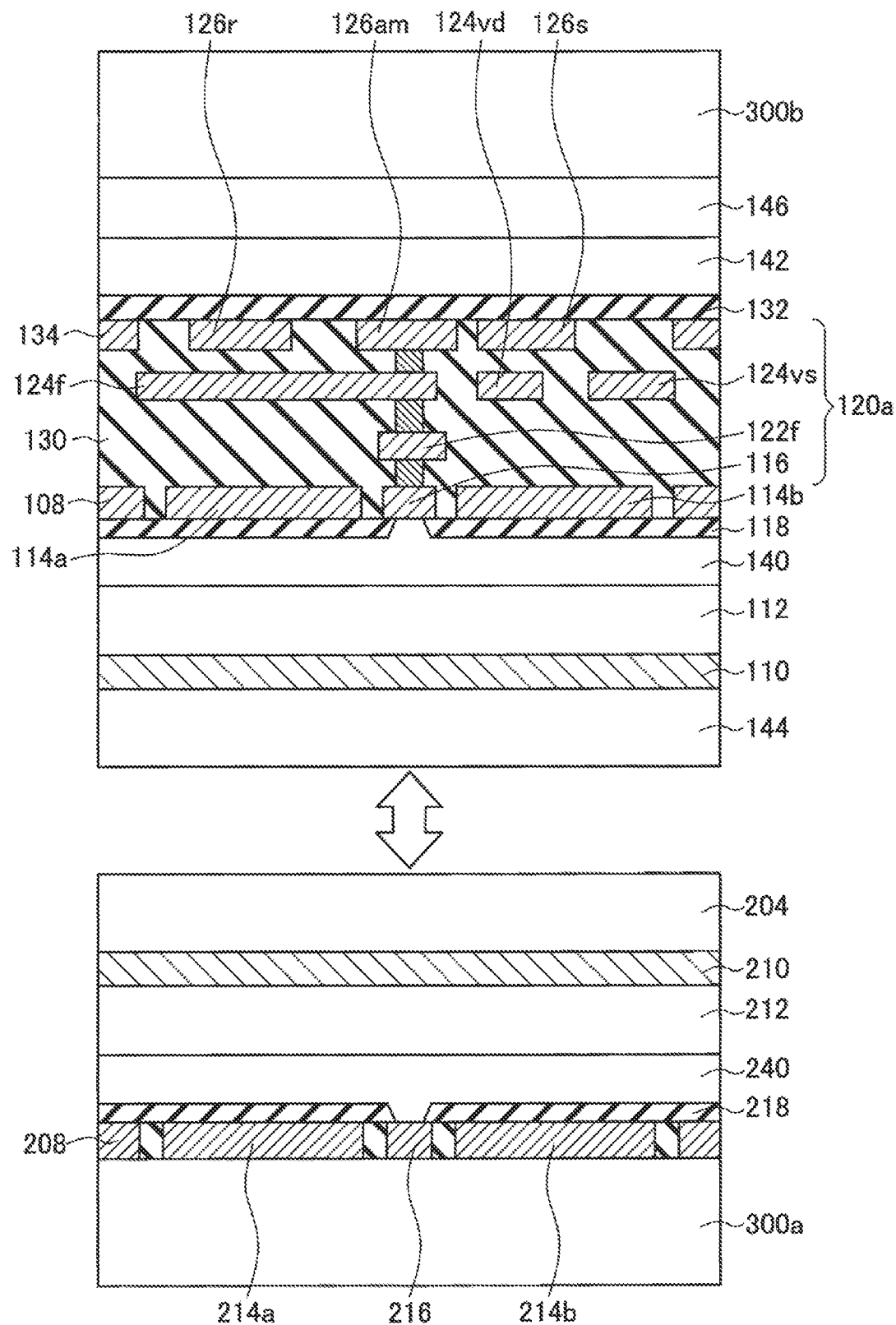
FIG. 16 is a cross-sectional view for explaining a step of manufacturing the pixel 100 according to the second embodiment of the present disclosure.

Next, a method for manufacturing the pixel 100 according to the second embodiment of the present disclosure illustrated in FIG. 15 will be described with reference to FIG. 16. FIG. 16 is a cross-sectional view for explaining the method for manufacturing the pixel 100 according to the second embodiment of the present disclosure.

First, similarly to the first embodiment, an SOI substrate (not illustrated), a supporting substrate (not illustrated), and the like are used to prepare the semiconductor substrate 300a on which PD2 and PD3 and corresponding pixel transistors, wires, through electrodes, and the like are formed. Further, the sealing film 204 is formed on the upper electrode 210 provided on the semiconductor substrate 300a. In this way, the semiconductor substrate 300a illustrated on the lower side of FIG. 16 can be obtained.

Next, an insulating film 146, an oxide semiconductor layer 142, and an insulating film 132 are sequentially stacked on another semiconductor substrate 300b (for example, an SOI substrate). Next, the gate electrode 126, the wire 124, the drive wire 122, the lower electrode 116, the storage electrode 114, and the shield electrode 108 are formed on the insulating film 132. Further, the insulating film 118, the oxide semiconductor layer 140, the photoelectric conversion film 112, the upper electrode 110, and the sealing film 144 are sequentially stacked on the lower electrode 116, the storage electrode 114, and the shield electrode 108. In this way, the semiconductor substrate 300b illustrated on the upper side of FIG. 16 can be obtained. Since the details of the formation of each layer are the same as those in the first embodiment, the description will be omitted here.

Further, as illustrated in FIG. 16, the semiconductor substrate 300a and the semiconductor substrate 300b are bonded so that the sealing film 204 and the sealing film 144 face each other. Note that, at the time of bonding, plasma treatment may be performed on top surfaces of the sealing films 204 and 144, or a thin silicon oxide film may be stacked on the sealing films 204 and 144 and heated. Further, by removing the semiconductor substrate 300b, the pixel 100 according to the present embodiment illustrated in FIG. 15 can be obtained.

Incidentally, the photoelectric conversion films 112 and 212 are generally formed of a material susceptible to heat. Therefore, in the present embodiment, the number of layers stacked on the photoelectric conversion films 112 and 212 can be further reduced by using the bonding between the two semiconductor substrates 300a and 300b. As a result, according to the present embodiment, since the number of times heat is applied to the photoelectric conversion films 112 and 212 when various layers are formed can be reduced, the photoelectric conversion films 112 and 212 can be avoided from being deteriorated by heat.

4. THIRD EMBODIMENT

Figure 17:
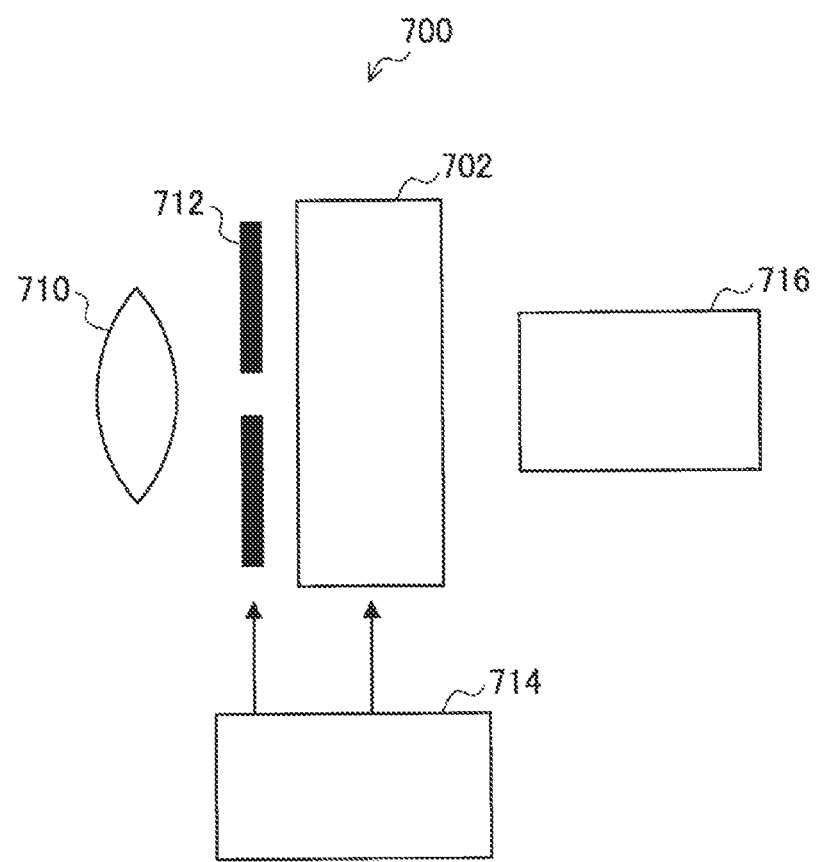
FIG. 17 is an explanatory diagram illustrating an example of an electronic apparatus including an imaging device having a solid-state imaging device 1 according to an embodiment of the present disclosure.

The solid-state imaging device 1 according to the embodiment of the present disclosure described above is generally applicable to electronic apparatuses using a solid-state imaging element for an image reading unit, such as an imaging device such as a digital still camera or a video camera, a mobile terminal device having an imaging function, and a copying machine using a solid-state imaging element for an image reading unit. Furthermore, the embodiment of the present disclosure is applicable to a robot, a drone, an automobile, a medical device (endoscope), or the like including the above-described imaging device. Note that the solid-state imaging device 1 according to the present embodiment may be formed as a single chip, and can be implemented in the form of a module having an imaging function in which an imaging unit and a signal processing unit or an optical system are packaged together. Hereinafter, an example of an electronic apparatus 700 including an imaging device 702 having the solid-state imaging device 1 according to the present embodiment will be described as a third embodiment of the present disclosure with reference to FIG. 17. FIG. 17 is an explanatory diagram illustrating an example of the electronic apparatus 700 including the imaging device 702 having the solid-state imaging device 1 according to the embodiment of the present disclosure.

As illustrated in FIG. 17, the electronic apparatus 700 has an imaging device 702, an optical lens 710, a shutter mechanism 712, a drive circuit unit 714, and a signal processing circuit unit 716. The optical lens 710 focuses image light (incident light) from the subject onto an imaging surface of the imaging device 702. This allows signal charges to be stored in the solid-state imaging device 1 of the imaging device 702 for a certain period. The shutter mechanism 712 performs opening/closing operation to control the light emission period and the light-shielding period to the imaging device 702. The drive circuit unit 714 supplies drive signals for controlling signal transfer operation of the imaging device 702, shutter operation of the shutter mechanism 712, or the like. That is, the imaging device 702 performs signal transfer on the basis of the drive signal (timing signal) supplied from the drive circuit unit 714. The signal processing circuit unit 716 performs various types of signal processing. For example, the signal processing circuit unit 716 outputs a video signal subjected to signal processing to a storage medium (not illustrated) such as a memory, or outputs the signal to a display unit (not illustrated).

5. FOURTH EMBODIMENT

5.1 Embodiment

Incidentally, in a pixel 100 according to the above-described embodiment of the present disclosure, since PD2 generally has a property of being vulnerable to moisture and oxygen, a sealing film 204 is provided on PD2 in order to protect PD2. However, because a height of the pixel 100 increases along a stacked direction (a thickness increases) by providing the sealing film 204 as described above, crosstalk to an adjacent pixel 100 due to oblique incident light may easily occur. Therefore, in order to suppress the occurrence of the crosstalk, it is conceivable to provide waveguides 402 and 404 for condensing light in an insulating film 504 and the sealing film 204 above a substrate 500 (refer to FIG. 18).

Further, in the pixel 100 according to the above-described embodiment of the present disclosure, a plurality of pixel transistors including an oxide semiconductor layer 142 and a multi-layer wiring layer 120 are provided, and drive wires 122 for driving these pixel transistors are provided. Further, the drive wire 122 is required to be multi-layered in order to secure a degree of freedom in designing the pixel transistor.

However, due to the multi-layering of the drive wire 122, similarly to the above, the height of the pixel 100 increases along the stacked direction (the thickness increases), and the crosstalk to the adjacent pixel 100 due to oblique incident light may easily occur. Therefore, in order to suppress the occurrence of such crosstalk, it is conceivable to provide a waveguide 400 for condensing light in the multi-layer wiring layer 120.

Figure 18:
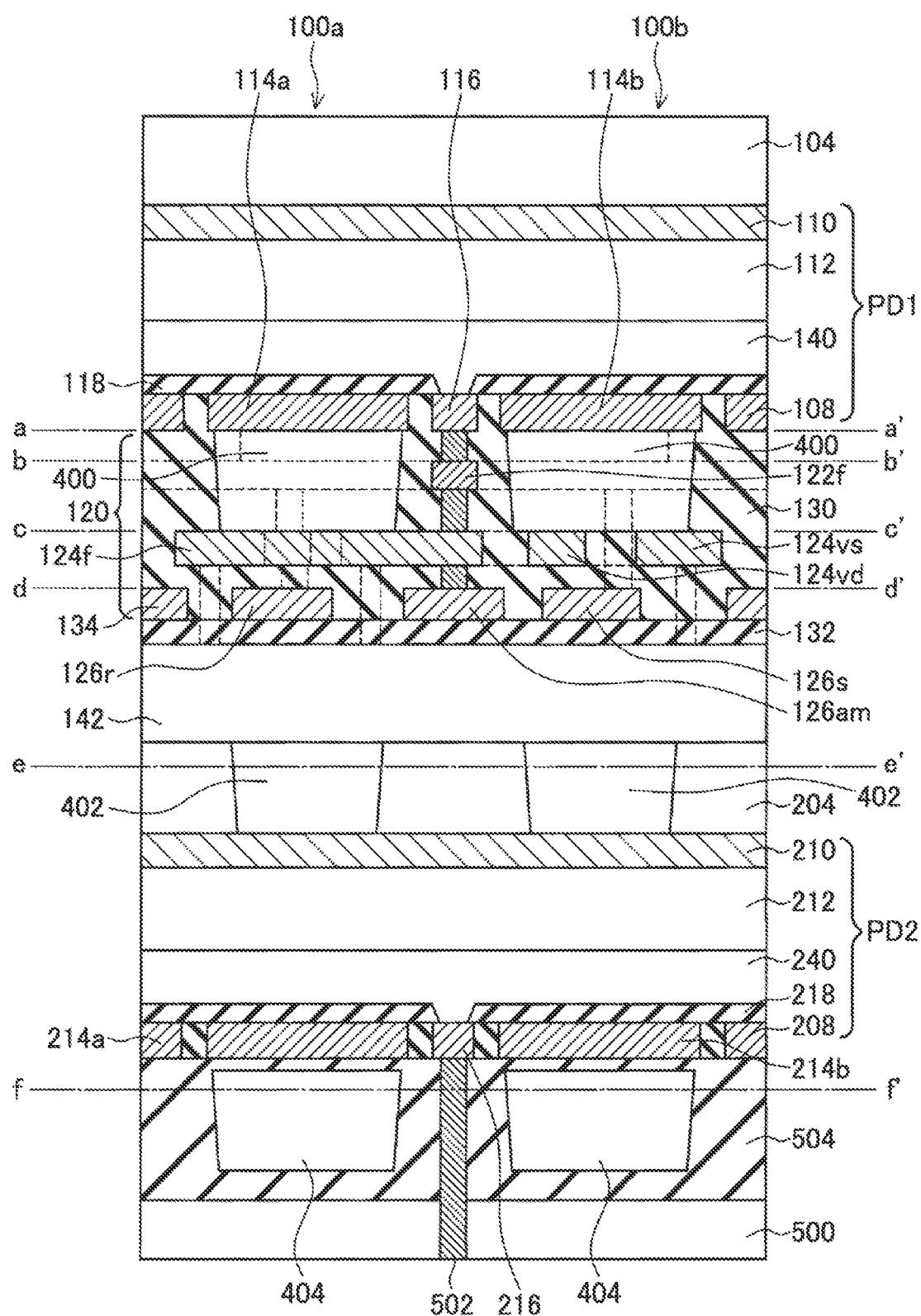
FIG. 18 illustrates a part of a cross-sectional view of a pixel 100 according to a fourth embodiment of the present disclosure.
Figure 19:
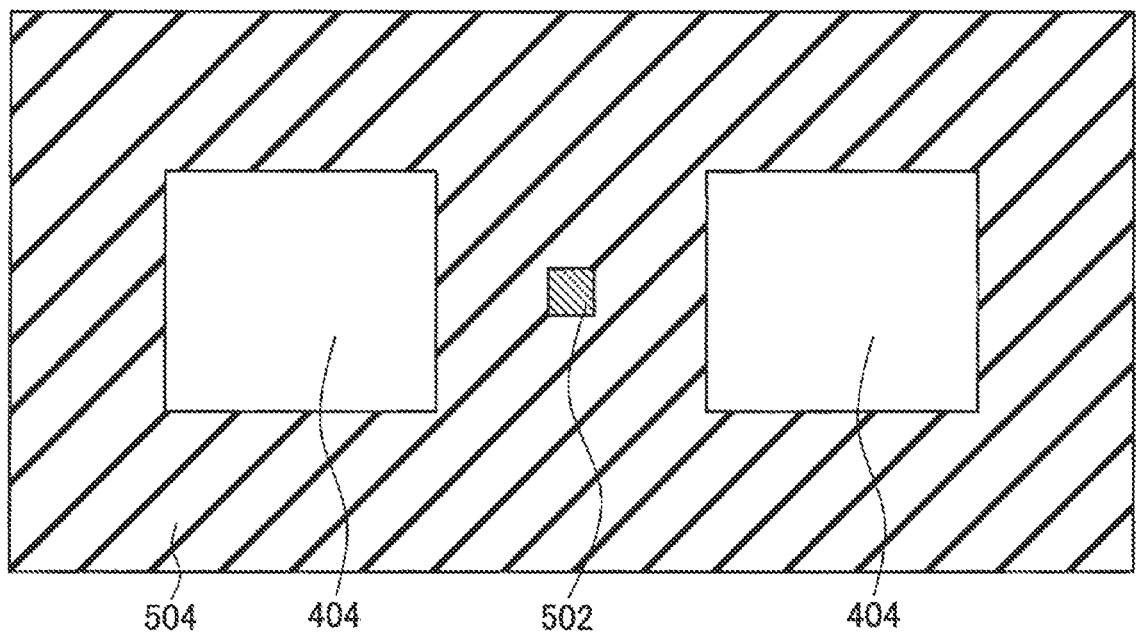
FIG. 19 is a cross-sectional view of the pixel 100 taken along the line f-f' of FIG. 18.
Figure 20:
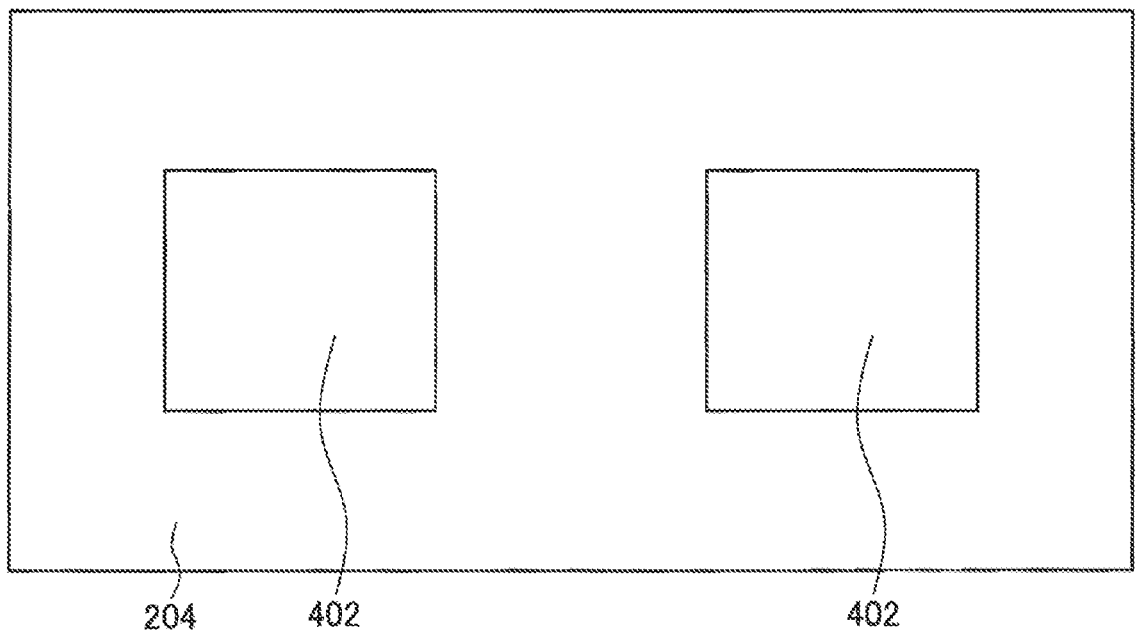
FIG. 20 is a cross-sectional view of the pixel 100 taken along the line e-e' of FIG. 18.
Figure 21:
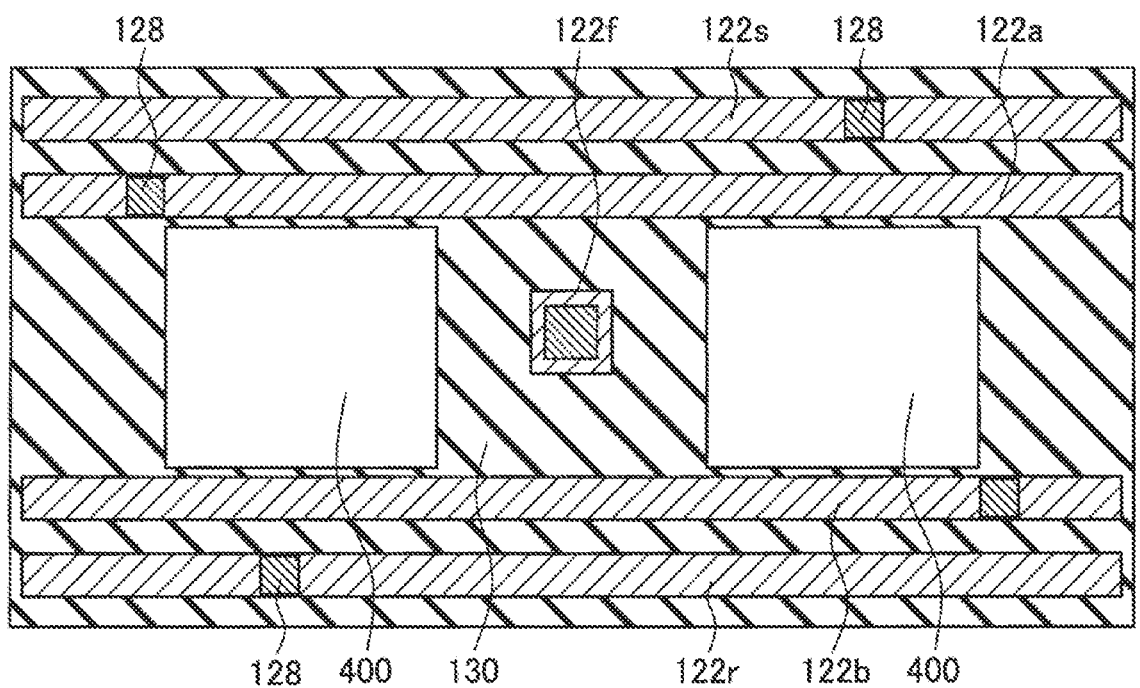
FIG. 21 is a cross-sectional view of the pixel 100 taken along the line b-b' of FIG. 18.

Therefore, a detailed configuration of stacking of a solid-state imaging device 1 according to the fourth embodiment of the present disclosure having the above-described waveguides 400, 402, and 404 will be described with reference to FIGS. 18 to 21. FIG. 18 is a part of a cross-sectional view of a pixel 100 (specifically, pixels 100a and 100b) according to the present embodiment. Specifically, FIG. 18 mainly illustrates a portion between PD2 and PD1 with the multi-layer wiring layer 120 interposed therebetween. Further, FIG. 19 is a cross-sectional view of the pixel 100 taken along the line f-f' of FIG. 18, FIG. 20 is a cross-sectional view of the pixel 100 taken along the line e-e' of FIG. 18, and FIG. 21 is a cross-sectional view of the pixel 100 taken along the line b-b' of FIG. 18. Note that, in the following description, description of points that are common to the embodiments of the present disclosure described above will be omitted, and only differences from the embodiments of the present disclosure will be described.

Specifically, in the present embodiment, as illustrated in FIGS. 18 and 19, in the pixel 100, an insulating film 504 is stacked on a semiconductor substrate 500 made of silicon or the like, and a contact 502 made of a conductive film or the like and waveguides 404 corresponding to the pixels 100a and 100b are provided in the insulating film 504. For example, as illustrated in FIG. 19, the plurality of waveguides 404 are arranged along a horizontal direction in the drawing. Further, in the present embodiment, for example, $Si_3N_4$ (refractive index of about 1.9) is preferably used as a material of the waveguide 404. In this way, light can be condensed in the waveguide 404. However, in the present embodiment, the material of the waveguide 404 is not particularly limited.

Further, in the present embodiment, as illustrated in FIGS. 18 and 20, the pixel 100 has a lower electrode 216, a storage electrode 214, a shield electrode 208, a photoelectric conversion film 212, and an upper electrode 210 provided as PD2. Further, the sealing film 204 is provided above the upper electrode 210, and the waveguides 402 are provided in the sealing film 204 so as to correspond to the pixels 100a and 100b. For example, as illustrated in FIG. 19, the plurality of waveguides 402 are arranged along a horizontal direction in the drawing. Further, in the present embodiment, for example, $Si_3N_4$ (refractive index of about 1.9) is preferably used as a material of the waveguide 402, and $Al_2O_3$ (refractive index of about 1.6) is preferably used as a material of the sealing film 204. In this way, light can be condensed in the waveguide 402. Furthermore, in the present embodiment, the materials of the sealing film 204 and the waveguide 402 are not particularly limited, but a difference between the refractive index of the material of the waveguide 402 and the refractive index of the material of the sealing film 204 is preferably about 0.2 or more. In this way, light condensing efficiency of the waveguide 402 can be further improved.

Further, as illustrated in FIG. 18, even in the present embodiment, the multi-layer wiring layer 120 including wires and electrodes is provided above the insulating film 132. Further, the lower electrode 116, the storage electrode 114, the insulating film 118, the oxide semiconductor layer 140, the photoelectric conversion film 112, and the upper electrode 110, which configure PD1, are provided above the multi-layer wiring layer 120. More specifically, the storage electrodes 114a and 114b of PD1 and the lower electrode 116 are provided directly below the insulating film 118, and the waveguide 400 is provided directly below the storage electrodes 114a and 114b. For example, as illustrated in FIG. 21, the waveguide 400 is disposed so as to be line-symmetrical on the left and right sides of the drawing with drive wire 122f interposed therebetween. Further, the waveguide 400 can also be formed of the same material as the waveguide 402. In this way, it is possible to condense light in the waveguide 402.

Since a method for manufacturing the pixel 100 according to the present embodiment is the same as the method for manufacturing the pixel 100 according to the first embodiment of the present disclosure, description thereof will be omitted here.

As described above, in the present embodiment, by providing the waveguides 400, 402, and 404 that condense light in the insulating film 504, the multi-layer wiring layer 120, and the sealing film 204, even when the height of the pixel 100 increases along the stacked direction, it is possible to suppress the occurrence of crosstalk to the adjacent pixel 100 due to the oblique incident light. The present embodiment is not limited to the case where all the waveguides 400, 402, and 404 are provided, and a part of these waveguides may be provided.

5.2 First Modification

Figure 22:
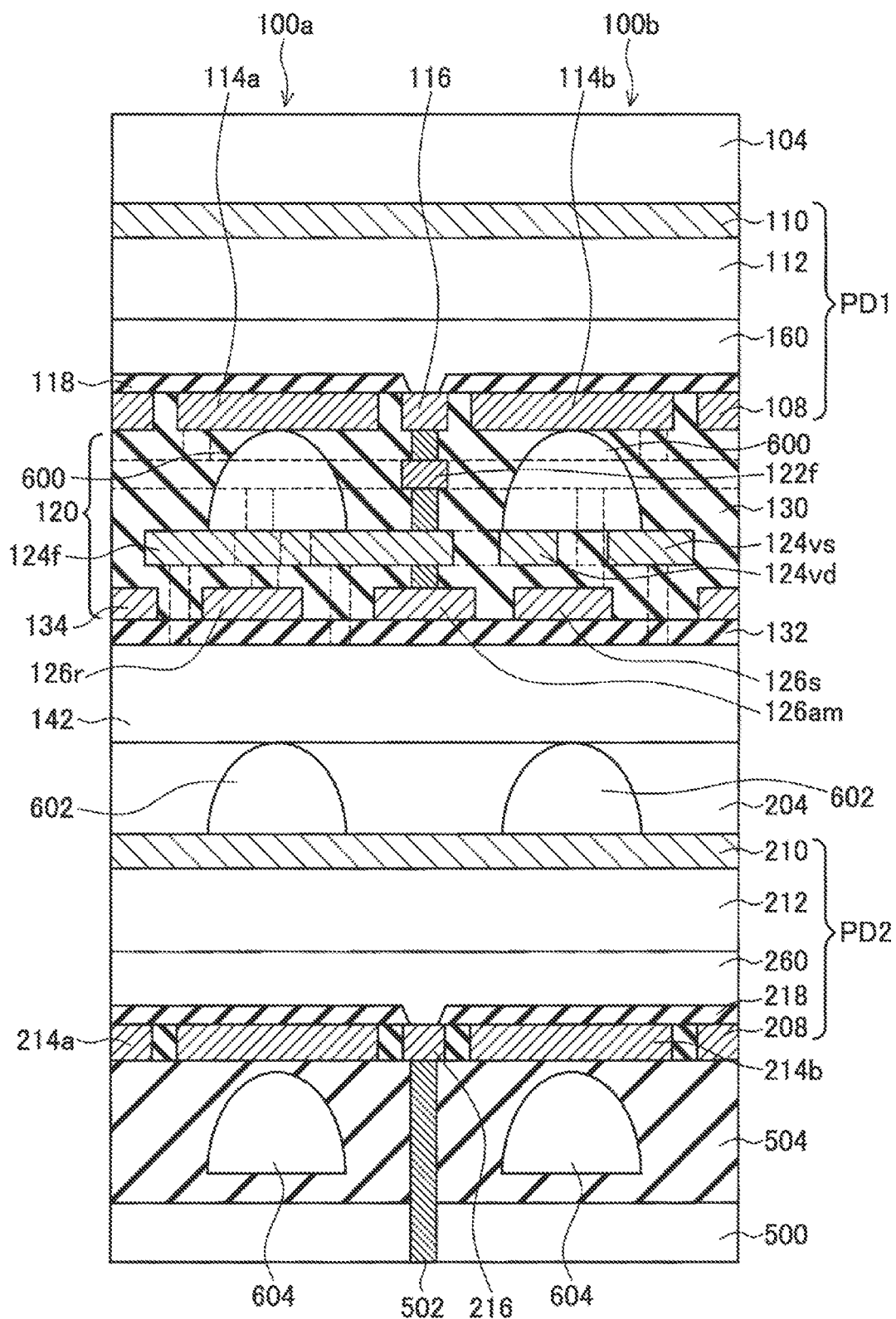
FIG. 22 illustrates a part of a cross-sectional view of a pixel 100 according to a first modification of the fourth embodiment of the present disclosure.

Note that the present embodiment is not limited to providing the waveguides 400, 402, and 404 illustrated in FIGS. 18 to 21, and instead of the waveguides 400, 402, and 404, inner lenses 600, 602, and 604 may be used. The corresponding modification will be described as a first modification of the present embodiment using FIG. 22. FIG. 22 illustrates a part of a cross-sectional view of the pixel 100 according to the first modification of the present embodiment.

As illustrated in FIG. 22, in the present modification, the inner lenses 600, 602, and 604 that condense light are provided in the insulating film 504, the multi-layer wiring layer 120, and the sealing film 204. In this way, according to the present modification, even when the height of the pixel 100 increases along the stacked direction, it is possible to suppress the occurrence of crosstalk to the adjacent pixel 100 due to the oblique incident light. The present modification is not limited to the case where all the inner lenses 600, 602, and 604 are provided, and a part of these inner lenses may be provided.

5.3 Second Modification

Figure 23:
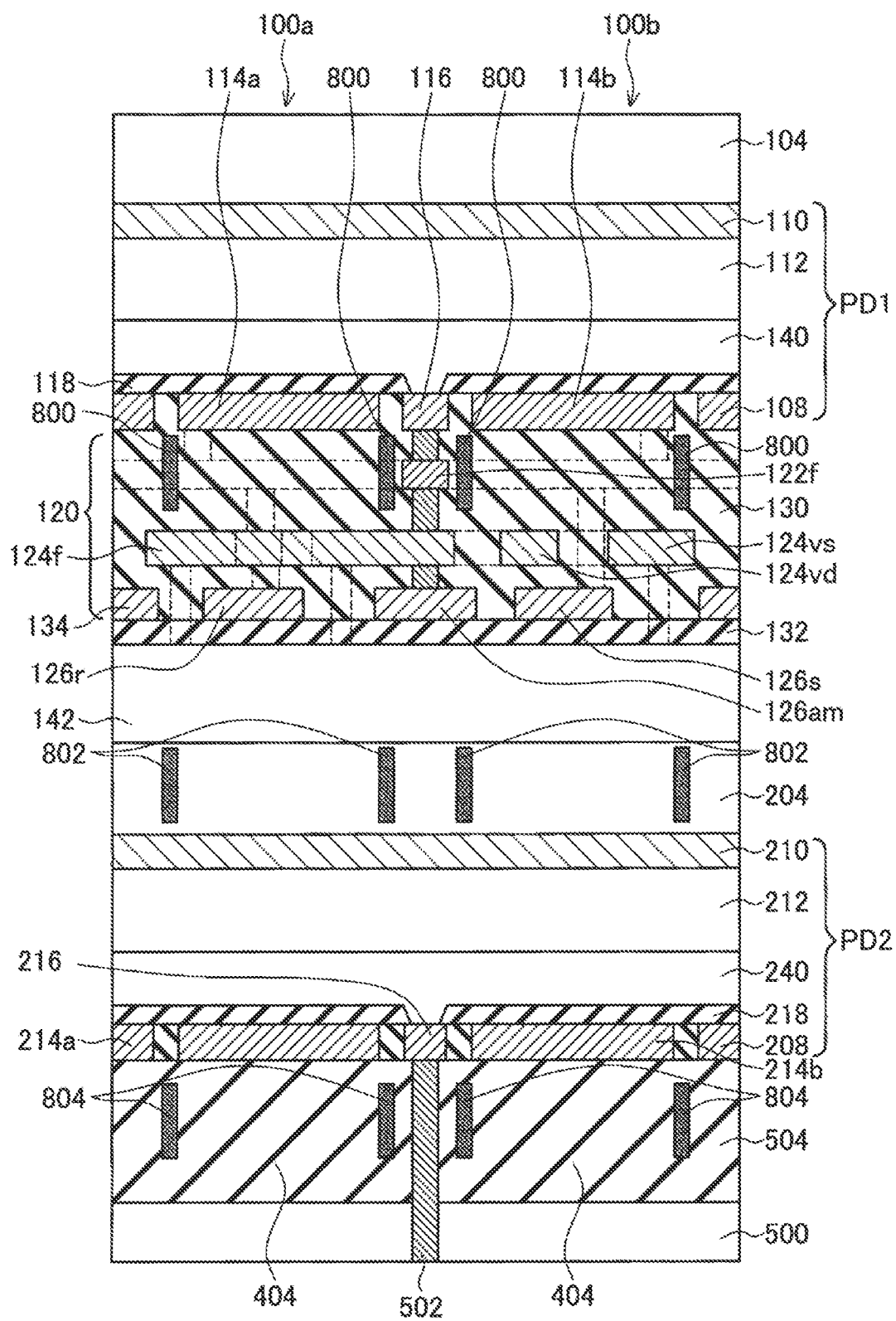
FIG. 23 illustrates a part of a cross-sectional view of a pixel 100 according to a second modification of the fourth embodiment of the present disclosure.

Further, the present embodiment described above is not limited to providing the waveguides 400, 402, 404 as illustrated in FIG. 18 to FIG. 21, but instead of the waveguides 400, 402, 404, barriers 800, 802, and 804 may be used. The corresponding modification will be described as a second modification of the present embodiment using FIG. 23. FIG. 23 illustrates a part of a cross-sectional view of the pixel 100 according to the second modification of the present embodiment.

As illustrated in FIG. 23, in the present modification, the barriers 800, 802, and 804 are provided in the insulating film 504, the multi-layer wiring layer 120, and the sealing film 204. For example, when $Al_2O_3$ (refractive index of about 1.6) is used as the material of the sealing film 204 or the insulating film 504, the partition walls 800, 802, and 804 are preferably formed of SiO$_2$ (refractive index of about 1.4). In this way, light can be condensed. Furthermore, in the present modification, the material of the partition walls 800, 802, and 804 is not particularly limited, but a difference between the refractive index of the material of the partition walls 800, 802, and 804 and the refractive index of the material of the sealing film 204 or the insulating film 504 is preferably about 0.2 or more. In this way, light condensing efficiency can be further improved. Further, as the material of the partition walls 800, 802, and 804, a metal material (Al, W, Ti, TiN, TiAl, Cu, Ta, TaN, Co, Ru, etc., or a material containing these elements) may be used. In this way, according to the present modification, even when the height of the pixel 100 increases along the stacked direction, it is possible to suppress the occurrence of crosstalk to the adjacent pixel 100 due to the oblique incident light. The present modification is not limited to the case where all the barriers 800, 802, and 804 are provided, and a part of the barriers 800, 802, and 804 may be provided.

Furthermore, in the present disclosure, the present embodiment and the first and second modifications may be implemented in combination with each other. Further, in the present disclosure, the positions where the waveguides, the inner lenses, and the barriers are provided are not limited to the above-described positions, and the waveguides, the inner lenses, and the barriers may be provided at other positions.

6. APPLICATION TO ENDOSCOPIC SURGERY SYSTEM

Technology (present technology) according to the present disclosure can be applied to various products. For example, the technology according to the present disclosure may be applied to an endoscopic surgery system.

Figure 24:
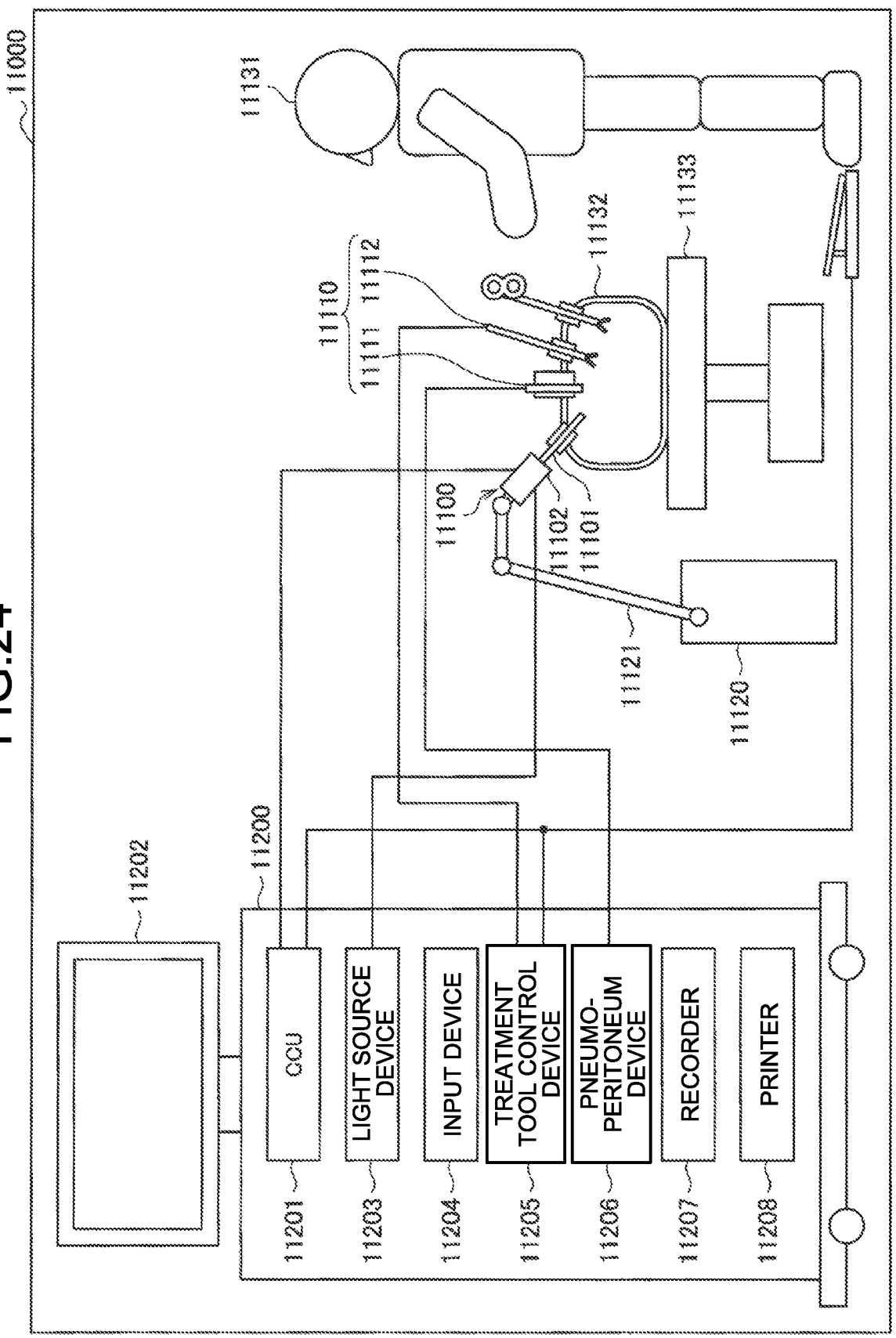
FIG. 24 is a diagram illustrating an example of a schematic configuration of an endoscopic surgery system.

FIG. 24 is a diagram illustrating an example of a schematic configuration of the endoscopic surgery system to which the technology (present technology) according to the present disclosure can be applied.

FIG. 24 illustrates an aspect where an operator (doctor) 11131 performs an operation on a patient 11132 on a patient bed 11133 using an endoscopic surgery system 11000. As illustrated in the drawing, the endoscopic surgery system 11000 includes an endoscope 11100, other surgical tools 11110 such as a pneumoperitoneum tube 11111 and an energy treatment tool 11112, a support arm device 11120 for supporting the endoscope 11100, and a cart 11200 equipped with various devices for endoscopic surgery.

The endoscope 11100 includes a lens barrel 11101 having a region of a predetermined length from a tip inserted into a body cavity of the patient 11132, and a camera head 11102 connected to a base end of the lens barrel 11101. In the illustrated example, the endoscope 11100 configured as a so-called hard mirror having the hard lens barrel 11101 is illustrated. However, the endoscope 11100 may be configured as a so-called soft mirror having a soft lens barrel.

An opening into which an objective lens is fit is provided at the tip of the lens barrel 11101. A light source device 11203 is connected to the endoscope 11100, and light generated by the light source device 11203 is guided to the tip of the lens barrel by a light guide extending inside the lens barrel 11101 and is directed toward an observation target in the body cavity of the patient 11132 through the objective lens. Note that the endoscope 11100 may be a direct-view endoscope, a perspective-view endoscope, or a side-view endoscope.

An optical system and an imaging element are provided inside a camera head 11102, and reflected light (observation light) from the observation target is condensed on the imaging element by the optical system. The observation light is photoelectrically converted by the imaging element, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), etc., and controls operations of the endoscope 11100 and a display device 11202 in an integrated manner. Further, the CCU 11201 receives the image signal from the camera head 11102, and performs various types of image processing for displaying an image based on the image signal, such as development processing (demosaic processing), on the image signal.

The display device 11202 displays an image based on the image signal subjected to image processing by the CCU 11201 under the control of the CCU 11201.

The light source device 11203 includes, for example, a light source such as a light emitting diode (LED), and supplies the endoscope 11100 with irradiation light when the surgical site or the like is imaged.

An input device 11204 is an input interface to the endoscopic surgery system 11000. The user can input various types of information and input instructions to the endoscopic surgery system 11000 via the input device 11204. For example, the user inputs an instruction or the like to change imaging conditions (type of irradiation light, magnification, focal length, etc.) by the endoscope 11100.

A treatment tool control device 11205 controls driving of the energy treatment tool 11112 for cauterization and incision of tissue, sealing of a blood vessel, etc. A pneumoperitoneum device 11206 sends gas into the body cavity via the pneumoperitoneum tube 11111 to inflate the body cavity of the patient 11132 in order to ensure a visual field by the endoscope 11100 and ensure a working space of the operator. A recorder 11207 is a device that can record various types of information related to surgery. A printer 11208 is a device capable of printing various types of information related to surgery in various formats such as a text, an image, and a graph.

The light source device 11203 that supplies the endoscope 11100 with irradiation light when the surgical site is imaged can be configured by, for example, a white light source configured by an LED, a laser light source, or a combination thereof. When the white light source is configured by a combination of RGB laser light sources, the output intensity and output timing of each color (each wavelength) can be controlled with high accuracy, so that white balance of a captured image can be adjusted in the light source device 11203. In this case, the laser light from each of the RGB laser light sources is emitted to the observation target in a time-division manner, and the driving of the imaging element of the camera head 11102 is controlled in synchronization with the irradiation timing. As a result, an image corresponding to each of RGB can be captured in a time-division manner. According to this method, a color image can be obtained without providing a color filter in the imaging element.

In addition, driving of the light source device 11203 may be controlled to change the intensity of light to be output at predetermined time intervals. By controlling driving of the imaging element of the camera head 11102 in synchronization with the timing of the change of the light intensity to acquire an image in a time-division manner, and combining the image, it is possible to generate an image in a high dynamic range without so-called underexposure and overexposure.

Further, the light source device 11203 may be configured to be able to supply light in a predetermined wavelength band corresponding to special light observation. In the special light observation, for example, wavelength dependence of light absorption in body tissue is used to irradiate light in a narrower band than that of irradiation light during normal observation (that is, white light), thereby performing so-called narrow band imaging for imaging predetermined tissue such as a blood vessel on a mucosal surface at high contrast. Alternatively, in the special light observation, fluorescence observation for obtaining an image by fluorescence generated by irradiating excitation light may be performed. In the fluorescence observation, body tissue may be irradiated with excitation light and fluorescence from the body tissue may be observed (autofluorescence observation), or a reagent such as indocyanine green (ICG) may be locally injected into the body tissue and the body tissue may be irradiated with excitation light corresponding to a fluorescence wavelength of the reagent to obtain a fluorescence image. The light source device 11203 can be configured to be able to supply narrowband light and/or excitation light corresponding to the special light observation.

Figure 25:
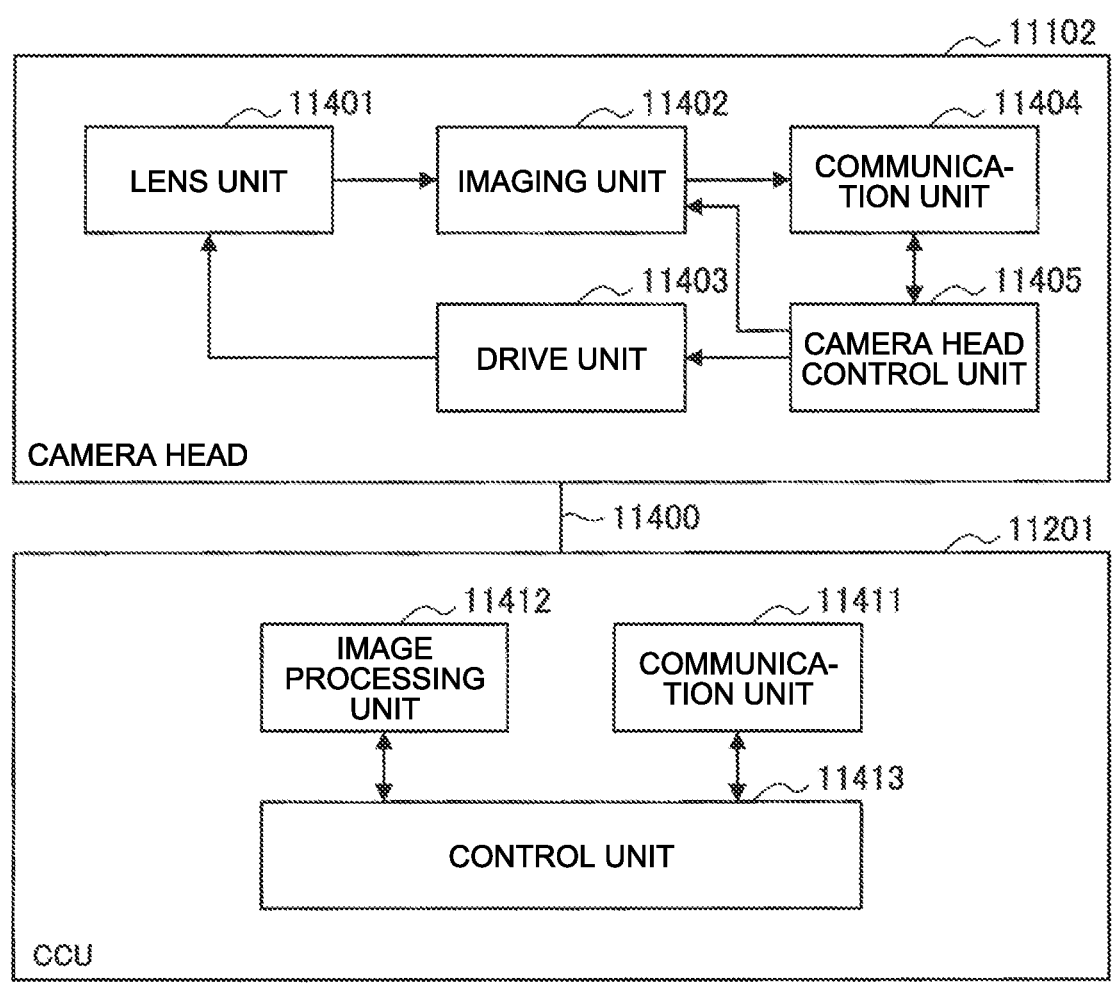
FIG. 25 is a block diagram illustrating an example of a functional configuration of a camera head and a CCU.

FIG. 25 is a block diagram illustrating an example of a functional configuration of the camera head 11102 and the CCU 11201 illustrated in FIG. 24.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicably connected by a transmission cable 11400.

The lens unit 11401 is an optical system provided at a portion connected to the lens barrel 11101. Observation light taken in from the tip of the lens barrel 11101 is guided to the camera head 11102 and is incident on the lens unit 11401. The lens unit 11401 is configured by combining a plurality of lenses including a zoom lens and a focus lens.

The imaging unit 11402 is composed of an imaging element. The number of imaging elements configuring the imaging unit 11402 may be one (so-called single-plate type) or plural (so-called multi-plate type). When the imaging unit 11402 is configured by the multi-plate type, for example, image signals corresponding to RGB are generated by each imaging element, and a color image may be obtained by synthesizing the image signals. Alternatively, the imaging unit 11402 may be configured to have a pair of imaging elements for respectively acquiring the image signals for the right eye and the left eye corresponding to 3D (Dimensional) display. The 3D display is performed, so that the operator 11131 can more accurately grasp a depth of biological tissue at a surgical site. When the imaging unit 11402 is configured by the multi-plate type, a plurality of lens units 11401 are provided for respective imaging elements.

Further, the imaging unit 11402 may not be provided in the camera head 11102. For example, the imaging unit 11402 may be provided inside the lens barrel 11101 immediately after the objective lens.

The drive unit 11403 is configured by an actuator, and moves the zoom lens and the focus lens of the lens unit 11401 by a predetermined distance along the optical axis under the control of the camera head control unit 11405. In this way, the magnification and the focus of the image captured by the imaging unit 11402 can be appropriately adjusted.

The communication unit 11404 is configured by a communication device for transmitting and receiving various types of information to and from the CCU 11201. The communication unit 11404 transmits the image signal obtained from the imaging unit 11402 as RAW data to the CCU 11201 via the transmission cable 11400.

Further, the communication unit 11404 receives a control signal for controlling the driving of the camera head 11102 from the CCU 11201, and supplies it to the camera head control unit 11405. The control signal includes, for example, information related to the imaging conditions such as information for specifying a frame rate of the captured image, information for specifying an exposure value at the time of imaging, and/or information for specifying the magnification and focus of the captured image.

The imaging conditions such as the frame rate, the exposure value, the magnification, and the focus may be appropriately specified by the user, or may be automatically set by the control unit 11413 of the CCU 11201 on the basis of the acquired image signal. In the case of the latter, the endoscope 11100 has a so-called auto exposure (AE) function, auto focus (AF) function, and auto white balance (AWB) function.

The camera head control unit 11405 controls driving of the camera head 11102, on the basis of a control signal from the CCU 11201 received via the communication unit 11404.

The communication unit 11411 is configured by a communication device for transmitting and receiving various types of information to and from the camera head 11102. The communication unit 11411 receives an image signal transmitted from the camera head 11102 via the transmission cable 11400.

Further, the communication unit 11411 transmits a control signal for controlling driving of the camera head 11102 to the camera head 11102. The image signal and the control signal can be transmitted by electric communication, optical communication, or the like.

The image processing unit 11412 performs various types of image processing on an image signal corresponding to RAW data transmitted from the camera head 11102.

The control unit 11413 performs various controls regarding imaging of a surgical site or the like by the endoscope 11100 and display of a captured image obtained by imaging the surgical site or the like. For example, the control unit 11413 generates a control signal for controlling driving of the camera head 11102.

Further, the control unit 11413 causes the display device 11202 to display a captured image of the surgical site or the like, on the basis of an image signal subjected to image processing by the image processing unit 11412. At this time, the control unit 11413 may recognize various objects in the captured image using various image recognition technologies. For example, the control unit 11413 can recognize a surgical tool such as forceps, a specific living body part, bleeding, mist at the time of using the energy treatment tool 11112, etc. by detecting a shape, a color, etc. of an edge of an object included in the captured image. When the captured image is displayed on the display device 11202, the control unit 11413 may use a recognition result to display various types of operation support information on the image of the surgical site in a superimposed manner. By displaying the operation support information in a superimposed manner and presenting it to the operator 11131, the burden on the operator 11131 can be reduced, and the operator 11131 can reliably perform the operation.

The transmission cable 11400 connecting the camera head 11102 and the CCU 11201 to each other is an electric signal cable corresponding to electric signal communication, an optical fiber corresponding to optical communication, or a composite cable thereof.

Here, in the illustrated example, communication is performed by wire using the transmission cable 11400. However, communication between the camera head 11102 and the CCU 11201 may be performed wirelessly.

An example of the endoscopic surgery system to which the technology according to the present disclosure can be applied has been described above. The technology according to the present disclosure can be applied to, for example, the imaging unit 11402 of the camera head 11102 among the configurations described above.

Although the endoscopic surgery system has been described here as an example, the technology according to the present disclosure may be applied to, for example, a microscopic surgery system or the like.

7. APPLICATION TO MOBILE OBJECT

Technology (present technology) according to the present disclosure can be applied to various products. For example, the technology according to the present disclosure may be realized as a device mounted on any kind of mobile object, such as an automobile, an electric vehicle, a hybrid electric vehicle, a motorcycle, a bicycle, a personal mobility, an airplane, a drone, a ship, or a robot.

Figure 26:
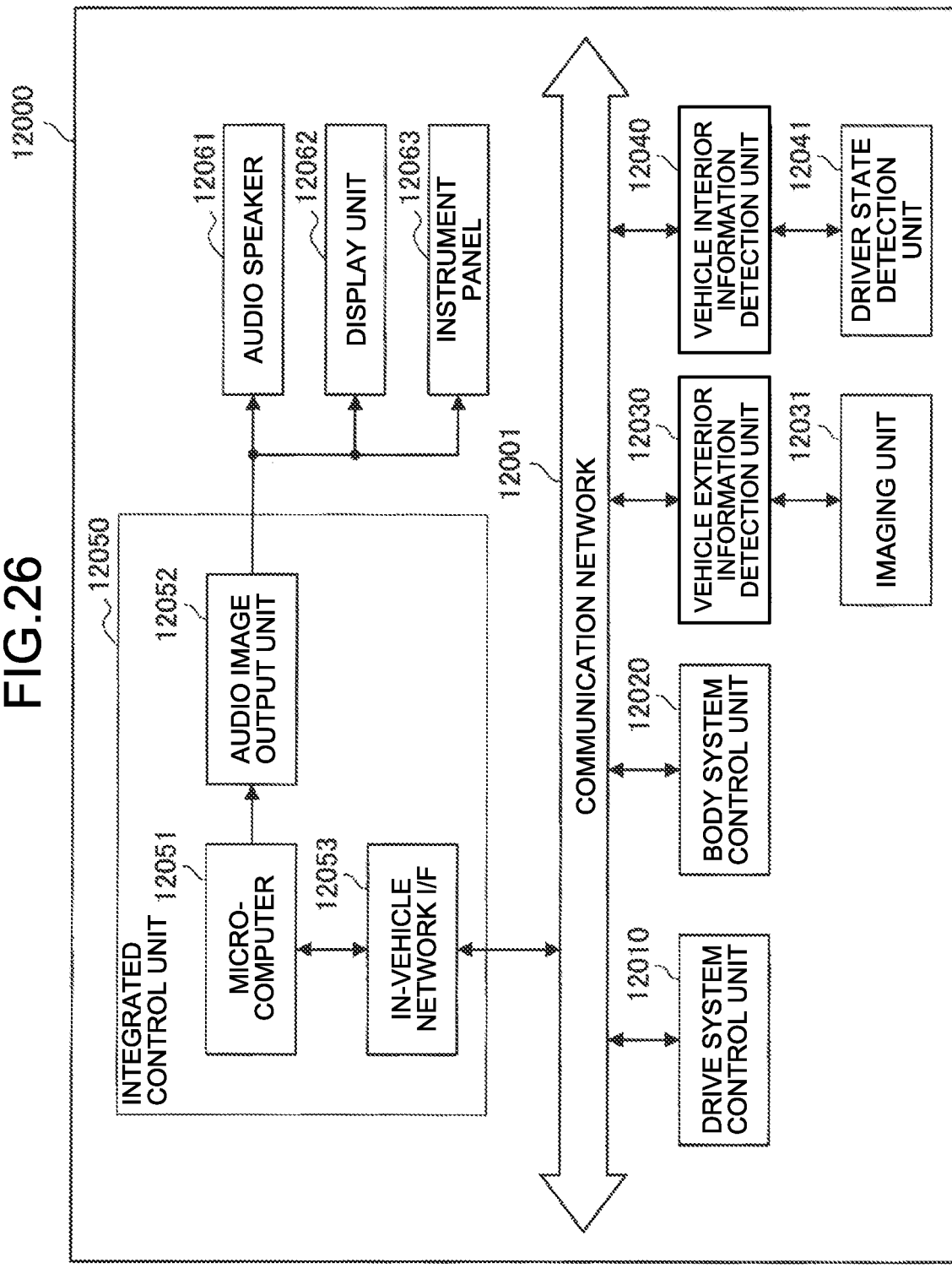
FIG. 26 is a block diagram illustrating an example of a schematic configuration of a vehicle control system.

FIG. 26 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 26, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, an audio image output unit 12052, and an in-vehicle network interface (I/F) 12053 are illustrated.

The drive system control unit 12010 controls the operation of the devices related to the drive system of the vehicle according to various programs. For example, the drive system control unit 12010 functions as a driving force generation device for generating a driving force of a vehicle such as an internal combustion engine or a driving motor, a driving force transmission mechanism for transmitting the driving force to wheels, a steering mechanism for regulating the steering angle of the vehicle, and a control device such as a braking device for generating a braking force of the vehicle.

The body system control unit 12020 controls the operation of various devices mounted on the vehicle body according to various programs. For example, the body system control unit 12020 functions as a keyless entry system, a smart key system, a power window device, or a control device for various lamps such as headlamps, rear lamps, brake lamps, blinkers, or fog lamps. In this case, the body system control unit 12020 can receive radio waves transmitted from a portable device that substitutes for a key, or signals from various switches. The body system control unit 12020 receives input of these radio waves or signals, and controls a door lock device, a power window device, lamps, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the captured image. The vehicle exterior information detection unit 12030 may perform object detection processing of a person, a car, an obstacle, a sign, or characters on a road surface, or distance detection processing, on the basis of the received image.

The imaging unit 12031 is an optical sensor that receives light and outputs an electric signal corresponding to the amount of received light. The imaging unit 12031 can output an electric signal as an image or as distance measurement information. In addition, the light received by the imaging unit 12031 may be visible light or invisible light such as infrared rays.

The vehicle interior information detection unit 12040 detects vehicle interior information. For example, a driver state detection unit 12041 that detects the state of the driver is connected to the vehicle interior information detection unit 12040. The driver state detection unit 12041 includes, for example, a camera that captures the driver, and the vehicle interior information detection unit 12040 may calculate, in accordance with the detected information input from the driver state detection unit 12041, the degree of tiredness or concentration of the driver or determine whether or not the driver is asleep.

A microcomputer 12051 is able to calculate a control target value of the driving force generation device, the steering mechanism, or the braking device, on the basis of the information inside and outside the vehicle acquired by the vehicle exterior information detection unit 12030 or the vehicle interior information detection unit 12040, to output a control command to the drive system control unit 12010. For example, the microcomputer 12051 can perform cooperative control for the purpose of implementing advanced driver assistance system (ADAS) functions including vehicle collision avoidance or impact mitigation, tracking based on inter-vehicle distance, vehicle speed maintenance, vehicle collision warning, or vehicle lane departure warning.

In addition, the microcomputer 12051 can also perform cooperative control for the purpose of automatic driving to travel the vehicle autonomously without relying on the operation of the driver by controlling the driving force generation device, the steering mechanism, or the braking device in accordance with the information around the vehicle acquired by the vehicle exterior information detection unit 12030 or the vehicle interior information detection unit 12040.

Further, the microcomputer 12051 can output a control command to the body system control unit 12020 on the basis of the information outside the vehicle acquired by the vehicle exterior information detection unit 12030. For example, the microcomputer 12051 can control the headlamps according to the position of the preceding vehicle or oncoming vehicle detected by the vehicle exterior information detection unit 12030, and can perform cooperative control for the purpose of anti-glare, such as switching a high beam to a low beam.

The audio image output unit 12052 transmits an output signal of at least one of audio and image to an output device capable of visually or audibly providing information to a vehicle occupant or the outside of the vehicle. In the example of FIG. 26, an audio speaker 12061, a display unit 12062, and an instrument panel 12063 are illustrated as output devices. The display unit 12062 may include at least one of an on-board display and a head-up display, for example.

Figure 27:
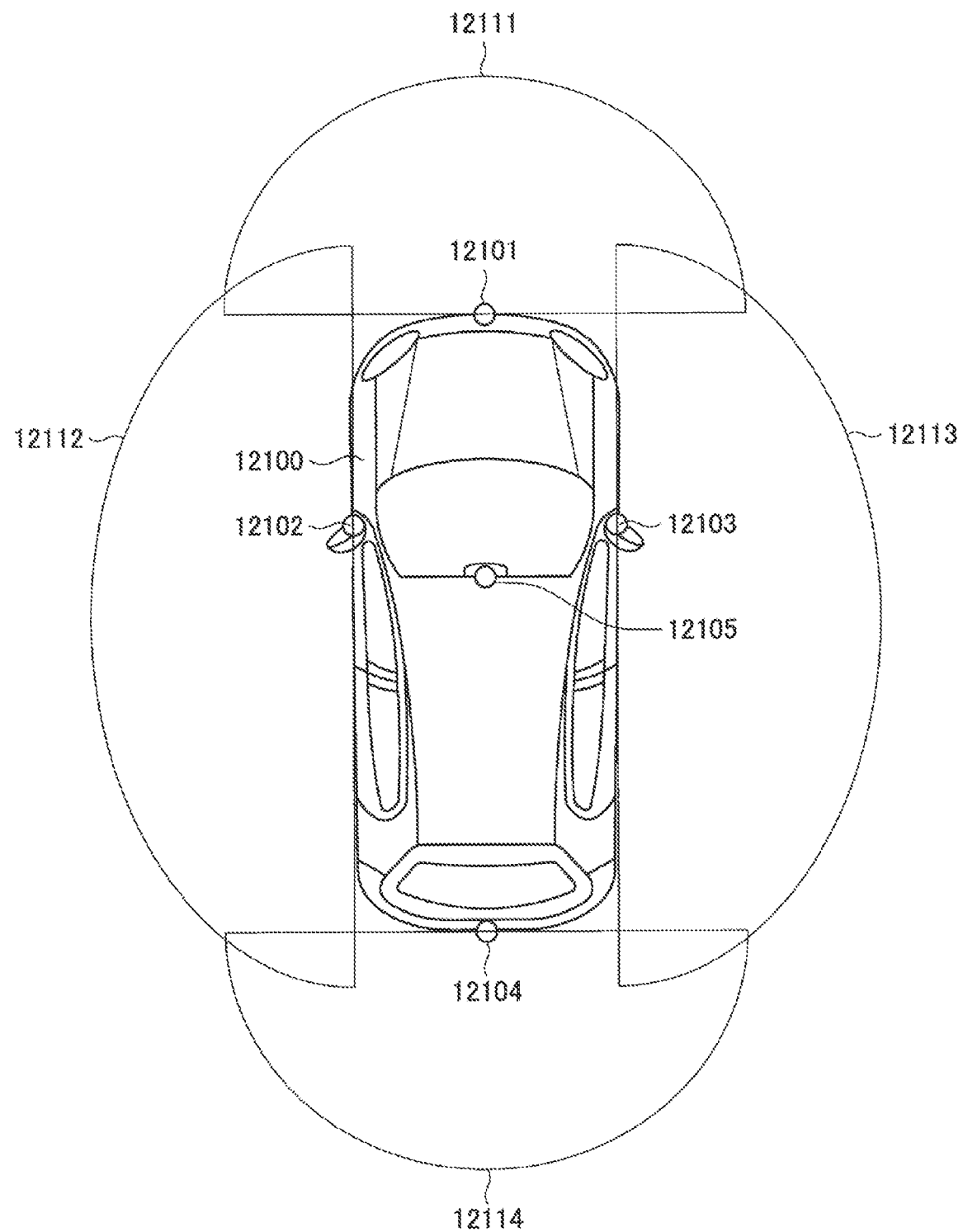
FIG. 27 is an explanatory diagram illustrating an example of installation positions of a vehicle exterior information detection unit and an imaging unit.

FIG. 27 is a diagram illustrating an example of an installation position of the imaging unit 12031.

In FIG. 27, a vehicle 12100 has imaging units 12101, 12102, 12103, 12104, and 12105 as the imaging unit 12031.

The imaging units 12101, 12102, 12103, 12104, and 12105 are provided, for example, at positions including a front nose, a side mirror, a rear bumper, a rear door, and an upper portion of a windshield in the vehicle interior of the vehicle 12100. The imaging unit 12101 provided at the front nose and the imaging unit 12105 provided at the upper portion of the windshield in the vehicle interior mainly acquire an image in front of the vehicle 12100. The imaging units 12102 and 12103 provided at the side mirrors mainly acquire images of the side of the vehicle 12100. The imaging unit 12104 provided at the rear bumper or the rear door mainly acquires an image behind the vehicle 12100. The front images acquired by the imaging units 12101 and 12105 are mainly used for detecting a preceding vehicle, a pedestrian, an obstacle, a traffic signal, a traffic sign, a lane, or the like.

Note that FIG. 27 illustrates an example of the imaging range of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the side mirrors, and an imaging range 12114 indicates the imaging range of the imaging unit 12104 provided at the rear bumper or the rear door. For example, by superimposing the image data captured by the imaging units 12101 to 12104, an overhead image when the vehicle 12100 is viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 uses the distance information obtained from the imaging units 12101 to 12104 to determine the distance to a three-dimensional object in the imaging ranges 12111 to 12114 and the temporal change of the distance (relative speed with respect to the vehicle 12100), so that it is possible to extract, particularly as a preceding vehicle, the closest three-dimensional object on the traveling path of the vehicle 12100 and the three-dimensional object that travels at a predetermined speed (e.g., 0 km/h or more) in substantially the same direction as the vehicle 12100. Further, the microcomputer 12051 can set an inter-vehicle distance to be secured in advance before the preceding vehicle, and can perform automatic brake control (including follow-up stop control), automatic acceleration control (including follow-up start control), and the like. In this way, it is possible to perform the cooperative control for the purpose of automatic driving or the like to travel autonomously without relying on the operation of the driver.

For example, the microcomputer 12051 can classify three-dimensional object data related to the three-dimensional object, on the basis of the distance information obtained from the imaging units 12101 to 12104, extracts other three-dimensional objects such as two-wheeled vehicles, ordinary vehicles, large vehicles, pedestrians, and power poles, and uses the extracted data for automatic avoidance of obstacles. For example, the microcomputer 12051 distinguishes obstacles around the vehicle 12100 between obstacles visible to the driver of the vehicle 12100 and obstacles difficult to recognize visually. In addition, the microcomputer 12051 determines the collision risk indicating the risk of collision with each obstacle and, if the collision risk is a setting value or more and indicates the possibility of collision, the microcomputer 12051 can assist driving to avoid collision by outputting an alarm to the driver via the audio speaker 12061 or the display unit 12062, or executing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is carried out, for example, by determining whether or not a person is a pedestrian by performing pattern matching processing on a sequence of feature points indicating a contour of the object and a procedure for extracting feature points in the captured images of the imaging units 12101 to 12104 as infrared cameras. When the microcomputer 12051 determines that the pedestrian exists in the captured images of the imaging units 12101 to 12104 and recognizes the pedestrian, the audio image output unit 12052 controls the display unit 12062 to display a rectangular contour line for emphasizing the recognized pedestrian in a superimposed manner. Further, the audio image output unit 12052 may control the display unit 12062 so as to display an icon or the like indicating a pedestrian at a desired position.

The example of the vehicle control system to which the technology according to the present disclosure can be applied has been described above. The technology according to the present disclosure is applicable to the imaging unit 12031 and the like among the configurations described above.

8. CONCLUSION

As described above, according to the embodiment of the present disclosure, it is possible to provide the pixel 100 with the pixel transistors (the amplification transistor $TR_{amp}$, the selection transistor $TR_{sel}$, and the reset transistor $TR_{rst}$) and the wires capable of efficiently outputting and transferring a pixel signal by the charges generated by the photoelectric conversion film 112 while suppressing an increase in manufacturing cost.

Note that, in the embodiment of the present disclosure described above, the case of being applied to the backside irradiation type CMOS image sensor structure has been described, but the embodiment of the present disclosure is not limited thereto, and is applicable to other structures.

Note that, in the embodiment of the present disclosure described above, the pixel 100 in which the first conductivity type is the P-type, the second conductivity type is the N-type, and the electrons are used as the signal charges has been described, but the embodiment of the present disclosure is not limited to such an example. For example, the present embodiment is applicable to the pixel 100 in which the first conductivity type is the N-type, the second conductivity type is the P-type, and the holes are used as the signal charges.

Further, in the embodiment of the present disclosure described above, the semiconductor substrate 300 may not be a silicon substrate, and may be another substrate (for example, a silicon on insulator (SOI) substrate or a SiGe substrate). Further, the semiconductor substrate 300 may include a semiconductor structure or the like formed on such various substrates.

Furthermore, in the embodiment of the present disclosure described above and the referenced drawings, various insulating films are illustrated in a simplified manner for easy understanding. However, in reality, these insulating films may be stacked films made of a plurality of different insulating materials or may be stacked films formed by a plurality of different steps.

Furthermore, the solid-state imaging device 1 according to the embodiment of the present disclosure is not limited to the solid-state imaging device that detects the distribution of the incident light amount of visible light and forms an image. For example, the present embodiment is applicable to a solid-state imaging device that forms an image from an incident amount distribution such as infrared rays, X-rays, or particles, or a solid-state imaging device (physical quantity distribution detection device) that detects distribution of other physical quantity such as pressure and capacitance and forms an image, such as a fingerprint detection sensor.

9. SUPPLEMENT

As described above, the favorable embodiments of the present disclosure have been described in detail with reference to the accompanying drawings, but the technical scope of the present disclosure is not limited to such examples. It is obvious that a person with an ordinary skill in a technological field of the present disclosure could conceive of various alterations or corrections within the scope of the technical ideas described in the appended claims, and it should be understood that such alterations or corrections will naturally belong to the technical scope of the present disclosure.

Furthermore, the effects described in the present specification are merely illustrative or exemplary and are not restrictive. That is, the technology according to the present disclosure can exhibit other effects obvious to those skilled in the art from the description of the present specification in addition to or in place of the above-described effects.

Note that the following configurations also belong to the technical scope of the present disclosure.

(1)
A solid-state imaging element comprising:
a semiconductor substrate;
a first photoelectric conversion unit provided on the semiconductor substrate; and
a control unit provided so as to be stacked with the first photoelectric conversion unit and including a plurality of pixel transistors for controlling the first photoelectric conversion unit, wherein
the first photoelectric conversion unit includes
a second electrode,
a first photoelectric conversion film provided above the second electrode and converting light into charges, and
a first electrode provided on the first photoelectric conversion film,
the plurality of pixel transistors include an amplification transistor that amplifies and outputs the charges as a pixel signal, and
a channel formation region of the amplification transistor is made of an oxide semiconductor layer.

(2)
The solid-state imaging element according to (1), wherein
the plurality of pixel transistors further include a transfer transistor that transfers the charges from the first photoelectric conversion unit, and
a channel formation region of the transfer transistor is made of an oxide semiconductor layer.

(3)
The solid-state imaging element according to (1) or (2), wherein
the plurality of pixel transistors further include
a reset transistor that resets the stored charges, and
a selection transistor that outputs the pixel signal according to a selection signal, and
at least one channel formation region in the reset transistor and the selection transistor is made of an oxide semiconductor layer.

(4)
The solid-state imaging element according to any one of (1) to (3), wherein
the channel formation region of the amplification transistor is made of an oxide semiconductor layer that is common to a channel formation region of at least one of the pixel transistors other than the amplification transistor among the plurality of pixel transistors.

(5)
The solid-state imaging element according to any one of (1) to (4), wherein the oxide semiconductor layer is provided so as to be stacked with the control unit.

(6)
The solid-state imaging element according to any one of (1) to (5), wherein the first photoelectric conversion film is made of an organic photoelectric conversion film.

(7)
The solid-state imaging element according to any one of (1) to (6), wherein the semiconductor substrate includes
a second photoelectric conversion unit that converts light into charges.

(8)
The solid-state imaging element according to (7), wherein the control unit is provided between the first photoelectric conversion unit and the semiconductor substrate.

(9)
The solid-state imaging element according to (8), further comprising: a third photoelectric conversion unit that is provided between the control unit and the semiconductor substrate and converts light into charges.

(10)
The solid-state imaging element according to (7), wherein the first photoelectric conversion unit is provided between the control unit and the semiconductor substrate.

(11)
The solid-state imaging element according to (10), further comprising: a third photoelectric conversion unit that is provided between the first photoelectric conversion unit and the semiconductor substrate and converts light into charges.

(12)
The solid-state imaging element according to (9) or (11), wherein the third photoelectric conversion unit includes a third photoelectric conversion film that converts light into charges and is made of an organic photoelectric conversion film.

(13)
The solid-state imaging element according to (1), wherein
the control unit includes
a drive wiring layer having a plurality of drive wires for driving the plurality of pixel transistors,
a power supply signal wiring layer having a plurality of power supply wires for applying a power supply voltage to the plurality of pixel transistors and a plurality of signal wires for transmitting pixel signals, and
a gate electrode layer having a plurality of gate electrodes of the plurality of pixel transistors,
the drive wiring layer, the power supply signal wiring layer, and the gate electrode layer each being provided so as to be stacked with the oxide semiconductor layer.

(14)
The solid-state imaging element according to (13), wherein the drive wire is made of at least one of Cu, Al, W, Ti, TiN, Ta, and TaN.

(15)
The solid-state imaging element according to (13) or (14), wherein at least one of the power supply wire, the signal wire, and the gate electrode is made of a transparent conductive film.

(16)
The solid-state imaging element according to any one of (13) to (15), wherein a wiring width of the signal wire is larger than a wiring width of the drive wire.

(17)
The solid-state imaging element according to any one of (13) to (16), wherein the gate electrode layer further has a shield electrode surrounding the plurality of pixel transistors.

(18)
The solid-state imaging element according to any one of (1) to (17), wherein the first photoelectric conversion unit further includes a storage control film that contacts the first photoelectric conversion film with an insulating film interposed therebetween.

(19)
The solid-state imaging element according to any one of (1) to (7), wherein the first photoelectric conversion unit includes two pixel divisions that are line-symmetrical to each other when viewed from above the semiconductor substrate.

(20)
A method for manufacturing a solid-state imaging element, comprising:
forming an oxide semiconductor layer to be a channel formation region of a pixel transistor, above a semiconductor substrate;
forming a gate electrode layer including a plurality of gate electrodes of a plurality of pixel transistors, above the oxide semiconductor layer;
forming a power supply signal wiring layer including a plurality of power supply wires for applying a power supply voltage to the plurality of pixel transistors and a plurality of signal wires for transmitting pixel signals, above the gate electrode layer;
forming a drive wiring layer including a plurality of drive wires for driving the plurality of pixel transistors, above the power supply signal wiring layer;
forming a second electrode above the drive wiring layer;
forming a first photoelectric conversion film above the second electrode; and
forming a first electrode on the first photoelectric conversion film.

(21)
The method for manufacturing a solid-state imaging element according to (20), further comprising:
forming a first sealing film on the first electrode; and
bonding another semiconductor substrate having a second photoelectric conversion unit and a second sealing film provided on the second photoelectric conversion unit, and the semiconductor substrate so that the first and second sealing films face each other.

REFERENCE SIGNS LIST

1 SOLID-STATE IMAGING DEVICE
10 PIXEL ARRAY UNIT
32 VERTICAL DRIVE CIRCUIT UNIT
34 COLUMN SIGNAL PROCESSING CIRCUIT UNIT
36 HORIZONTAL DRIVE CIRCUIT UNIT
38 OUTPUT CIRCUIT UNIT
40 CONTROL CIRCUIT UNIT
42 PIXEL DRIVE WIRE
44 VERTICAL SIGNAL LINE
46 HORIZONTAL SIGNAL LINE
48 INPUT/OUTPUT TERMINAL
70 PIXEL TRANSISTOR REGION
80 PERIPHERAL CIRCUIT UNIT
100, 100a, 100b PIXEL
102, 102a, 102b ON-CHIP LENS
104, 144, 204 SEALING FILM
108, 134, 208 SHIELD ELECTRODE
110, 210 UPPER ELECTRODE
112, 212 PHOTOELECTRIC CONVERSION FILM
114, 114a, 114b, 214 STORAGE ELECTRODE
116, 216 LOWER ELECTRODE
118, 130, 132, 146, 218, 324, 504 INSULATING FILM
120 MULTI-LAYER WIRING LAYER
124, 206, 250, 306 WIRE
122, 122a, 122b, 122f, 122r, 122s, 124f, 124r, 124s DRIVE WIRE
124vd POWER SUPPLY WIRE
124vs SIGNAL WIRE
126, 126am, 126r, 126s GATE ELECTRODE
128, 502 CONTACT
140, 142, 240 OXIDE SEMICONDUCTOR LAYER
300, 300a, 300b, 500 SEMICONDUCTOR SUBSTRATE
302 THROUGH ELECTRODE
310 ELECTRODE
312a, 312b SEMICONDUCTOR REGION
320 ISOLATION INSULATING FILM
322a SOURCE/DRAIN REGION
322b FLOATING DIFFUSION UNIT
400, 402, 404 WAVEGUIDE
600, 602, 604 INNER LENS
800, 802, 804 BARRIER
700 ELECTRONIC APPARATUS
702 IMAGING DEVICE
710 OPTICAL LENS

712 SHUTTER MECHANISM
714 DRIVE CIRCUIT UNIT
716 SIGNAL PROCESSING CIRCUIT UNIT

What is claimed is:

1. A solid-state imaging element, comprising:
a semiconductor substrate;
a first photoelectric conversion unit provided on the semiconductor substrate; and
a control unit provided so as to be stacked with the first photoelectric conversion unit and including a plurality of pixel transistors for controlling the first photoelectric conversion unit, wherein
the first photoelectric conversion unit includes
a second electrode,
a first photoelectric conversion film provided above the second electrode and converting light into charges, and
a first electrode provided on the first photoelectric conversion film,
the plurality of pixel transistors include an amplification transistor that amplifies and outputs the charges as a pixel signal, and
a channel formation region of the amplification transistor is made of an oxide semiconductor layer,
wherein the semiconductor substrate includes a second photoelectric conversion unit that converts light into charges, and
wherein the control unit is provided between the first photoelectric conversion unit and the semiconductor substrate.

2. The solid-state imaging element according to claim 1, wherein
the plurality of pixel transistors further include
a transfer transistor that transfers the charges from the first photoelectric conversion unit, and
a channel formation region of the transfer transistor is made of an oxide semiconductor layer.

3. The solid-state imaging element according to claim 1, wherein
the plurality of pixel transistors further include
a reset transistor that resets stored charges, and
a selection transistor that outputs the pixel signal according to a selection signal, and
at least one channel formation region in the reset transistor and the selection transistor is made of an oxide semiconductor layer.

4. The solid-state imaging element according to claim 1, wherein
the channel formation region of the amplification transistor is made of an oxide semiconductor layer that is common to a channel formation region of at least one of the pixel transistors other than the amplification transistor among the plurality of pixel transistors.

5. The solid-state imaging element according to claim 1, wherein the oxide semiconductor layer is provided so as to be stacked with the control unit.

6. The solid-state imaging element according to claim 1, wherein the first photoelectric conversion film is made of an organic photoelectric conversion film.

7. The solid-state imaging element according to claim 1, further comprising: a third photoelectric conversion unit that is provided between the control unit and the semiconductor substrate and converts light into charges.

8. The solid-state imaging element according to claim 7, wherein the third photoelectric conversion unit includes a third photoelectric conversion film that converts light into charges and is made of an organic photoelectric conversion film.

9. The solid-state imaging element according to claim 1, wherein the first photoelectric conversion unit further includes a storage control film that contacts the first photoelectric conversion film with an insulating film interposed therebetween.

10. The solid-state imaging element according to claim 1, wherein the first photoelectric conversion unit includes two pixel divisions that are line-symmetrical to each other when viewed from above the semiconductor substrate.

11. A solid-state imaging element, comprising:
a semiconductor substrate;
a first photoelectric conversion unit provided on the semiconductor substrate; and
a control unit provided so as to be stacked with the first photoelectric conversion unit and including a plurality of pixel transistors for controlling the first photoelectric conversion unit, wherein
the first photoelectric conversion unit includes
a second electrode,
a first photoelectric conversion film provided above the second electrode and converting light into charges, and
a first electrode provided on the first photoelectric conversion film,
the plurality of pixel transistors include an amplification transistor that amplifies and outputs the charges as a pixel signal, and
a channel formation region of the amplification transistor is made of an oxide semiconductor layer,
wherein the control unit includes:
a drive wiring layer having a plurality of drive wires for driving the plurality of pixel transistors;
a power supply signal wiring layer having a plurality of power supply wires for applying a power supply voltage to the plurality of pixel transistors and a plurality of signal wires for transmitting pixel signals; and
a gate electrode layer having a plurality of gate electrodes of the plurality of pixel transistors,
wherein the drive wiring layer, the power supply signal wiring layer, and the gate electrode layer are stacked with the oxide semiconductor layer.

12. The solid-state imaging element according to claim 11 wherein the first photoelectric conversion unit is provided between the control unit and the semiconductor substrate.

13. The solid-state imaging element according to claim 12, further comprising: a third photoelectric conversion unit that is provided between the first photoelectric conversion unit and the semiconductor substrate and converts light into charges.

14. The solid-state imaging element according to claim 11, wherein the drive wire is made of at least one of Cu, Al, W, Ti, TiN, Ta, and TaN.

15. The solid-state imaging element according to claim 11, wherein at least one of the power supply wire, the signal wire, and the gate electrode is made of a transparent conductive film.

16. The solid-state imaging element according to claim 11, wherein a wiring width of the signal wire is larger than a wiring width of the drive wire.

17. The solid-state imaging element according to claim 11, wherein the gate electrode layer further has a shield electrode surrounding the plurality of pixel transistors.

* * * * *